(12) United States Patent
Ogura

(10) Patent No.: US 7,200,712 B2
(45) Date of Patent: Apr. 3, 2007

(54) ASSOCIATIVE MEMORY SYSTEM, NETWORK DEVICE, AND NETWORK SYSTEM

(75) Inventor: Naoyuki Ogura, Yokohama (JP)

(73) Assignee: Terminus Technology, Limited (JP)

( * ) Notice: Subject to any disclaimer, the term of this patent is extended or adjusted under 35 U.S.C. 154(b) by 290 days.

(21) Appl. No.: 10/481,712

(22) PCT Filed: Jul. 24, 2001

(86) PCT No.: PCT/JP01/06382

§ 371 (c)(1),
(2), (4) Date: Jan. 26, 2004

(87) PCT Pub. No.: WO03/010774

PCT Pub. Date: Feb. 6, 2003

(65) Prior Publication Data

US 2004/0250013 A1    Dec. 9, 2004

(51) Int. Cl.
*G06F 12/00* (2006.01)
(52) U.S. Cl. ..................... 711/108; 711/128
(58) Field of Classification Search ............. None
See application file for complete search history.

(56) References Cited

U.S. PATENT DOCUMENTS

| | | | |
|---|---|---|---|
| 5,920,886 A * | 7/1999 | Feldmeier ............... | 711/108 |
| 6,289,414 B1 * | 9/2001 | Feldmeier et al. ....... | 711/108 |
| 6,539,455 B1 * | 3/2003 | Khanna et al. .......... | 711/108 |
| 6,574,702 B2 * | 6/2003 | Khanna et al. .......... | 711/108 |
| 6,606,681 B1 * | 8/2003 | Uzun ...................... | 711/108 |
| 6,633,953 B2 * | 10/2003 | Stark ...................... | 711/108 |
| 6,691,218 B2 * | 2/2004 | Brown .................... | 711/216 |
| 6,836,771 B2 * | 12/2004 | Brown .................... | 707/3 |

* cited by examiner

*Primary Examiner*—T Nguyen
(74) *Attorney, Agent, or Firm*—Cook, Alex, McFarron, Manzo, Cummings & Mehler, Ltd.

(57) ABSTRACT

This invention needs no priority encoder to connect the plural number of associative memories. The primary searching associative memory 4 of the associative memory 204 produces the intermediate data 6 obtained after the logical sum operation for the coincident storage data in the confirmed valid state, taking the research data 2 and the mask information into account, into the intermediate data determination section 41 and the internal secondary searching associative memory 5. The intermediate data arithmetic section 42 produces the valid state to the valid search signal 45 corresponding to the storage data with the least number of bits in invalid state among the intermediate data 6 supplied from the first through p-th associative memory 204. The first through p-th secondary searching associative memory 5 carries out the search operation for the storage data with the corresponding intermediate data 6 as the search data, supplying the match line 3. When the corresponding valid search signal 45 is put in the invalid state, the first through p-th logical sum operation means 46 puts the all values of corresponding match line 3 in the invalid state, produces data into the address signal producing section 11, and encodes data to the address output signal 12.

53 Claims, 24 Drawing Sheets

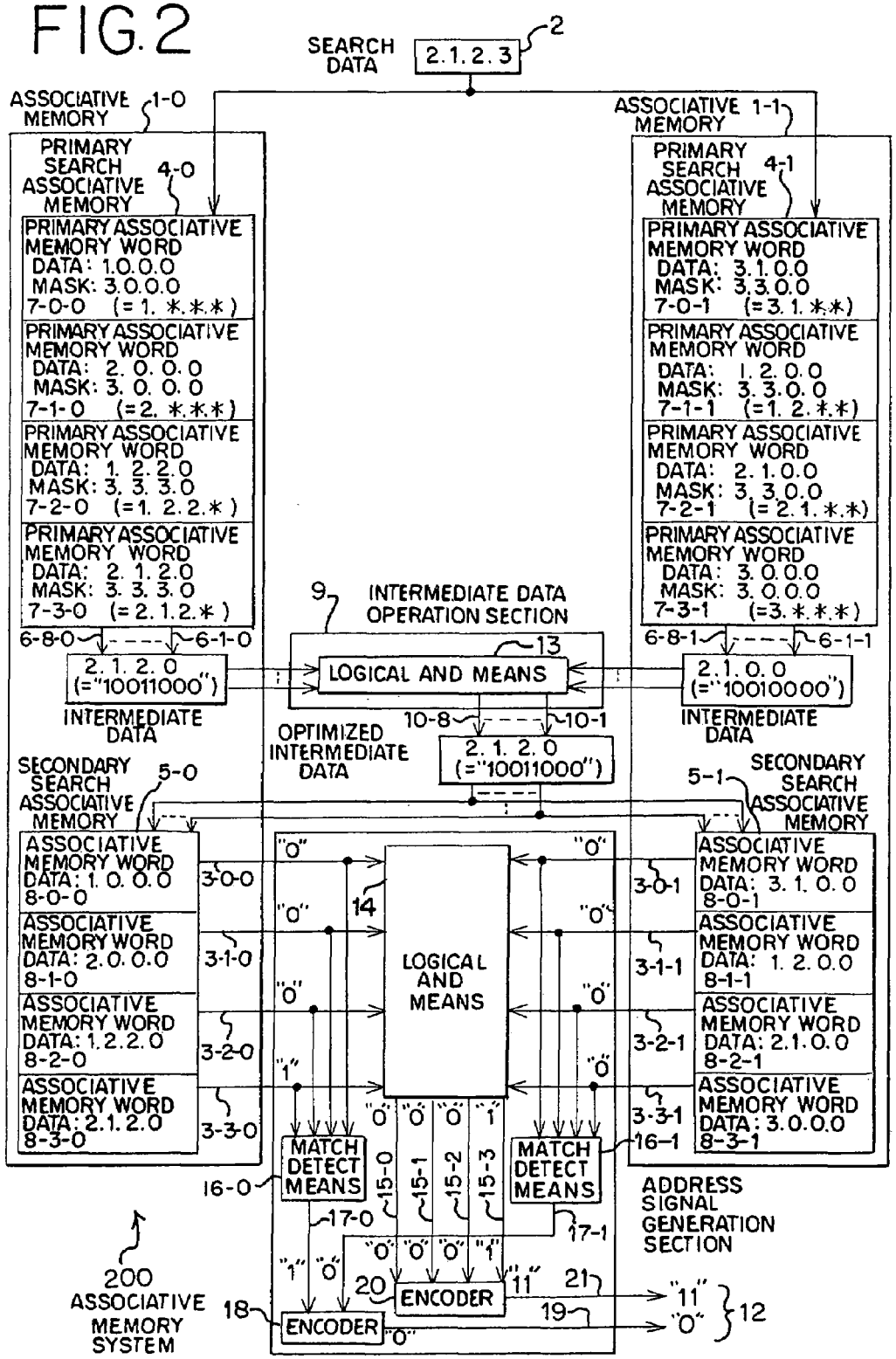

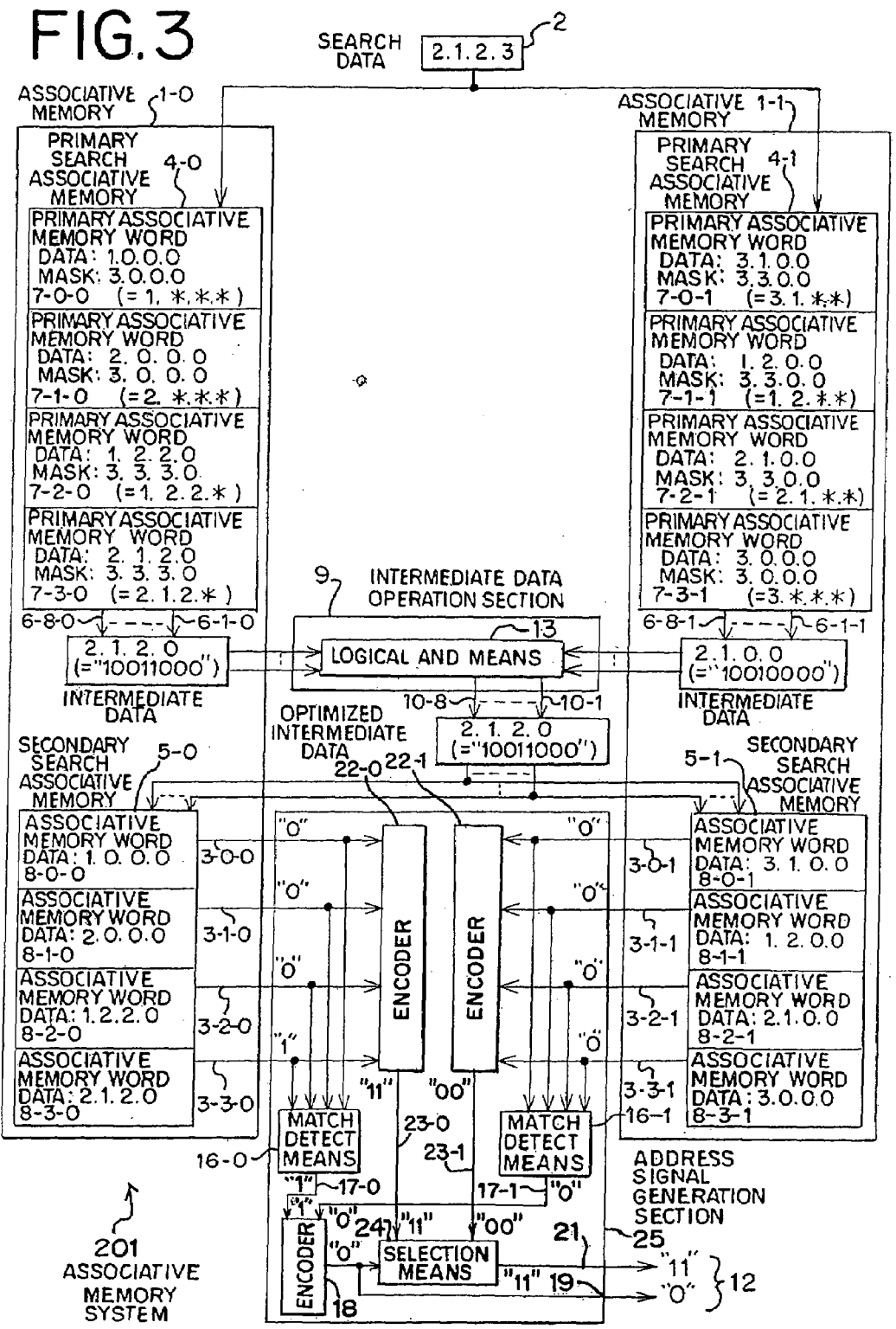

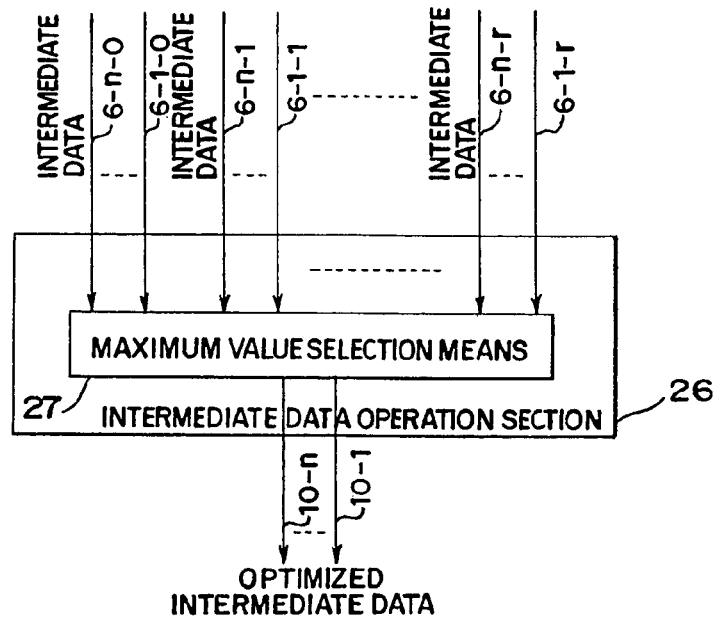
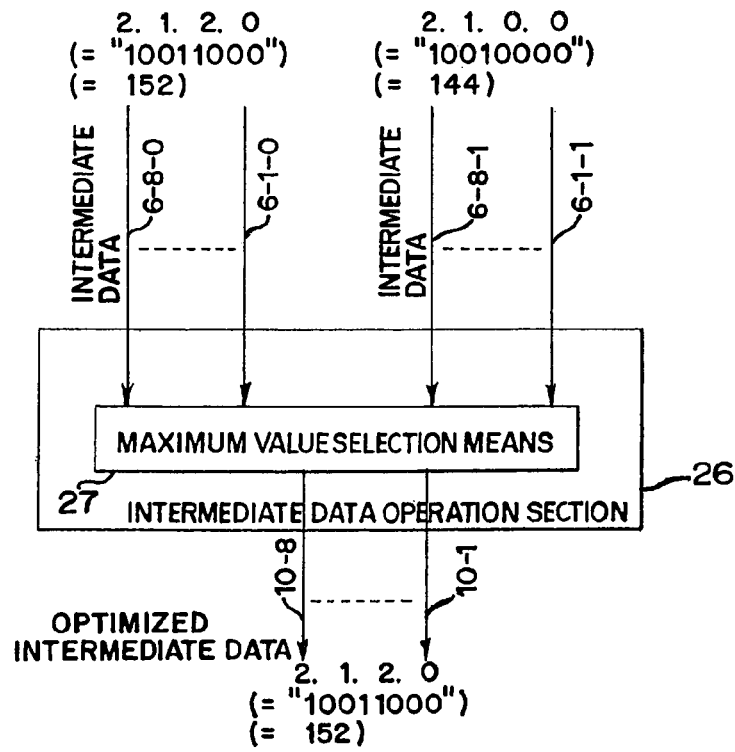

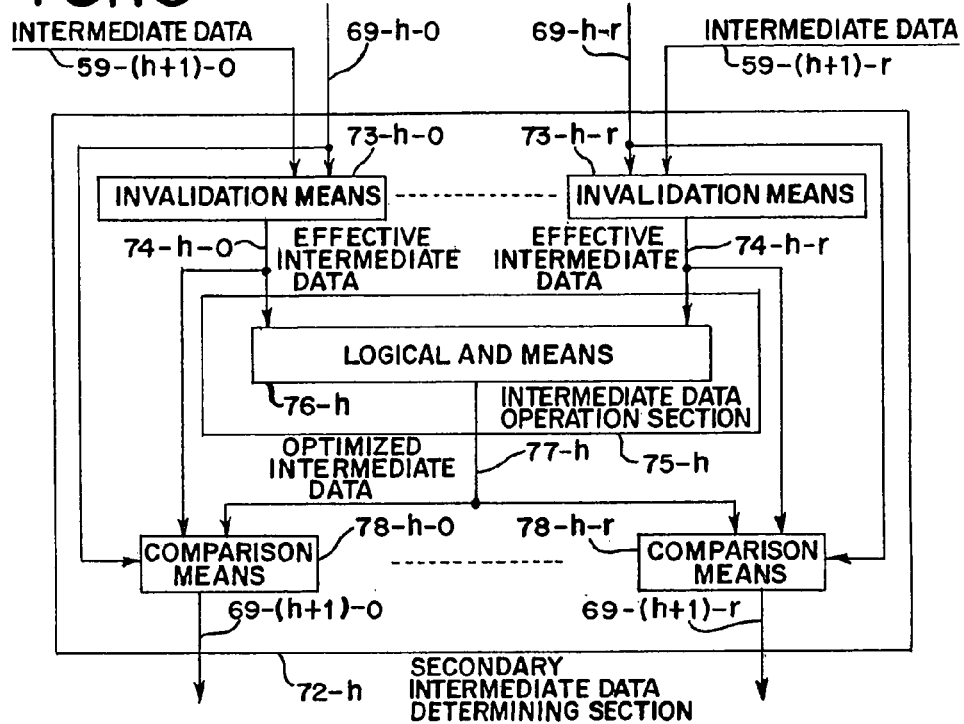
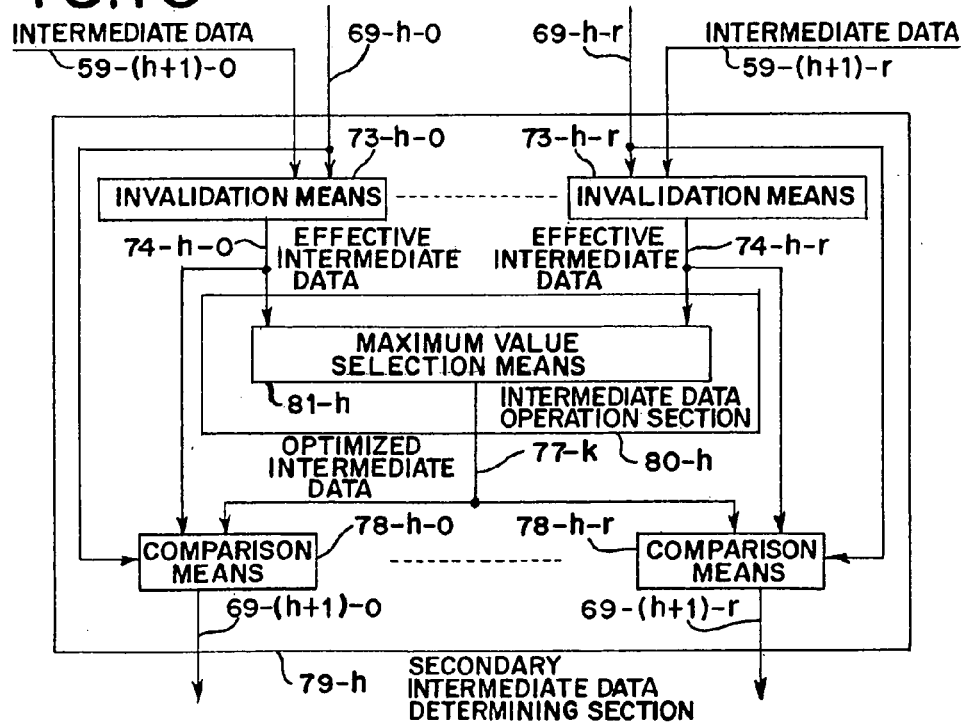

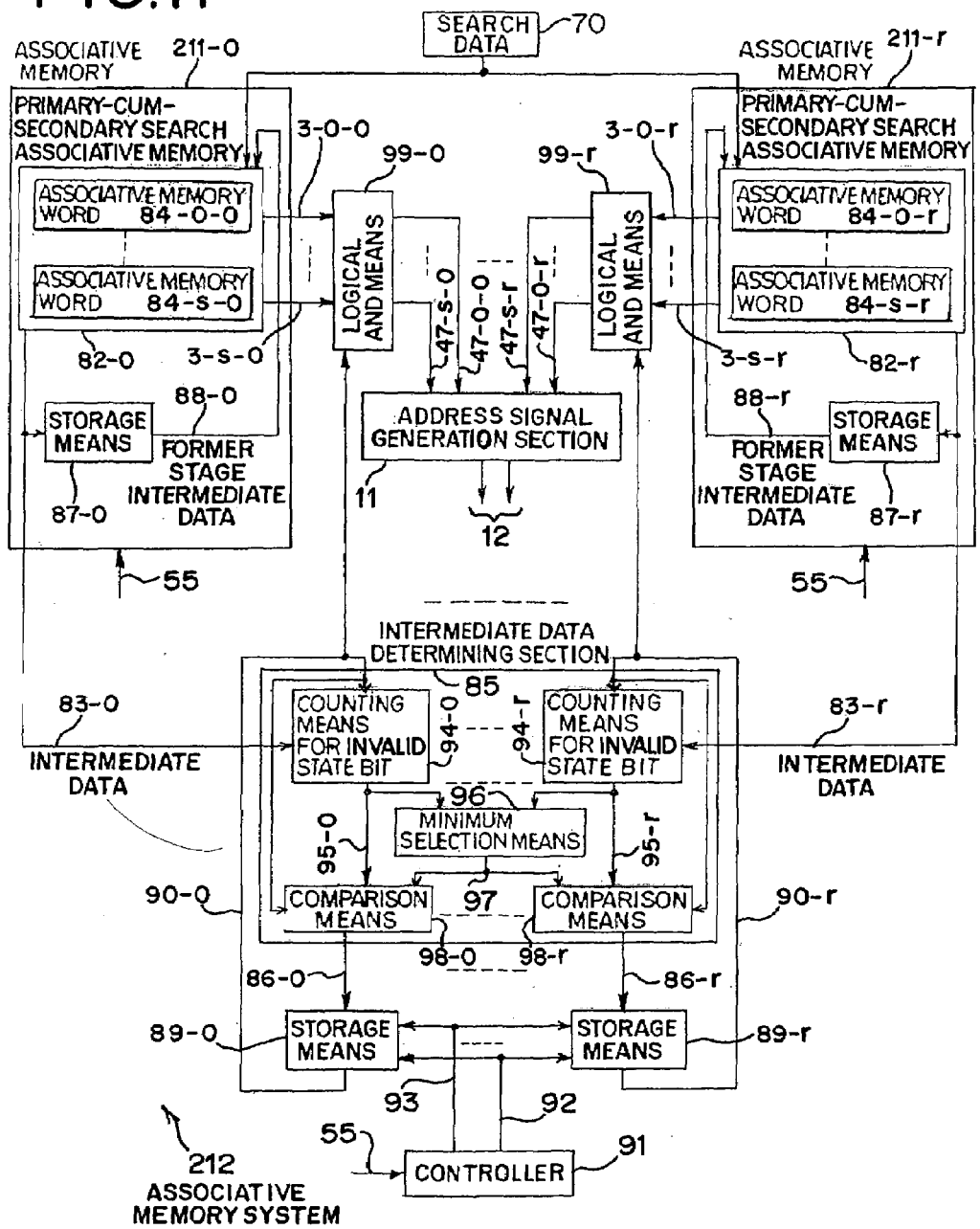

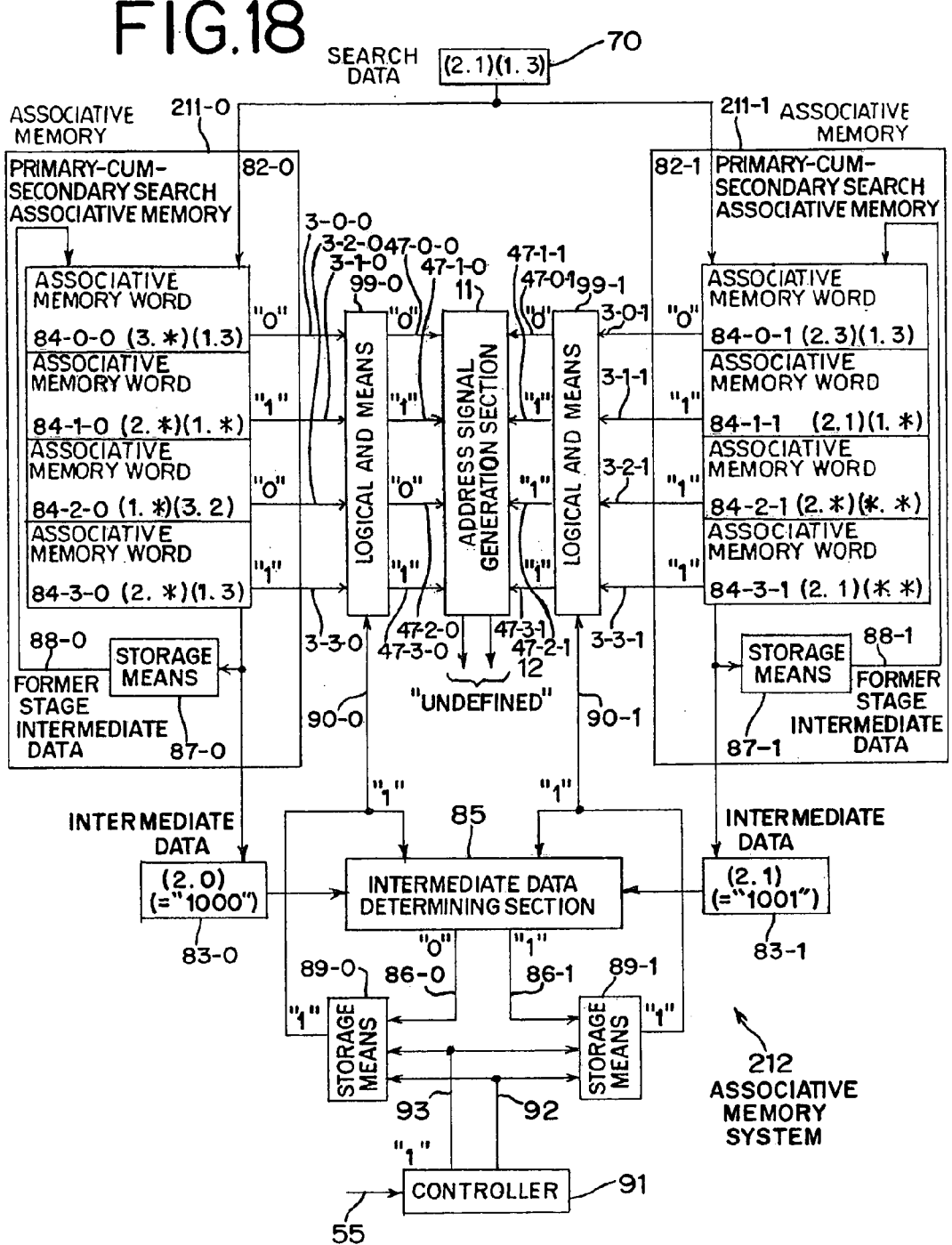

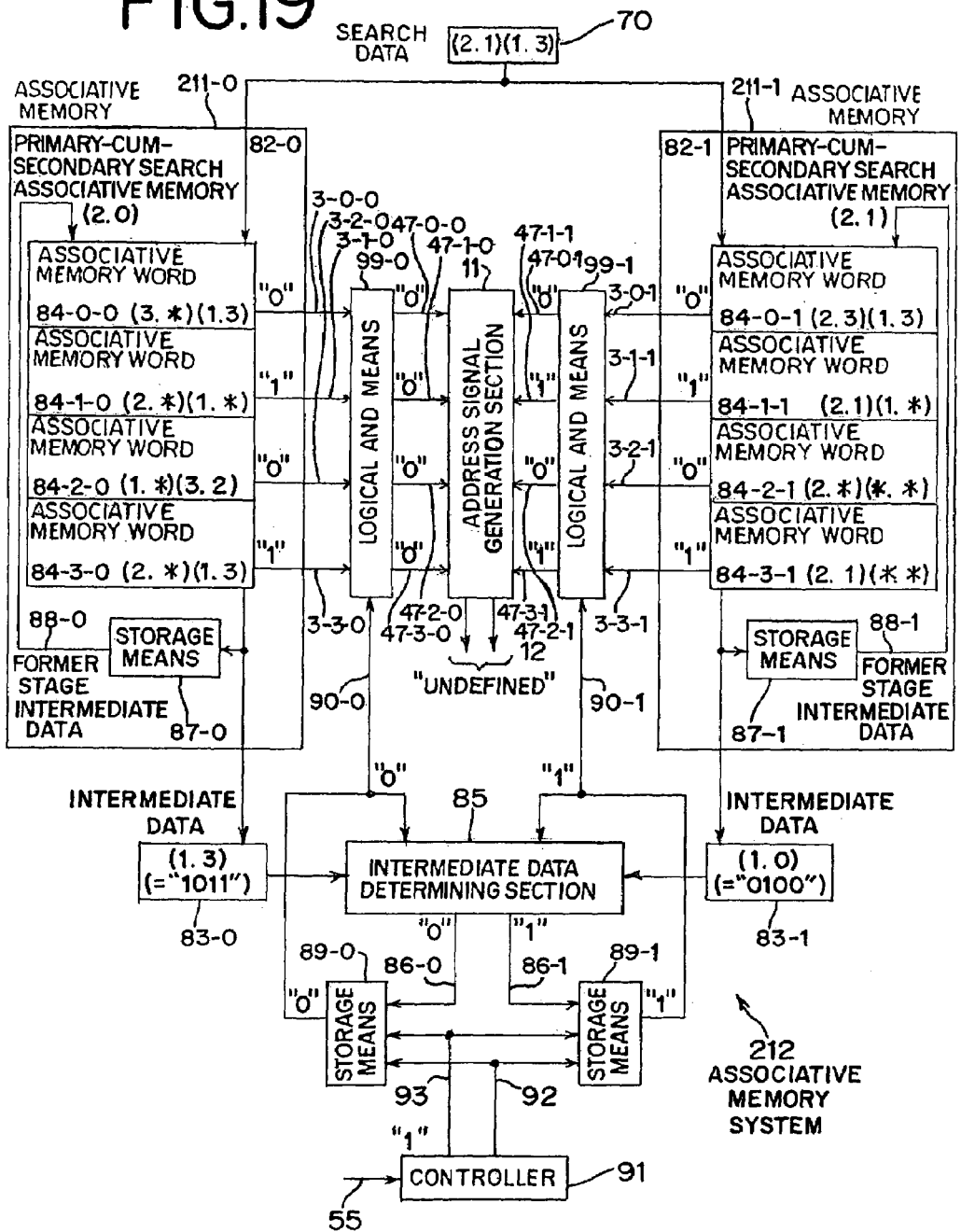

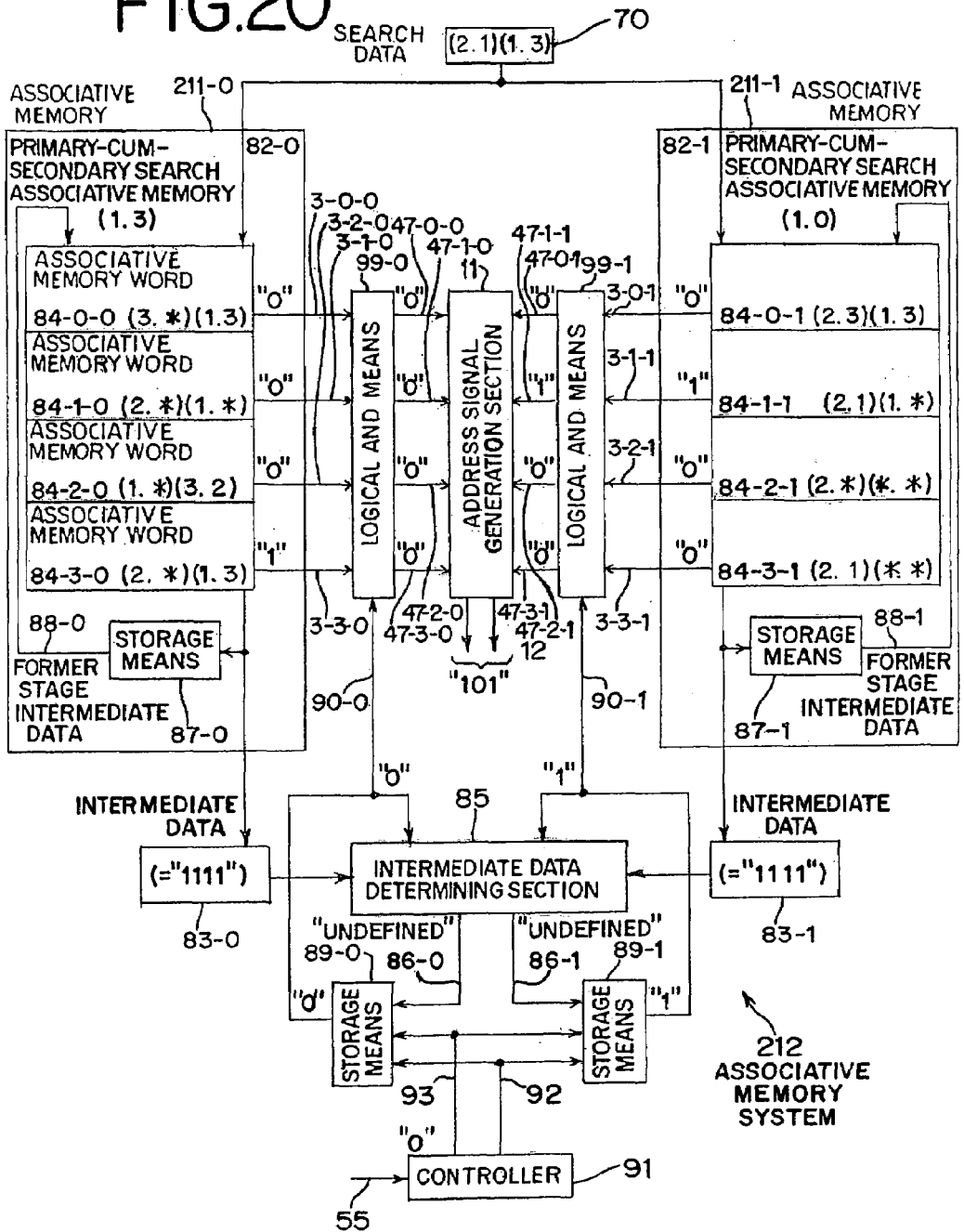

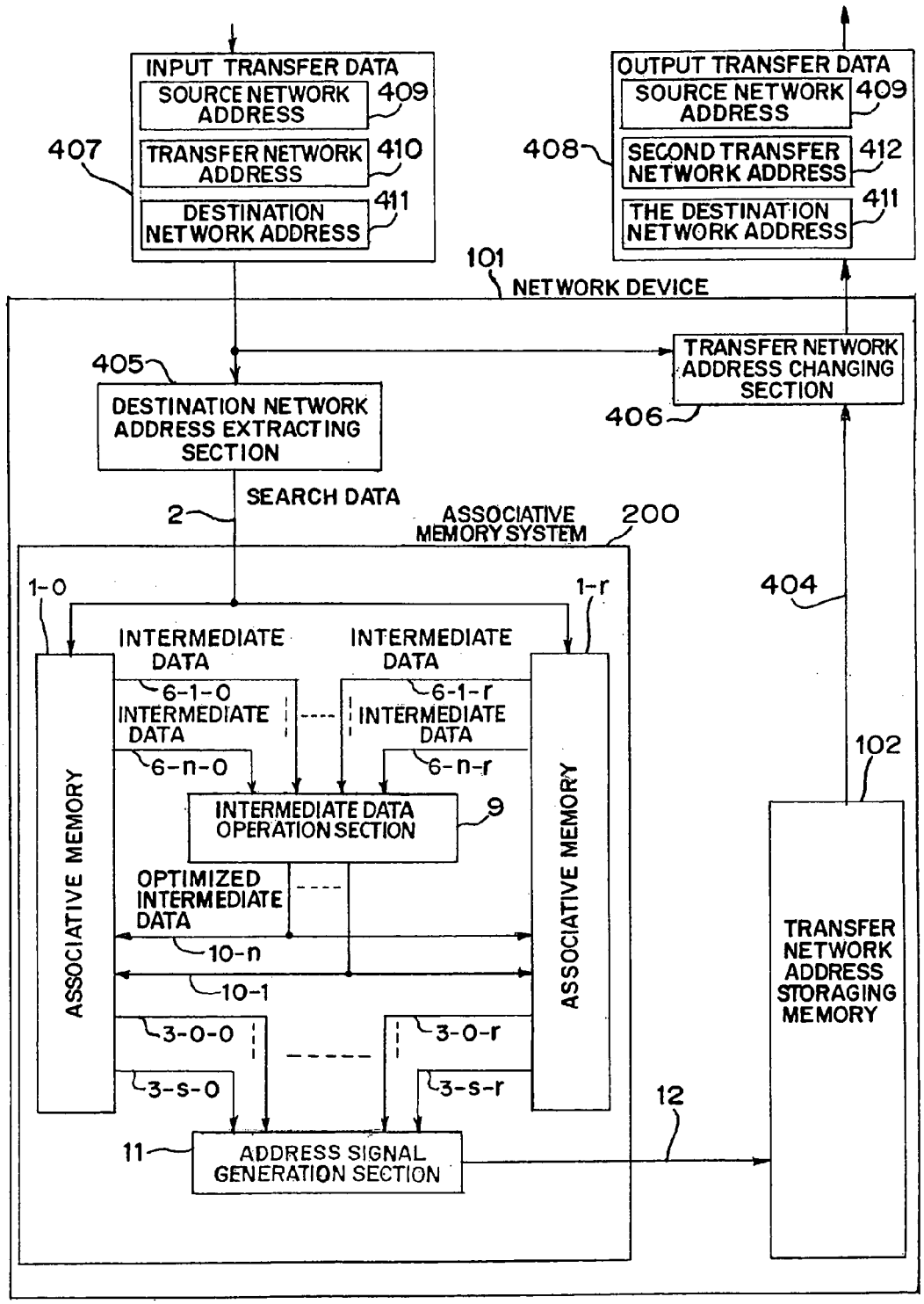

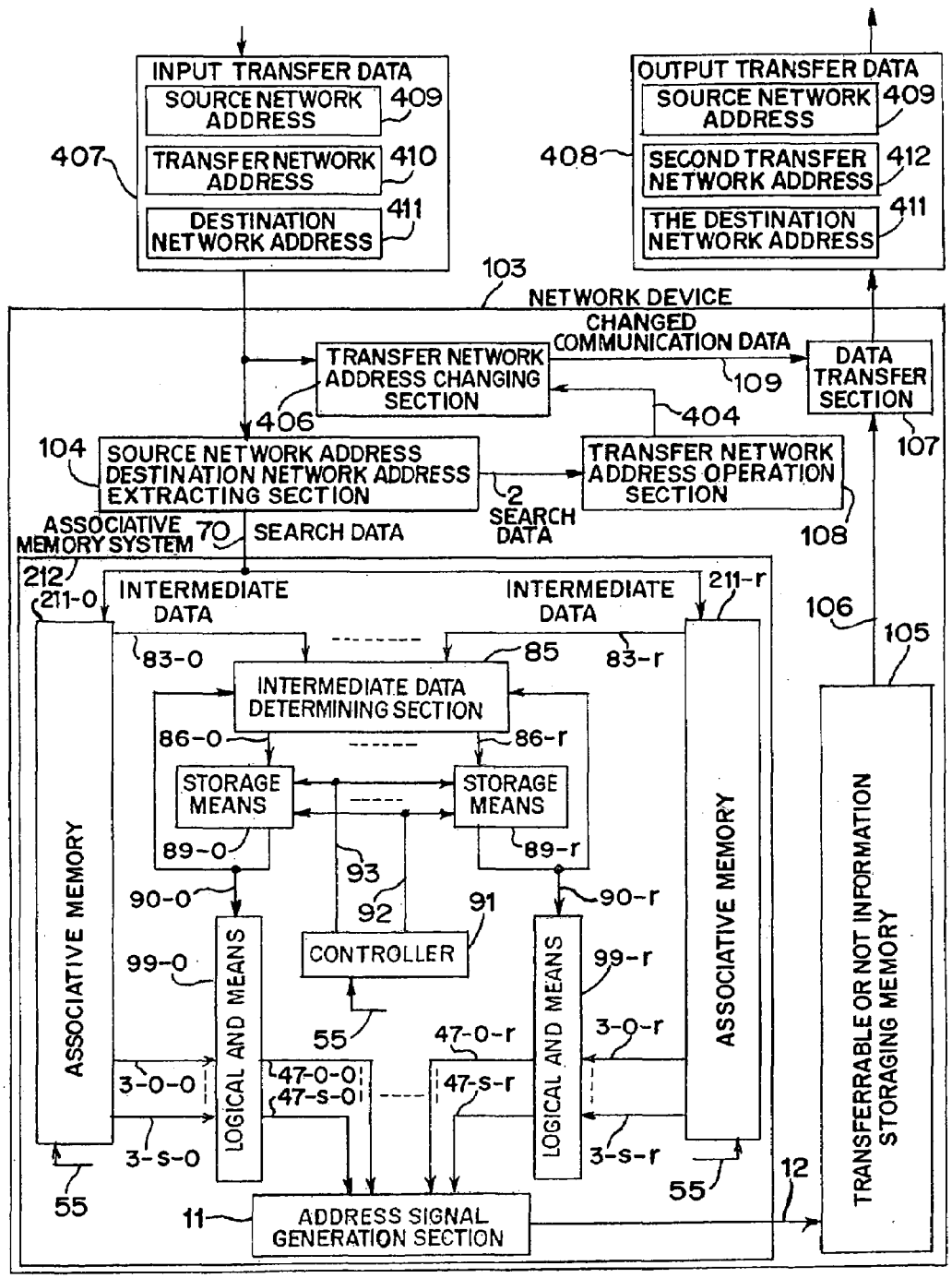

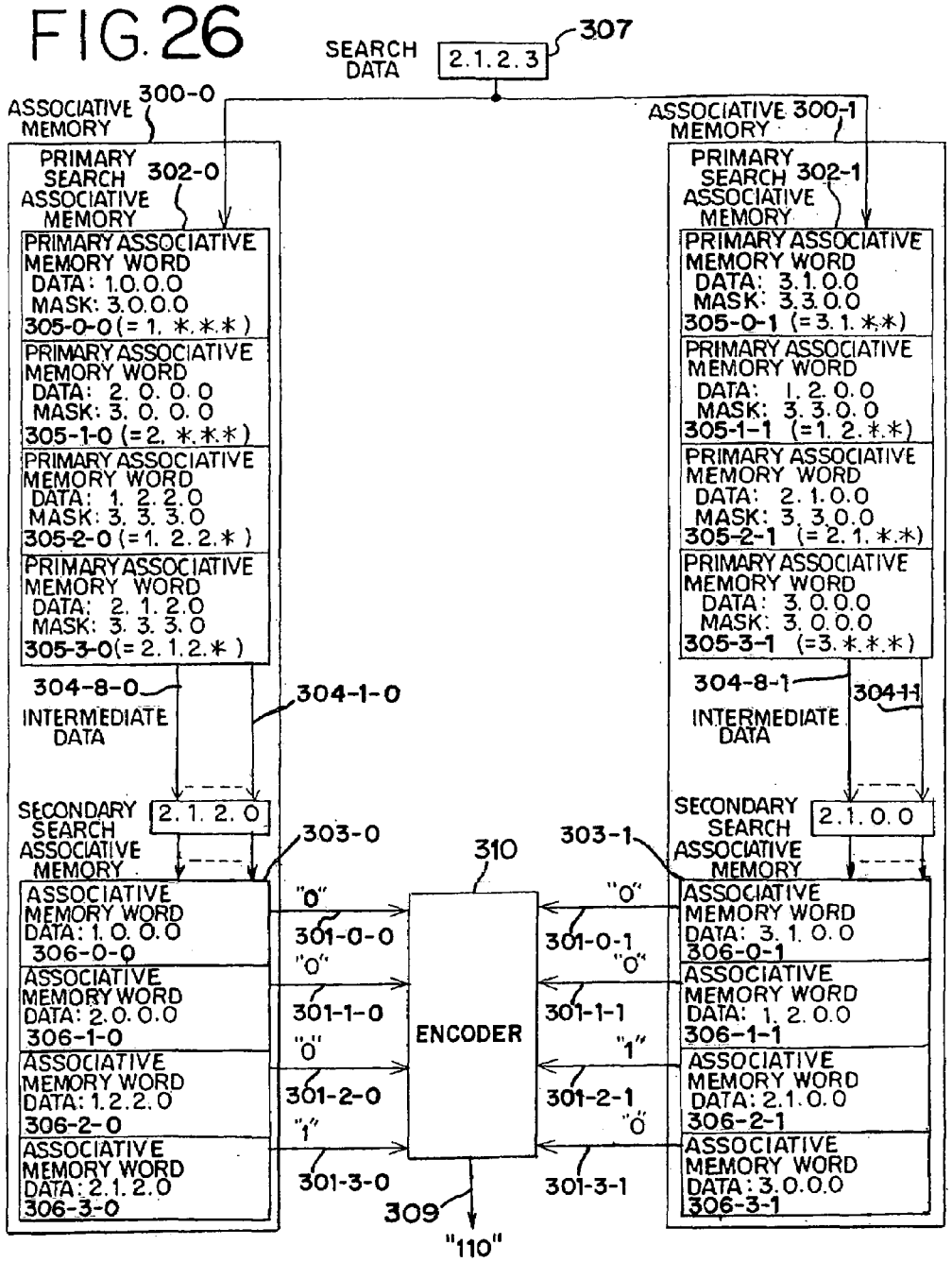

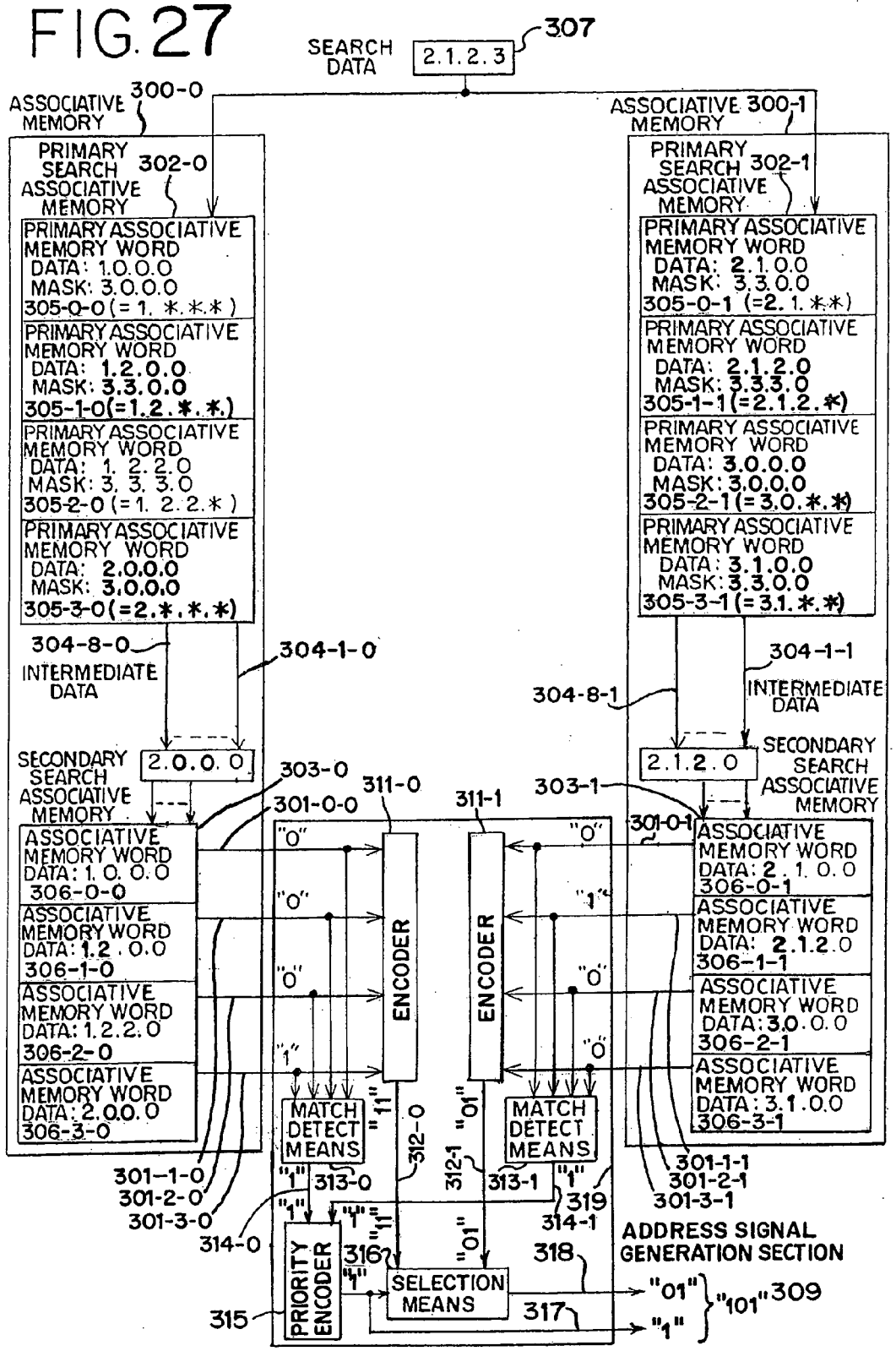

ASSOCIATIVE MEMORY SYSTEM, NETWORK DEVICE, AND NETWORK SYSTEM

TECHNICAL FIELD

This invention relates generally to a method for controlling the associative memory system, network device and network system and, more particularly, to an associative memory having a search mask function, associative memory system connecting the plural memories, and the network device and system applying the memory system.

BACKGROUND ART

In the general network system, a user or subscriber of the network has a user's terminal, such as a personal computer, for connection to the network. A user's terminal is assigned hierarchically with a specific network address every internal user group in order to be distinguished from other user's terminals. Herein, a higher hierarchical user group has a shorter effective part of network address, on the other hand, a lower hierarchical user group has a longer one. Herewith, when communication data is transferred into a network device, such as network router, to control the transfer of communication data between a plurality of user's terminals in the network, the function that considers and compares the lengths of effective part of network addresses is indispensable to the processes for determination of transfer network address and transfer permission from the destination and source network addresses. The associative memory is used to carry out this function.

As an example of construction, the connection diagram of conventional computer network is shown in FIG. 24. A user's terminal for connection to the network, as described above, is assigned hierarchically with a network address every internal user group in accordance with a predetermined rule. Herein, the network address is represented by a numeral of a plurality of digits of, for example, first through fourth digits (a, b, c, d). The predetermined rule defines a hierarchical structure of the network address. For example, the first digit of the numeral represents a nation, such as England, Germany and Japan. The second digit of the numeral represents a city in the nation, the third digit of the numeral represents a company name in the city, and the final digit of the numeral distinguishes a user's terminal for connection to the network from other user's terminals in the company. In the following description, these hierarchical items will be called segments. Referring to FIG. 24, each segment is depicted by a rectangular block. Specifically, the SEGMENT1 that the first digit of network address is specified as "1", the SEGMENT2 that the first digit of that is "2", and the SEGMENT3 that the first digit of that is "3" exist as the highest segments.

The SEGMENT4 subordinate to the SEGMENT1 has a network address (1, 2, *, *) in which "1" and "2" are specified as the first and second digits, respectively. The SEGMENT6 subordinate to the SEGMENT4 has a network address (1, 2, 2, *) in which "1", "2" and "2" are specified as the first through third digits, respectively. Thus, a user's terminal PC401-1 having a network address (1, 2, 2, 1) is connected in the SEGMENT6. As well as, the SEGMENT5 subordinate to the SEGMENT2 has a network address (2, 1, *, *) in which "2" and "1" are specified as the first and second digits, respectively. The SEGMENT7 subordinate to the SEGMENT5 has a network address (2, 1, 2, *) in which "2", "1" and "2" are specified as the first through third digits, respectively. A user's terminal PC401-2 having a network address (2, 1, 2, 3) is connected in the SEGMENT7. Thus, the SEGMENT8 subordinate to the SEGMENT3 has a network address (3, 1, *, *) in which "3" and "1" are specified as the first and second digits, respectively. A symbol "*" contained in these addresses represents "don't care".

In order to control the transfer of communication data between a plurality of user's terminals in the network, each segment is provided with a network device. As illustrated in FIG. 24, the SEGMENT1 is provided with the network device 400-1, the SEGMENT2 is provided with the network device 400-2, the SEGMENT3 is provided with the network device 400-3, the SEGMENT4 is provided with the network device 400-4, the SEGMENT5 is provided with the network device 400-5, the SEGMENT6 is provided with the network device 400-6, the SEGMENT7 is provided with the network device 400-7, and the SEGMENT8 is provided with the network device 400-8, respectively. Each network device in the corresponding segment has a function to calculate an optimum transfer route and transfer data to a receiver via the optimum transfer route thus calculated on the basis of the relationship of connection of network devices and the transfer address annexed to the communication data that is supplied from any use's terminals or any other network apparatuses connected to the network device. As illustrated in FIG. 24, each network device is connected to any user's terminals or any network devices subordinate to the corresponding segment In addition, the network device 400-3 is connected to the network device 400-1, the network device 400-6, the network device 400-2, and the network device 400-7.

Each digit of each network address is represented by a quaternary number of two bits. Thus, each network address is represented by a bit sequence of eight bits in total.

For example, a network address (1, 2, *, *) in quaternary is represented by a bit sequence (01, 10, 00, 00). Hereinafter, a bit sequence represented as above-mentioned representation is called a storage data. Since the symbol "*" represents "don't care" for each of third and fourth digits, it is necessary to indicate that the first through fourth bits (01, 10) in the bit sequence (01, 10, 00, 00) alone are valid and the remaining bits (00, 00) are invalid. For this purpose, mask information (or mask data) is combined with the storage data. Hereinafter, the combined data is called structured data.

In the illustrated example, the mask information (or mask data) is given by a bit sequence (11, 11, 00, 00). Herein, "1" and "0" represent a mask invalid state and a mask valid state, respectively. The invalid state "0" of storage data is stored in the bits of storage data corresponding to the mask information (or mask data) that the mask is valid.

The network device has some functions to control communication data stored in the segments. There are the function to calculate the determination of transfer permission on the basis of the source network address and destination network address annexed to the communication data, which is supplied from any use's terminals, and the predetermined transfer rule and the function to calculate an optimum transfer route and create the transfer network address on the basis of the above-mentioned source network address and the relationship of connection of network devices.

Referring to FIG. 24, for example, when the network device 400-3 transfers communication data to a user's terminal PC401-2 having a destination network address (2, 1, 2, 3) expressed as digits in the quaternary system, as it may be clearly realized from the figure, the optimum transfer route is not to the network device 400-2 having a network address (2, *, *, *) displayed in the quaternary system, but to the network device 400-7 having a network address (2, 1, 2, *) displayed in the quaternary system. Therefore, it is optimum to select a network device having the mask information (data) that the number of valid mask bits is minimum in the network address among the network devices having same digit of the network address as compared with the destination network address in consideration of the mask information (data).

Thus, the limited communication channels are effectively used for extra safety to carry out communication by controlling the transfer of communication data between the network devices without connecting the user's terminals directly by the use of the communication channels.

Next referring to FIG. 25, the typical conventional network device will be described.

This figure is a block diagram of a conventional network device. In FIG. 25, the system and operation of conventional network device 400 is explained with an example of being applied to the network device 400-3 described in FIG. 24.

The input communication data 407 is entered into the network device 400, and the output communication data 408 is transferred from the network device 400. The input communication data 407 includes the source network address 409, the transfer network address 410 and the destination network address 411. And also, the output communication data 408 includes the source network address 409, the second transfer network address 412 and the destination network address 411. Since FIG. 25 describes the case that the conventional network device 400 is applied to the network device 400-3 illustrated in FIG. 24, the transfer network address 410 included in the input communication data 407 is set naturally as a network address in the network device 400-3.

The network device 400 consists of the destination network address extracting section 405, the associative memory 300, the encoder 308, the transfer network address storage memory 402, and the transfer network address changing section 406. The destination network address extracting section 405 extracts the destination network address 411 from the input communication data 407, and enters this address as the search data 307 into the associative memory 300.

Outside the segment to which the network device 400 belongs in the network, the network address for the segment to which other network device connecting with the network device 400 belongs is stored into the associative memory words 305-0, 305-1, 305-2 and 305-3 of the associative memory 300, respectively. Since FIG. 25 describes the case that the conventional network device 400 is applied to the network device 400-3 illustrated in FIG. 24, the first associative memory word 305-0 stores the network address (1, *, *, *) displayed in the quaternary system for the segment 1 to which the network device 400-1 belongs by use of the structured data system that the storage data (01, 00, 00, 00) is combined with the mask information (11, 00, 00, 00) as mentioned above. In the same way, the second associative memory word 305-1 stores the network address (2, *, *, *) displayed in quaternary for the segment 2 to which the network device 400-2 belongs, the third associative memory word 305-2 stores the network address (1, 2, 2, *) displayed in quaternary for the segment 6 to which the network device 400-6 belongs, and the fourth associative memory word 305-3 stores the network address (2, 1, 2, *) displayed in quaternary for the segment 7 to which the network device 400-7 belongs. As well as the ordinary memory, the associative memory 300 has the normal function to specify a network address and enter/load the storage data and also the specific mask searching function to put the only mask match line 301 corresponding to the storage data with the least number of bits in a mask valid state, in the mask match lines 301-0 to 301-3 corresponding to one of the storage data coincident with the search data 307 taking the mask information into account, into a valid state. According to the definition of structured data system, this function is equivalent to other function to put the only mask match line 301 corresponding to the storage data with the least number of bits in a storage data invalid state, in the mask match lines 301-0 to 301-3 corresponding to one of the storage data coincident with the search data 307 taking the mask information into account, into a valid state. As the typical conventional associative memory 300, for example, the Japanese Patent Application No. 2000-181406, No. 2000-243485 and the International Patent Application No. PCT/JP01/03562 are disclosed.

The encoder 308 encodes the match lines 301-0 through 301-3 that the associative memory 300 supplies into an address output signal 309. The transfer network address storage memory 402 stores the network address of network device corresponding to the segment network addresses each of which is stored in the associative memory words 305-0 through 305-3 of the associative memory 300 by use of the structured data system and each of which is stored in the associative memory words 403-0 through 403-3 of the associative memory 300. For example, the network address (1, *, *, *) expressed in the quaternary system is stored in the first associative memory word 305-0 of the associative memory 300 while the network address of network device 400-1 (FIG. 24) corresponding thereto is stored in the first memory word 403-0 of the transfer network address storage memory 402. Similarly, the network address of network device 400-2, the network address of network device 400-6, and the network address of network device 400-7 are stored in the second memory word 403-1, the third memory word 403-2, and the fourth memory word 403-3 of the transfer network address storage memory 402, respectively. Supplied with the address output signal 309 as a read address, the transfer network address storage memory 402 produces a memory data signal 404 stored in the word designed by the memory address signal 309.

The transfer network address changing section 406 changes the transfer network address 410 of the input communication data 407 to the second transfer network address 412 according to the memory data signal 404 and transfers the output communication data 408 to a network device corresponding to the second transfer network address 412.

It is assumed here that the input communication data 407 has the destination network address 411 (1, 2, 2, 1) in the quaternary system. On the completion of search by the associative memory 300, only the match line 301-2 corresponding to the network address (1, 2, 2, *) in quaternary stored in the third associative memory word 305-2 is put into a valid state. Therefore, the encoder 308 produces "2" in a decimal system as the address output signal 309. In response to the address output signal 309, the transfer network address storage memory 402 produces as the memory data signal 404 the network address for the network device 400-6. The transfer network address changing section 406 sets the network address for the network device 400-6 as the second transfer network address 412 of the output communication data 408, and transfers the output communication data 408 to the network device 400-6.

[Description of Typical Conventional Associative Memory]

Herein, referring to FIG. 23, a typical conventional associative memory will be described. As an example, FIG. 23 describes the system and operation of the conventional associative memory that is applied to the network device 400-3 illustrated in FIG. 24. It is assumed here that the associative memory 300 comprises four words of eight bits.

The associative memory 300 consists of the primary searching associative memory 302 comprising four words of eight bits and the secondary searching associative memory 303 comprising four words of eight bits. The primary searching associative memory 302 is provided with the primary associative memory words 305-0 through 305-3 that can store the structured data consisting of each 8-bit storage data and mask information (data).

Hereupon, the symbol "*" represents "don't care" for the bits of structured data with the corresponding bit of storage data put in the invalid state and the corresponding bit of mask information (data) put in the valid state. The primary searching associative memory 302 carries out the primary search for the storage data coincident with the search data 307 taking the mask information into account, performs the logical sum operation for the coincident storage data in the confirmed valid state, and produces the calculated values as the intermediate data 304-1 through 304-8. The secondary searching associative memory 303 is provided with the associative memory words 306-0 through 306-3 storing as the secondary storage data the same state of each 8-bit storage data stored in the corresponding primary associative memory words 305-0 through 305-3, carries out the secondary search for the secondary storage data coincident with the 8-bit intermediate data 304-1 through 304-8, and makes valid the match lines 301-0 through 301-3 corresponding to the associative memory words 306-0 through 306-3 storing the coincident secondary storage data. The encoder 308 encodes the match lines 301-0 through 301-3 into an address output signal 309 to access the memory that is not illustrated. However, the encoder 308 is not required to have any priority function.

In this example, a valid state and an invalid state are represented by "0" and "1", respectively, for the mask information, but a valid state and an invalid state are represented by "1" and "0", for the storage data, respectively. As well as the storage data, a valid state and an invalid state are represented by "1" and "0", respectively, for the intermediate data 304-1 through 304-8, and the match lines 301-0 through 301-3.

Hereupon, the connection information other than the in-quaternary network address (3, *, *, *) of the network device 400-3 as well as FIG. 25 shall be memorized in the storage data and mask information (data) stored in the primary associative memory words 305-0 through 305-3 of the primary searching associative memory 302. At this time, the symbol "*" represents "don't care" for the bits of connection information with the corresponding bit of mask information (data) put in the valid state "0". The invalid state "0" of storage data is stored in the corresponding bit of data.

Specifically, the primary associative memory word 305-0 stores in binary the storage data (01, 00, 00, 00) and the mask information (11, 00, 00, 00) to represent (1, *, *, *) in quaternary. Likewise, the primary associative memory word 305-1 stores in binary the storage data (10, 00, 00, 00) and the mask information (11, 00, 00, 00) to represent (2, *, *, *) in quaternary. The primary associative memory word 305-2 stores in binary the storage data (01, 10, 10, 00) and the mask information (11, 11, 11, 00) to represent (1, 2, 2, *) in quaternary. The primary associative memory word 305-3 stores in binary the storage data (10, 01, 10, 00) and the mask information (11, 11, 11, 00) to represent (2, 1, 2, *) in quaternary.

The primary searching associative memory 302 carries out, among the primary associative memory words 305-0 through 305-3, the primary search for the storage data coincident with the search data 307 supplied from an external source, taking the mask information into account. As well as the above-mentioned operation system of the conventional network device, FIG. 23 describes the operation system in which the in-quaternary network address (1, 2, 2, 1) of a user's terminal PC401-2 in FIG. 24 is entered as the search data 307. At this time, both the in-quaternary network address (1, *, *, *) stored in the primary associative memory word 305-0 and the in-quaternary network address (1, 2, 2, *) stored in the primary associative memory word 305-2 are coincident with the network address (1, 2, 2, 1) f the search data 307 as the result of primary search. The primary searching associative memory 302 performs the logical sum operation for the in-binary storage data (01, 00, 00, 00) and (01, 10, 10, 00) stored in the primary associative memory words 305-0 and 305-2 coincident with the search data 307 with the storage data confirmed in the valid state, and produces the calculated 8-bit state (01, 10, 10, 00) as the intermediate data 304-1 through 304-8.

The same storage data stored in the primary associative memory words 305-0 through 305-3 corresponding to the primary searching associative memory 302 is stored as the secondary storage data in the associative memory words 306-0 through 306-3 of the secondary searching associative memory 303. In other words, the associative memory words 306-0, 306-1, 306-2 and 306-3 store in binary the storage data (01, 00, 00, 00), (10, 00, 00, 00), (01, 10, 10, 00) and (10, 01, 10, 00), respectively.

The secondary searching associative memory 303 carries out, among the associative memory words 306-0 through 306-3, the secondary search for the secondary storage data coincident with all bits of (01101000) expressed in binary in the intermediate data 304-1 through 304-8 supplied from the primary searching associative memory 302. In this example, the associative memory word 306-2 is completely coincident with the secondary storage data to be stored, and supplies the valid state "1" to the corresponding match line 301-2. The invalid state "0" is supplied to other match lines 301-0, 301-1 and 301-3 that are not coincident correspondingly. The encoder 308 encodes the match lines 301-0 through 301-3 (0100) supplied from the associative memory 300, and then produces the address output signal 309 translated from "10" expressed in binary ("2" in decimal).

Therefore, the associative memory 300 can put the only match line 301-2 corresponding to the storage data with the least number of bits in a mask valid state or non-mask invalid state, in the storage data coincident with the search data 307 taking the mask information into account, into a valid state. This indicates that even the encoder 308 without a priority function correctly supplies the address output signal 309 translated from "2" expressed in decimal. In addition, it indicates that the structured data stored in the primary associative memory words 305-0 through 305-3 without putting data into order at random as mentioned above can be correctly obtained regardless of the order of storing data.

The conventional associative memory 300 cannot produce the correct address output signal without putting the structured data into order to store and using the encoder with the priority function in order to connect a plurality of the associative memory 300 to increase the data storage capacity as described below.

FIG. 26 describes the first example of system and operation of the conventional associative memories 300-0 and 300-1 that are connected. As well as the description of FIG. 23, in this example, it is assumed here that each of the associative memories 300-0 and 300-1 comprises four words of eight bits and the associative memory 300-1 reserves the top of the address space. As a result, the storage capacity of two associative memories is eight words in total.

The search data 307 is entered into all of the associative memories 300-0 and 300-1 that are connected. The associative memories 300-0 and 300-1 send the search data 307 to the priority-less encoder 310 via the match lines 301-0-0 through 301-3-0 and the match lines 301-0-1 through 301-3-1, respectively. The encoder 310 encodes the match lines 301-0-0 through 301-3-1 into an address output signal 309 to access the memory that is not illustrated.

The associative memory 300-0 consists of the primary searching associative memory 302-0 and the secondary searching associative memory 303-0. The intermediate data of 304-1-0 through 304-8-0 is transferred from the primary searching associative memory 302-0 to the secondary searching associative memory 303-0. As well as the description of FIG. 23, it is assumed here that the primary associative memory words 305-0-0 through 305-3-0 of the primary searching associative memory 302-0 store the storage data and mask information (data) so as to represent (1, *, *, *), (2, *, *, *), (1, 2, 2, *) and (2, 1, 2, *) in quaternary as the structured data, respectively. And also, as well as the description of FIG. 23, it is assumed here that the associative memory words 306-0-0 through 306-3-0 of the secondary searching associative memory 303-0 store the same secondary storage data (1, 0, 0, 0), (2, 0, 0, 0), (1, 2, 2, 0) and (2, 1, 2, 0) in quaternary as the storage data, respectively, that are stored in the primary associative memory words 305-0-0 through 305-3-0 of the primary searching associative memory 302-0.

The associative memory 300-1 consists of the primary searching associative memory 302-1 and the secondary searching associative memory 303-1. The intermediate data of 304-1-1 through 304-8-1 is transferred from the primary searching associative memory 302-1 to the secondary searching associative memory 303-1. Since this content is not referred to the connection system of network devices shown in FIG. 24, it is assumed here that the primary associative memory words 305-0-1 through 305-3-1 of the primary searching associative memory 302-1 store the storage data and mask information (data) so as to represent (3, 1, *, *), (1, 2, *, *), (2, 1, *, *) and (3, *, *, *) in quaternary as the structured data, respectively. And also, it is assumed here that the associative memory words 306-1 through 306-3-1 of the secondary searching associative memory 303-1 store the same secondary storage data (3, 1, 0, 0), (1, 2, 0, 0), (2, 1, 0, 0) and (3, 0, 0, 0) in quaternary as the storage data, respectively, that are stored in the primary associative memory words 305-0-1 through 305-3-1 of the primary searching associative memory 302-1.

Hereunder, the description will proceed to input of as the search data 307 the network address (2, 1, 2, 3), expressed in quaternary, of the user's terminal (PC) 401-2 shown in FIG. 24.

In the associative memory 300-0, at the first, the primary searching associative memory 302-0 carries out the primary search for the storage data coincident with the search data 307 taking the mask information into account, and as a result, the structured data (2, *, *, *) and (2, 1, 2, *) in quaternary stored in the primary associative memory words 305-1-0 and 305-3-0, respectively, are coincident with the search data 307. The primary searching associative memory 302-0 performs the logical sum operation for the in-quaternary storage data (2, 0, 0, 0) and (2, 1, 2, 0) stored in the primary associative memory words 305-1-0 and 305-3-0, respectively, coincident with the search data 307 with the storage data confirmed in the valid state, and produces the calculated 8-bit state of (2, 1, 2, 0), expressed in quaternary, as the intermediate data 304-1-0 through 304-8-0, into the secondary searching associative memory 303-0. The secondary searching associative memory 303-0 carries out the secondary search for the secondary storage data that is completely coincident with the intermediate data 304-1-0 through 304-8-0, and as a result, only the secondary storage data stored in the associative memory word 306-3-0 is coincident with the in-quaternary storage data (2, 1, 2, 0). The secondary searching associative memory 303-0 supplies the valid state "1" to the corresponding match line 301-3-0 and the invalid state "0" to other match lines 301-0-0, 301-1-0 and 301-2-0. Like the above, the associative memory 300-0 itself can put the only match line 301-3-0 corresponding to the storage data with the least number of bits in a mask valid state in the storage data coincident with the search data 307 taking the mask information into account, into a valid state.

In the associative memory 300-1, at the first, the primary searching associative memory 302-1 carries out the primary search for the storage data coincident with the search data 307 taking the mask information into account, and as a result, the structured data (2, 1, *, *) in quaternary stored in the primary associative memory words 305-2-1 is coincident with the search data 307. The primary searching associative memory 302-1 produces the in-quaternary storage data (2, 1, 0, 0) stored in the primary associative memory word 305-2-1 coincident with the search data 307 as the intermediate data 304-1-1 through 304-8-1, into the secondary searching associative memory 303-1. The secondary searching associative memory 303-1 carries out the secondary search for the secondary storage data that is completely coincident with the intermediate data 304-1-1 through 304-8-1, and as a result, only the secondary storage data stored in the associative memory word 306-2-1 is coincident with the in-quaternary storage data (2, 1, 0, 0). The secondary searching associative memory 303-1 supplies the valid state "1" to the corresponding match line 301-2-1 and the invalid state "0" to other match lines 301-0-1, 301-1-1 and 301-3-1. Like the above, the associative memory 300-1 itself can put the only match line 301-2-1 corresponding to the storage data with the least number of bits in a mask valid state in the storage data coincident with the search data 307 taking the mask information into account, into a valid state.

Here, the two match lines 301-3-0 and 301-2-1 among the match lines 301-0-0 through 301-3-1 connecting to the encoder 310 are put into the valid state "1". Therefore, the priority-less encoder 310 comes to produce "undefined" as the address output signal 309. Even if the encoder 310 is provided with the priority function to give priority to the top address, it would produce "110" in binary or "6" in decimal as the address output signal 309.

This indicates an incorrect content that the value "110" in binary is different from "011" in binary corresponding to the primary associative memory word 305-3-0 storing the optimum structured data (2, 1, 2, *) in quaternary as realized clearly from the figure.

As a result, it indicates that the correct data cannot be obtained when the structured data is stored into the primary associative memory words 305-0-0 through 305-3-1 without putting data into order at random as the first example of system and operation of a plurality of conventional associative memories connected shown in FIG. 26.

FIG. 27 describes the second example of system and operation of a plurality of the conventional associative memories 300-0 and 300-1 that are connected. As well as the description of FIG. 26, in this example, it is assumed here that each of the associative memories 300-0 and 300-1 comprises four words of eight bits and the associative memory 300-1 reserves the top of the address space.

As well as FIG. 26, the search data 307 is entered into all of the associative memories 300-0 and 300-1 that are connected. The associative memories 300-0 and 300-1 send the search data 307 to the address signal producing section 319 via the match lines 301-0-0 through 301-3-0 and the match lines 301-0-1 through 301-3-1, respectively. The address signal producing section 319 encodes the match lines 301-0-0 through 301-3-1 into an address output signal 309 to access the memory that is not illustrated.

The associative memories 300-0 and 300-1 are constructed just as well as FIG. 26.

However, it is assumed here that the structured data is stored into the primary associative memory words 305-0-0 through 305-3-1 according to the order after putting data into order from smaller to larger values that are assumed to be the value of storage data. As an example of eight pieces of the structured data described as well as FIG. 26, the primary associative memory word 305-0-0 stores the storage data and mask information (data) to represent the in-quaternary structured data (1, *, *, *) that is the minimum storage data (1, 0, 0, 0) expressed in quaternary. Hereunder, the primary associative memory words 305-1-0, 305-2-0, 305-3-0, 305-0-1, 305-1-1, 305-2-1 and 305-3-1 store the storage data and mask information (data) to represent the in-quaternary structured data (1, 2, *, *), (1, 2, 2, *), (2, *, *, *), (2, 1, *, *), (2, 1, 2, *), (3, *, *, *) and (3, 1, *, *) in order, respectively.

The associative memory words 306-0-0 through 306-3-1 of the secondary searching associative memories 303-0 and 303-1 store the same secondary storage data as the storage data stored in the primary associative memory words 305-0-0 through 305-3-1 of the primary searching associative memories 302-0 and 302-1. Therefore, the associative memory words 306-0-0 through 306-3-1 store the in-quaternary (1, 0, 0, 0), (1, 2, 0, 0), (1, 2, 2, 0), (2, 0, 0, 0), (2, 1, 0, 0), (2, 1, 2, 0), (3, 0, 0, 0) and (3, 1, 0, 0) in order, respectively.

Every the associative memory 300-$k$ ($k$=0 or 1), the address signal producing section 319 is provided with the encoder 311-$k$ and the match searching means 313-$k$ to encode the match lines 301-0-$k$ through 301-3-$k$ and also, provided with the priority encoder 315 and the selecting means 316.

The encoder 311-$k$ encodes the match lines 301-$k$ through 301-3-$k$ supplied and produces the encoded one as the matched address signal 312-$k$ to the selecting means 316.

When the match lines 301-0-$k$ through 301-3-$k$ include one or more valid-state signals, the match searching means 313-$k$ produces the valid state "1" of match line to the match searching signal 314-$k$. Otherwise, the invalid state "0" of match line is produced to the match searching signal 314-$k$. Thus, the match searching means 313-$k$ can be constructed by the logical sum operation unit, for example, with the match line confirmed in the valid state.

The priority encoder 315 receives the match searching signals 314-0 and 314-1 and produces the encoded one as the top address signal 317 to the selecting means 316 and also, to the external section from the address signal producing section 319. When the match searching signals 314-0 and 314-1 include more than one valid-state signal, priority is given to the match searching signal 314 corresponding to the associative memory 300 that is assigned to the top of address space.

The selecting means 316 selects the matched address signal 312, among the matched address signals 312-0 through 312-1 entered, corresponding to the top address signal 317 supplied from the priority encoder 315, and produces the matched address signal 312 as the low address signal 318 to the external section from the address signal producing section 319.

The top address signal 317 and the low address signal 318 transferred from the address signal producing section 319 are concatenated to the top side and low side of address output signal 309, respectively, becoming the address signals to access the memory that is not illustrated.

Hereunder, as well as the description in FIG. 26, the description will proceed to input of as the search data 307 the network address (2, 1, 2, 3), expressed in quaternary, of the user's terminal (PC) 401-2 shown in FIG. 24.

In the associative memory 300-0, at the first, the primary searching associative memory 302-0 carries out the primary search for the storage data coincident with the search data 307 taking the mask information into account, and as a result, the structured data (2, *, *, *) in quaternary stored in the primary associative memory word 305-3-0 is coincident with the search data 307. The primary searching associative memory 302-0 produces as the intermediate data 304-1-0 through 304-8-0 the in-quaternary storage data (2, 0, 0, 0) stored in the primary associative memory word 305-3-0 coincident with the search data 307, into the secondary searching associative memory 303-0. The secondary searching associative memory 303-0 carries out the secondary search for the secondary storage data that is completely coincident with the intermediate data 304-1-0 through 304-8-0, and as a result, only the secondary storage data stored in the associative memory word 306-3-0 is coincident with the intermediate data 304-1-0 through 304-8-0. The secondary searching associative memory 303-0 supplies the valid state "1" to the corresponding match line 301-3-0 and the invalid state "0" to other match lines 301-0-0, 301-1-0 and 301-2-0.

Like the above, the associative memory 300-0 itself can put the only match line 301-3-0 corresponding to the storage data with the least number of bits in a mask valid state in the storage data coincident with the search data 307 taking the mask information into account, into a valid state.

In the associative memory 300-1, at the first, the primary searching associative memory 302-1 carries out the primary search for the storage data coincident with the search data 307 taking the mask information into account, and as a result, the structured data (2, 1, *, *) and (2, 1, 2, *) in quaternary stored in the primary associative memory words 305-0-1 and 305-1-1, respectively, are coincident with the search data 307. The primary searching associative memory 302-1 performs the logical sum operation for the in-quaternary storage data (2, 1, 0, 0) and (2, 1, 2, 0) stored in the primary associative memory words 305-0-1 and 305-1-1, respectively, coincident with the search data 307 with the storage data confirmed in the valid state, and produces the calculated 8-bit state of (2, 1, 2, 0), expressed in quaternary, as the intermediate data 304-1-1 through 304-8-1, into the secondary searching associative memory 303-1. The secondary searching associative memory 303-1 carries out the secondary search for the secondary storage data that is completely coincident with the intermediate data 304-1-1 through 304-8-1, and as a result, only the secondary storage data stored in the associative memory word 306-1-1 is coincident with the intermediate data 304-1-1 through 304-8-1. The secondary searching associative memory 303-1 supplies the valid state "1" to the corresponding match line 301-1-1 and the invalid state "0" to other match lines 301-0-1, 301-2-1 and 301-3-1. Like the above, the associative memory 300-1 itself can put the only match line 301-1-1 corresponding to the storage data with the least number of bits in a mask valid state in the storage data coincident with the search data 307 taking the mask information into account, into a valid state.

Here, only the match line 301-3-0 among the match lines 301-0-0 through 301-3-0 connecting to the address signal producing section 319 is put into the valid state "1".

Only the match line 301-1-1 among the match lines 301-0-1 through 301-3-1 is put into the valid state "1". Therefore, the priority-less encoder 311-0 corresponding to the associative memory 300-0 produces "11" expressed in binary as the matched address signal 312-0, into the selecting means 316, and then, the match searching means 313-0 puts the match searching signal 314-0 in the valid state "1". The priority-less encoder 311-1 corresponding to the associative memory 300-1 produces "01" expressed in binary as the matched address signal 312-1, into the selecting means 316, and then, the match searching means 313-1 puts the match searching signal 314-1 in the valid state "1".

Since the two match searching signals 314-0 and 314-1 transferred to the priority encoder 315 are put in the valid state "1", the priority encoder 315 gives priority to the match searching signal 314-1 corresponding to the associative memory 300-1 that is assigned to the top of address space. As a result, the priority encoder 315 produces "1" expressed in binary as the top address signal 317 to the selecting means 316 and also, to the external section from the address signal producing section 319.

The selecting means 316 selects the matched address signal 312-1, "01" expressed in binary, corresponding to the top address signal 317, "1" expressed in binary, supplied from the priority encoder 315, and produces the matched address signal 312-1 as the low address signal 318 to the external section from the address signal producing section 319.

The top address signal 317, "1" expressed in binary, and the low address signal 318, "01" expressed in binary, transferred from the address signal producing section 319 are concatenated to the top side and low side of address output signal 309, respectively, becoming "101" expressed in binary. In other words, in FIG. 27 showing the second example of system and operation of a plurality of the conventional associative memories connected, which is different from in FIG. 26, the in-binary value "101" corresponding to the primary associative memory word 305-1-1 storing the optimum structured data (2, 1, 2, *) in quaternary is obtained as the correct address output signal 309.

Thus, when a plurality of the associative memories 300 are connected to increase the data storage capacity regardless of the correct search result that the single associative memory 300 can obtain even if the structured data is stored in the primary associative memory word 305 without putting data into order at random, the structured data must be stored into the primary associative memory word 305 according to the order after putting data into order from smaller to larger values that are assumed to be the value of storage data in the structured data by the CPU (Central Processing Unit) that is not illustrated.

For example, when the associative memory 300 is used to calculate the transfer network address shown in FIG. 25, the additional connection and disconnection between the network devices are frequently carried out to modify the connection conditions of them, so that it is necessary for the network devices to transmit the connection conditions of them each other in a fixed cycle in order to reflect the modification in the network system and update the structured data stored in the associative memory 300. However, for example, the Internet communication system treats more than 100,000 words in the connection conditions, requires some seconds to put data into order even by using the high-speed CPU, and there was a problem that the network devices cannot perform the data transfer operation during the time of putting data into order.

In addition, there was a problem that connecting a plurality of the associative memories 300 must introduce the expensive high-speed CPU system that is not needed to use a single associative memory 300 with a boost in total price of network devices.

And also, the priority encoder 315 is required to produce the top address signal 317 to distinguish the associative memories 300 that reserve the top addresses in the address space, among the associative memories 300 putting even one match line 301 in the valid state in the address signal producing section 319, and in comparison with an ordinary encoder, only the area for a part of priority function becomes larger together with the remarkably long time of encoding operation. Thus, there was a problem that the system operation speed also becomes lower with a boost in total price of network devices.

Further, there was a problem that the network device using the associative memory 300 cannot increase the data storage capacity only by adding the associative memory 300 simply due to the needs of putting data into order as described above.

It is therefore an object of this invention to provide an associative memory system which consists of a plurality of associative memories and is able to select and produce an optimum piece of data at the high speed among a plurality of storage data coincident with the search data at the time of search operation even if the storage data is written, updated or eliminated without putting data into order.

It is another object of this invention to reduce the total cost of network devices.

It is another object of this invention to provide the network devices that can eliminate, add and modify the data stored in the associative memory without discontinuing the data transfer operation.

It is another object of this invention to provide the network devices that do not need the priority encoder.

It is another object of this invention to provide the network devices that can add or eliminate the associative memory easily according to the increase or decrease of data storage capacity.

It is another object of this invention to provide the network system that can transfer data at the high speed.

SUMMARY OF THE INVENTION

According to a first aspect of the invention, there is provided an associative memory system comprising plural primary associative memory storing mask information for every single word or every plural words of storage data to indicate a valid state or an invalid state representative of whether or not every single bit or every plural bits of said storage data should be excluded from a search object and possessing primary searching means for carrying out a primary searching operation which excludes a single bit or plural bits of said storage data from a search object when said corresponding mask information is in a valid state of mask information for each single word and selecting words coincident with a supplied search data, and intermediate data generating means for producing a storage data with least number of bits in an invalid state of storage data among words selected in said primary searching means as an intermediate data, said associative memory system possessing intermediate data operating means for selecting intermediate data with a least number of invalid state bit of storage data among said intermediate data supplied from said plural intermediate data generating means and for producing the intermediate data as optimized intermediate data, said associative memory system possessing single or plural secondary searching means for storing said storage data being stored in said plural primary searching means and for carrying out a secondary searching operation for selecting storage data coincident with a said optimized intermediate data, said associative memory system possessing match signal producing means for delivering a valid state to match signal corresponding to said storage data which keep being selected after secondary searching operation.

According to a second aspect of the invention, there is provided an associative memory system comprising plural primary associative memory storing mask information for every single word or every plural words of storage data to indicate a valid state or an invalid state representative of whether or not every single bit or every plural bits of said storage data should be excluded from a search object and possessing primary searching means for carrying out a primary searching operation which excludes a single bit or plural bits of said corresponding storage data from a search object when said corresponding mask information is in a valid state of mask information for each single word, and intermediate data generating means for producing a storage data with least number of bits in an invalid state of storage data among the words selected in said primary searching means as intermediate data, said associative memory system possessing intermediate data determining means for delivering an invalid state only for a detecting signal corresponding to a primary associative memory producing an intermediate data with least number of bits in an invalid state of storage data among said intermediate data produced by said plural primary associative memory, said associative memory system possessing plural secondary searching means for carrying out a secondary searching operation storing said storage data being stored in corresponding said plural primary associative memory and selecting storage data coincident with said intermediate data produced by said intermediate data generating means corresponding to said primary searching operation, and said associative memory system possessing match signal producing means for delivering an invalid state to all corresponding match signals when said detecting signal corresponding to said each primary associative memory is an invalid state, and for delivering a valid state to a said match signal corresponding to said storage data selected after secondary searching operation when the detecting signal is in a valid state.

According to a third aspect of the invention, there is provided an associative memory system comprising plural primary associative memory storing mask information for every single word or every plural words of storage data to indicate a valid state or an invalid state representative of whether or not every single bit or every plural bits of said storage data should be excluded from a search object, supplied with a search data comprising search fields with the order of priority, k in number (where k is an integer variable over 2, 2 inclusive), and possessing primary searching means for carrying out a primary searching which excludes corresponding a single bit or plural bits of said storage data from a search object and selects a word coincident with supplied search data when said mask information is in a valid state of mask information for each single word, first intermediate data generating means for producing storage data with least number of bits in an invalid state of storage data in a field corresponding to a search field with first order of priority as first intermediate data among a field corresponding to a search field with first order priority of storage data stored by a word selected after primary searching operation, and second through k-th intermediate data generating means for producing storage data with least number of bits in an invalid state of storage data in a field corresponding to a search field with i-th order of priority as j-th intermediate data among a field corresponding to a search field with an i-th priority of a storage data stored by a word selected after (i−1)th secondary searching operation (where i is an integer variable between 2 and k both inclusive), said associative memory system possessing first through k-th intermediate data operating means for selecting j-th intermediate data with least number of bits in an invalid state of storage data among said plural j-th intermediate data (where j is an integer variable between 1 and k, both inclusive) to produce the j-th intermediate data as j-th optimized intermediate data, said associative memory system possessing single or plural first through k-th secondary searching means for carrying out j-th secondary searching operation storing storage data in a field corresponding to j-th search field stored in said plural primary searching means and selecting storage data coincident with said j-th optimized intermediate data, and said associative memory system possessing match signal producing means for delivering a valid state to a match signal corresponding to said storage data selected after k-th secondary searching operation.

According to a fourth aspect of the invention, there is provided an associative memory system of the third aspect, wherein said first through k-th secondary searching means, sharing a part or all of first through k-th said secondary searching means and said intermediate operating means, respectively, by possessing selection means for selecting intermediate data among the first through k-th optimized intermediate data and control means for selecting a search field as an object of secondary searching operation.

According to a fifth aspect of the invention, there is provided an associative memory system comprising plural primary associative memory storing mask information for every single word or every plural words of storage data to indicate a valid state or an invalid state representative of whether or not every single bit or every plural bits of said storage data should be excluded from a search object, supplied with a search data comprising search fields with the order of priority, k in number (where k is an integer variable over 2, 2 inclusive), and possessing primary searching means for carrying out a primary searching which excludes corresponding a single bit or plural bits of said storage data from a search object and selects a word coincident with supplied search data when said mask information is in a valid state of mask information for each single word, first intermediate data generating means for producing storage data with least number of bits in an invalid state of storage data in a field corresponding to a search field with first order of priority as first intermediate data among a field corresponding to a search field with first order priority of storage data stored by a word selected after primary searching operation, and second through k-th intermediate data generating means for producing storage data with least number of bits in an invalid state of storage data in a field corresponding to a search field with i-th order of priority as i-th intermediate data among a field corresponding to a search field with an i-th priority of a storage data stored by a word selected after (i−1)th secondary searching operation (where i is an integer variable between 2 and k, both inclusive), said associative memory system possessing j-th invalidation means for selecting only said j-th intermediate data with corresponding j-th detecting signal in a valid state among said plural j-th intermediate data (where j is an integer variable between 1 and k, both inclusive), said associative memory system possessing first though k-th intermediate data detecting means for delivering a valid state only to a j-th detecting signal corresponding to a primary associative memory producing j-th intermediate data with least number of bits in an invalid state of storage data among plural j-th intermediate data selected by a j-th invalidation means, said associative memory system possessing initializing means for delivering a valid state to all 0-th detecting signals before primary searching operation, said associative memory system possessing plural first through k-th secondary searching means for carrying out a j-th secondary searching which stores storage data in a field corresponding to a j-th search field stored in said plural primary searching means and selects storage data coincident with said j-th intermediate data produced by corresponding primary associative memory, and said associative memory system possessing match signal producing means for delivering an invalid state to all corresponding match signals when k-th detecting signal corresponding to each primary associative memory is in an invalid state, and for delivering a valid state for a said match signal corresponding to said storage data selected after secondary searching operation when k-th detecting signal corresponding to each primary associative memory is in a valid state.

According to a sixth aspect of the invention, there is provided an associative memory system of the fifth aspect, wherein first through k-th said secondary searching means, sharing a part or all of first through k-th said secondary searching means, said invalidation means, and said intermediate data determining means, respectively, by possessing selection means for selecting single intermediate data among plural corresponding first through k-th intermediate data, control means for selecting a search field as an object of secondary searching, and single or plural storage means for storing whether or not said match signals corresponding to every said primary associative memory keep in a valid state since the beginning of searching operation.

According to a seventh aspect of the invention, there is provided an associative memory system of the second or fifth aspect, wherein said intermediate data determining means, possessing intermediate data operating means for selecting an intermediate data with a least number of invalid state bit of storage data among said delivered intermediate data to deliver as an optimized intermediate data and intermediate data comparing means for delivering a valid state only to said detecting signal corresponding to said primary associative memory which produces said intermediate data coincident with said optimized intermediate data.

According to a eighth aspect of the invention, there is provided an associative memory system of the first, third, or seventh aspect, wherein said intermediate data operating means carries out a logical sum operation (an OR operation) of said plural intermediate data at the same bit position, with a valid state of storage data as true.

According to a ninth aspect of the invention, there is provided an associative memory system of the first, third, or seventh aspect, wherein said intermediate data operating means selects a maximum value, regarding as a binary notation number with a valid state of storage data as true, among said plural intermediate data.

According to a tenth aspect of the invention, there is provided an associative memory system of the first, third, or seventh aspect, wherein said intermediate data operating means, possessing plural invalid state counting means for counting the number of bits in an invalid state of storage data among corresponding said intermediate data supplied from corresponding said primary associative memory, minimum value operating means for selecting the minimum value among operation results of said plural invalid state counting means, and selection means for selecting intermediate data corresponding to said minimum value to deliver as said optimized intermediate data.

According to a eleventh aspect of the invention, there is provided an associative memory system of the first or third aspect, wherein said intermediate data operating means, sharing output terminals of said intermediate data and input terminals of said optimized intermediate data in said plural primary associative memory forming a wired logic-OR circuit of said intermediate data, with a valid state of storage data as true.

According to a twelfth aspect of the invention, there is provided an associative memory system of the second or fifth aspect, wherein said intermediate data determining means, possessing plural invalid state counting means for counting the number of bits in an invalid state of storage data among said intermediate data supplied from said primary associative memory, minimum value operating means for selecting the minimum value among operation results supplied from said plural invalid state counting means, and minimum value comparing means for delivering a valid state only to a detecting signal corresponding to said primary associative memory which supplies intermediate data corresponding to said minimum value.

According to a thirteenth aspect of the invention, there is provided an associative memory of the fifth aspect, wherein said j-th invalidation means, possessing logical-AND means for forcing all bits of j-th intermediate data corresponding to j-th detecting signal in an invalid state to be in an invalid state of storage data.

According to a fourteenth aspect of the invention, there is provided an associative memory system of the fifth aspect, wherein said j-th invalidation means and said j-th intermediate data determining means, possessing plural invalid state counting means for counting the number of bits in an invalid state of storage data among said j-th intermediate data supplied from said primary associative memory, means for changing a counting result of invalid state counting means corresponding to said detecting signal supplied with an invalid state into a value equal to or more than the number of bits of said j-th intermediate data, minimum value operating means for selecting the minimum value among a said operation results supplied from said plural invalid state counting means, and minimum value comparing means for delivering a valid state only to detecting signal corresponding to said primary associative memory which produces an intermediate data corresponding to said minimum value.

According to a fifteenth aspect of the invention, there is provided an associative memory system of the tenth, twelfth, or fourteenth aspect, wherein said invalid state counting means, counting the number of bits in an invalid state of storage data from one side of bit of said intermediate data toward other side up to the bit just before the first bit in a valid state of storage data.

According to a sixteenth aspect of the invention, there is provided an associative memory system of the tenth, twelfth, or fourteenth aspect, wherein said invalid state counting means is included in corresponding primary associative memory.

According to a seventeenth aspect of the invention, there is provided an associative memory system of the first, third, or seventh aspect, wherein said intermediate data operating means, possessing storage means for enabling a pipeline process.

According to a eighteenth aspect of the invention, there is provided an associative memory system of the second or fifth aspect, wherein said intermediate data determining means, possessing single or plural means for synchronizing timing when said intermediate data determining means output detecting signals with a termination of secondary searching operation carried out in parallel.

According to a nineteenth aspect of the invention, there is provided an associative memory system of the first or eighteenth aspect, wherein said primary searching means, sharing means for storing said storage data and means for storing states of said storage data in said secondary searching means.

According to a twentieth aspect of the invention, there is provided an associative memory system of the first or nineteenth aspect, possessing logical-OR means for carrying out a logical sum operation (an OR operation) of said match signals, detecting means for detecting whether or not said match signals corresponding to every said primary associative memory includes a signal in a valid state, first encoding means for encoding output signal of logical-OR means into a field of address signal, and second encoding means for encoding output signal of said detecting means into another field of the address signal.

According to a twenty first aspect of the invention, there is provided an associative memory system of the first or nineteenth aspect, possessing detecting means for detecting whether or not said match signals corresponding to every said primary associative memory include a signal in a valid state, first encoding means for encoding said match signal into a field of an address signal, and second encoding means for encoding output signal of said detecting means into another field of the address signal, and selecting output signal of said first encoding means among said first encoding means corresponding to said each primary associative memory, in accordance with operation result of said second encoding means.

According to a twenty second aspect of the invention, there is provided an associative memory system of the twenty first aspect, wherein said corresponding primary associative memory, possessing said detecting means and said first encoding means.

According to a twenty third aspect of the invention, there is provided a network equipment carrying out a search operation for a single or plural network address through associative memory system of the first through twenty second aspect.

According to a twenty fourth aspect of the invention, there is provided a network system in which data communication is carried out among apparatuses connected to the network via network equipment of the twenty third aspect

BRIEF DESCRIPTION OF THE DRAWINGS

FIG. 2 is a view for describing an operation of the associative memory system according to the first embodiment of this invention.

FIG. 3 is a block diagram of the associative memory system and an operation of it according to the second embodiment of this invention.

FIG. 4 is a block diagram of the second system of intermediate data arithmetic section in the associative memory system of this invention.

FIG. 5 is a block diagram of an operation of the second system of intermediate data arithmetic section in the associative memory system of this invention.

FIG. 15 is a block diagram of the second system of secondary intermediate data determination section, No. h, in the associative memory system of this invention.

FIG. 16 is a block diagram of the third system of secondary intermediate data determination section, No. h, in the associative memory system of this invention.

FIG. 17 is a block diagram of the associative memory system according to the seventh embodiment of this invention.

FIG. 18 is a view for describing an operation of 1-clock memory of associative memory system according to the seventh embodiment of this invention.

FIG. 19 is a view for describing an operation of 2-clock memory of associative memory system according to the seventh embodiment of this invention.

FIG. 20 is a view for describing an operation of 3-clock memory of associative memory system according to the seventh embodiment of this invention.

FIG. 21 is a block diagram of network device system using the associative memories to calculate the transfer network address according to the first embodiment of this invention.

FIG. 22 is a block diagram of network device system using the associative memories for operation of transfer permission according to the second embodiment of this invention.

FIG. 26 is a block diagram of the first system and an operation of a plurality of conventional associative memories connected.

FIG. 27 is a block diagram of the second system and an operation of a plurality of conventional associative memories connected.

DESCRIPTION OF THE PREFERRED EMBODIMENT

The System in the First Embodiment of Invention

Figure 1:
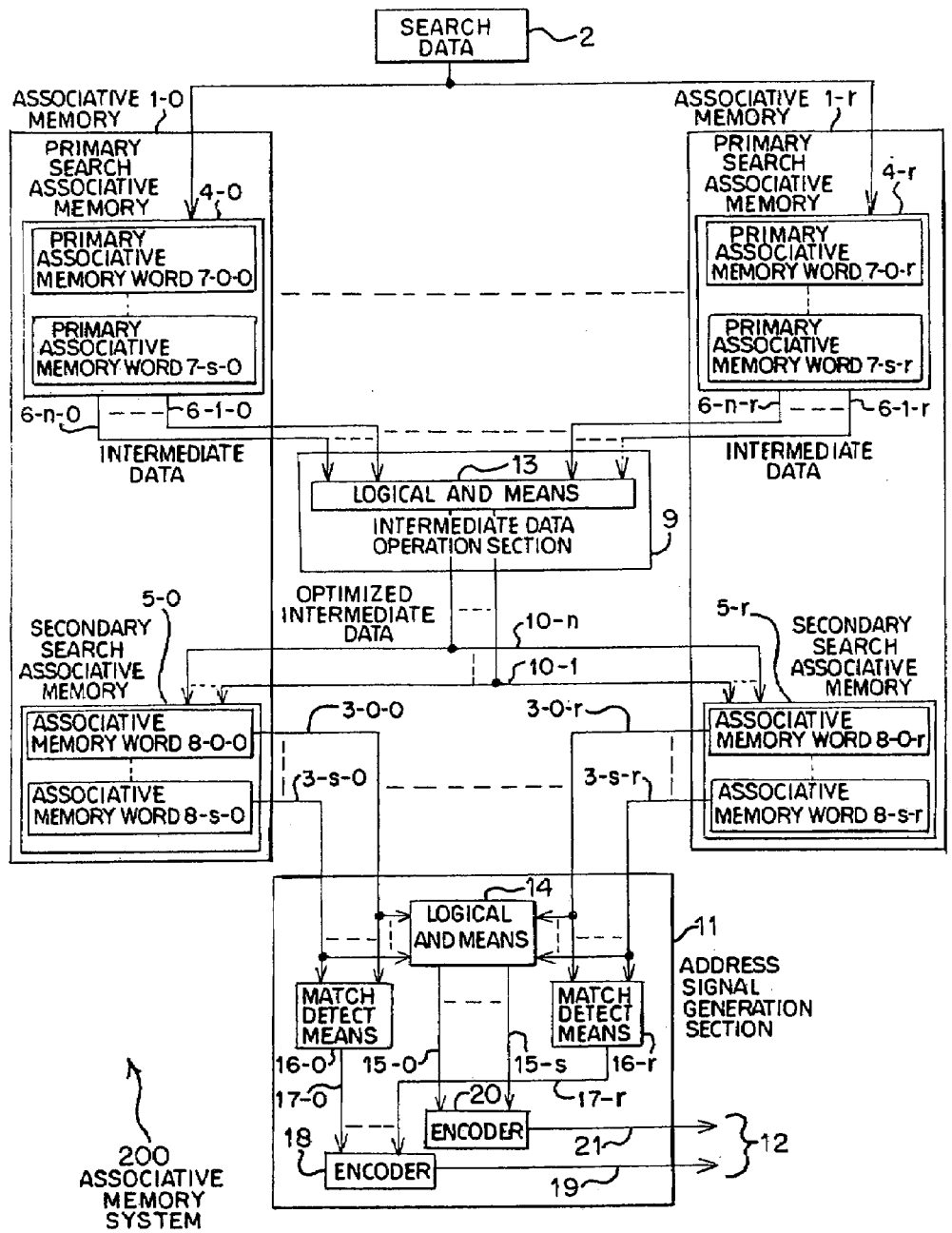
FIG. 1 is a block diagram of the associative memory system according to the first embodiment of this invention.

Now, description will be made in details about the associative memory system according to the first embodiment of this invention with reference to the figures. In the following description, it is assumed here that "n" is represented as "1" or more integer, "m", "p" and "q" are represented as "2" or more integers, and "s", "r" and "t" are represented as integers smaller than "m", "p" and "q" by one, respectively. FIG. 1 is a block diagram of the associative memory system 200 using n-bit (m×p) words according to the first embodiment of this invention. The associative memory system 200 comprises the first through p-th n-bit m-word associative memories 1-0 through 1-$r$, the intermediate data arithmetic section 9 and the address signal producing section 11, and enters n-bit search data 2 and produces the address output signal 12.

The associative memory 1-$k$ (k: an integer of more than 0 (zero) and less than "$r$") comprises the n-bit m-word primary searching associative memory 4-$k$ and n-bit m-word secondary searching associative memory 5-$k$, and enters n-bit search data 2 and n-bit optimized intermediate data 10-1 through 10-$n$ and produces n-bit intermediate data 6-1-$k$ through 6-$n$-$k$ and the first through m-th match lines 3-0-$k$ through 3-$s$-$k$.

The primary searching associative memory 4-$k$ is provided with the primary associative memory words 7-0-$k$ through 7-$s$-$k$ that can store the first through m-th structured data comprising each n-bit storage data and mask information (data). Hereupon, the symbol "*" represents "don't care" for the bits of structured data with the corresponding bit of storage data put in the invalid state and the corresponding bit of mask information (data) put in the valid state. The primary searching associative memory 4-$k$ carries out the primary search, among the primary memory words 7-0-$k$ through 7-$s$-$k$, for the storage data coincident with the search data 2 taking the mask information into account, performs the logical sum operation for the coincident storage data in the confirmed valid state, and produces the calculated values as the intermediate data 6-1-$k$ through 6-$n$-$k$ into the intermediate data arithmetic section 9. In other words, the primary searching associative memory 4-$k$ can comprise the system completely as well as the primary searching associative memory 302 of the conventional associative memory 300 shown in FIG. 23, excepting the transfer operation of the intermediate data 6-1-$k$ through 6-$n$-$k$ into the intermediate data arithmetic section 9 outside the associative memory 1-$k$.

The secondary searching associative memory 5-$k$ is provided with the associative memory words 8-0-$k$ through 8-$s$-$k$ that can store each n-bit secondary storage data. Hereupon, the associative memory word 8-$i$-$k$ (i: an integer of more than 0 (zero) and less than "m") stores as the secondary storage data the same value as the storage data stored in the corresponding primary associative memory word 7-$i$-$k$. The secondary searching associative memory 5-$k$ carries out the secondary search, among the associative memory words 8-0-$k$ through 8-$s$-$k$, for the secondary storage data completely coincident with the optimized intermediate data 10-1 through 10-$n$ supplied from the intermediate data arithmetic section 9, and puts the match lines 3-0-$k$ through 3-$s$-$k$ corresponding to the secondary storage data matched, into the valid sate. In other words, the secondary searching associative memory 5-$k$ can comprise the system completely as well as the secondary searching associative memory 303 of the conventional associative memory 300 shown in FIG. 23, excepting the transfer operation of the optimized intermediate data 10-1 through 10-$n$ instead of the intermediate data 6-1-$k$ through 6-$n$-$k$.

Figure 23:
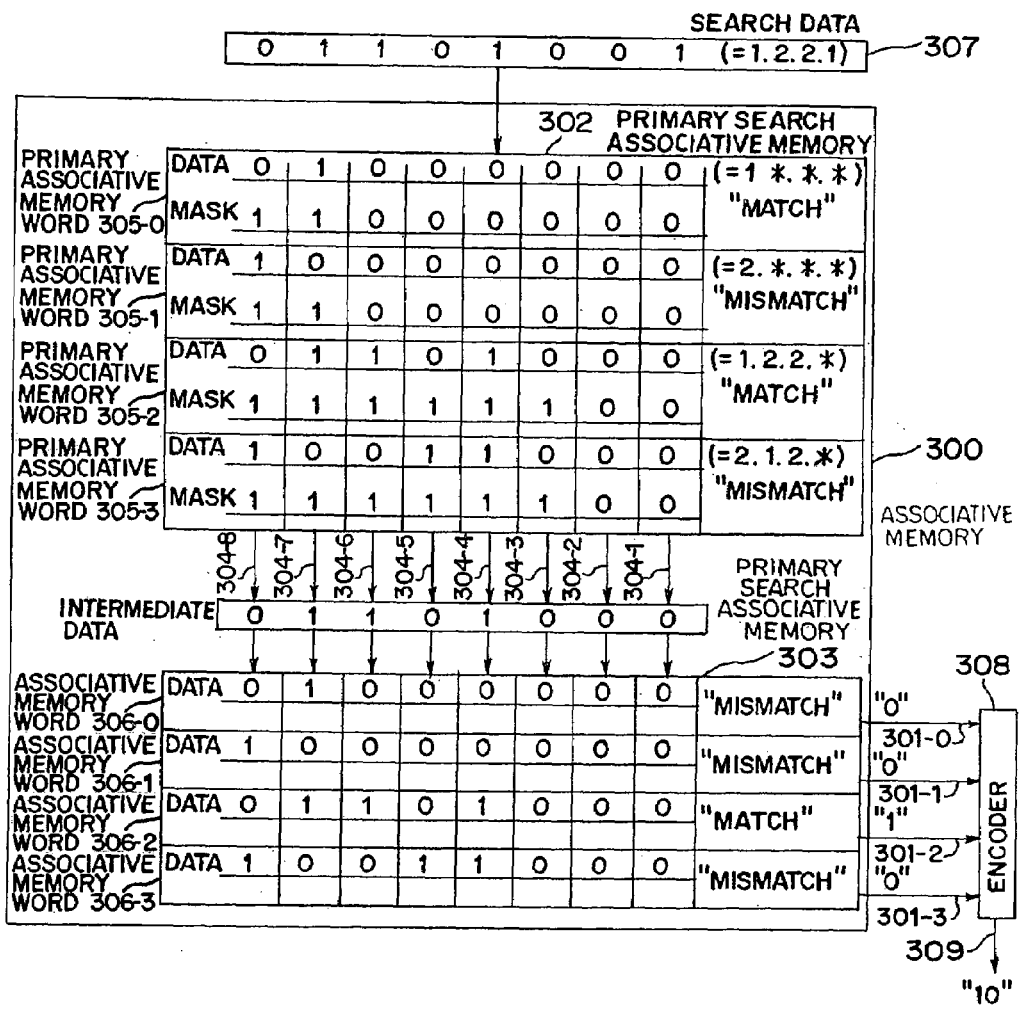
FIG. 23 is a block diagram of system consisting of typical conventional associative memories.

Therefore, the associative memory 1-$k$ can comprise the system completely as well as the conventional associative memory 300 shown in FIG. 23, excepting the transfer operation of the intermediate data 6-1-$k$ through 6-$n$-$k$ into the intermediate data arithmetic section 9 and the use of the optimized intermediate data 10-1 through 10-$n$ supplied as the secondary search data from the intermediate data arithmetic section 9 after the completion of the primary search operation.

The intermediate data arithmetic section 9 produces as the n-bit optimized intermediate data 10-1 through 10-$n$ the intermediate data with the least number of bits in invalid state among the first through p-th n-bit intermediate data (6-1-0 through 6-$n$-0) through (6-1-$r$ through 6-$n$-$r$) supplied from the first through p-th associative memories 1-0 through 1-$r$.

The intermediate data arithmetic section 9 according to the first embodiment of this invention shown in FIG. 1 produces as the n-bit optimized intermediate data 10-1 through 10-$n$ the values obtained after the logical sum operation is performed for the same bit position among the first through p-th n-bit intermediate data (6-1-0 through 6-*n*-0) through (6-1-*r* through 6-*n*-*r*) supplied with the intermediate data in the confirmed valid state, comprising the logical sum means 13.

The address signal producing section 11 is connected to the first through p-th m-bit match lines (3-0-0 through 3-*s*-0) through (3-0-*r* through 3-*s*-*r*) and encodes them into an address output signal 12 to access the memory that is not illustrated. The address signal producing section 11 according to the first embodiment of this invention shown in FIG. 1, which is different from the address signal producing section 319 shown in FIG. 27, is provided with the match searching means 16-*k* that is connected to the match lines 3-0-*k* through 3-*s*-*k* every associative memory 1-*k* (k: an integer of more than 0 (zero) and less than "r") and the logical sum means 14, encoder 18 and encoder 20 that are connected to all of the match lines (3-0-0 through 3-*s*-0) through (3-0-*r* through 3-*s*-*r*).

When the match lines 3-0-*k* through 3-*s*-*k* include one or more valid-state signals, the match searching means 16-*k* produces the valid state of match line to the match searching signal 17-*k*. Otherwise, the invalid state of match line is produced to the match searching signal 17-*k*. Thus, the match searching means 16-*k* can be constructed by the logical sum operation unit, for example, with the match line confirmed in the valid state.

The logical sum means 14 produces as the m-bit optimum matched signals 15-0 through 15-*s* the values obtained after the logical sum operation is performed for the same bit position of the first through p-th m-bit match lines (3-0-0 through 3-*s*-0) through (3-0-*r* through 3-*s*-*r*) supplied with the match line in the confirmed valid state, into the encoder 20.

The encoder 20 encodes the optimum matched signals 15-0 through 15-*s* supplied and produces the encoded one as the low address signal 21 outside the address signal producing section 11. An example of encoding data to the binary is described as follows, but it is needless to say that data may be encoded to others. It is also needless to say that data may be directly transferred to a memory word line that is not illustrated.

The encoder 18 encodes the matched search signals 17-0 through 17-*r* supplied and produces the encoded one as the top address signal 19 outside the address signal producing section 11. An example of encoding data to the binary is described as follows, but it is needless to say that data may be encoded to others. It is also needless to say that data may be directly transferred to a memory word line that is not illustrated.

The top address signal 19 and the low address signal 21 transferred from the address signal producing section 11 are concatenated to the top side and low side of address output signal 12, respectively, becoming the address signals to access the memory that is not illustrated.

The Operation in the First Embodiment of Invention

Next referring to FIG. 2, description will be mad about the operation of associative memory system according to the first embodiment of this invention. FIG. 2 is a view for describing an operation of the associative memory system 200 according to the first embodiment of this invention when the associative memories 1-0 and 1-1 comprising four words of eight bits are connected as well as the description of the first example of system including a plurality of conventional associative memories connected in FIG. 26 and the structured data is stored into the primary associative memory words 7-0-0 through 7-3-1 without putting data into order at random. It is assumed here that the associative memory 1-1 reserves the top addresses in the address space of eight words in total.

In this example, herein, description will be made with the mask valid state "0" and invalid state "1" and also with the storage data valid state "1" and invalid state "0", respectively. In addition, description will be made with the intermediate data 6 valid state "1" and invalid state "0" and also with the match line 3 valid state "1" and invalid state "0", respectively, as well as the storage data.

It is assumed here that the primary associative memory words 7-0-0 through 7-3-0 of the primary searching associative memory 4-0 store the storage data and mask information (data) without putting data into order so as to represent (1, *, *, *), (2, *, *, *), (1, 2, 2, *) and (2, 1, 2, *) in quaternary as the structured data, respectively, as well as the description in FIG. 26.

It is also assumed that the associative memory words 8-0-0 through 8-3-0 of the secondary searching associative memory 5-0 store as the secondary storage data the same in-quaternary values (1, 0, 0, 0), (2, 0, 0, 0), (1, 2, 2, 0) and (2, 1, 2, 0) as the storage data stored in the primary associative memory words 7-0-0 through 7-3-0 corresponding to the primary searching associative memory 4-0 as well as the description in FIG. 26. It is assumed here that the primary associative memory words 7-0-1 through 7-3-1 of the primary searching associative memory 4-1 store the storage data and mask information (data) without putting data into order so as to represent (3, 1, *, *), (1, 2, *, *), (2, 1, *, *) and (3, *, *, *) in quaternary as the structured data, respectively, as well as the description in FIG. 26.

It is also assumed that the associative memory words 8-0-1 through 8-3-1 of the secondary searching associative memory 5-1 store as the secondary storage data the same in-quaternary values (3, 1, 0, 0), (1, 2, 0, 0), (2, 1, 0, 0) and (3, 0, 0, 0) as the storage data stored in the primary associative memory words 7-0-1 through 7-3-1 corresponding to the primary searching associative memory 4-1 as well as the description in FIG. 26.

Figure 24:
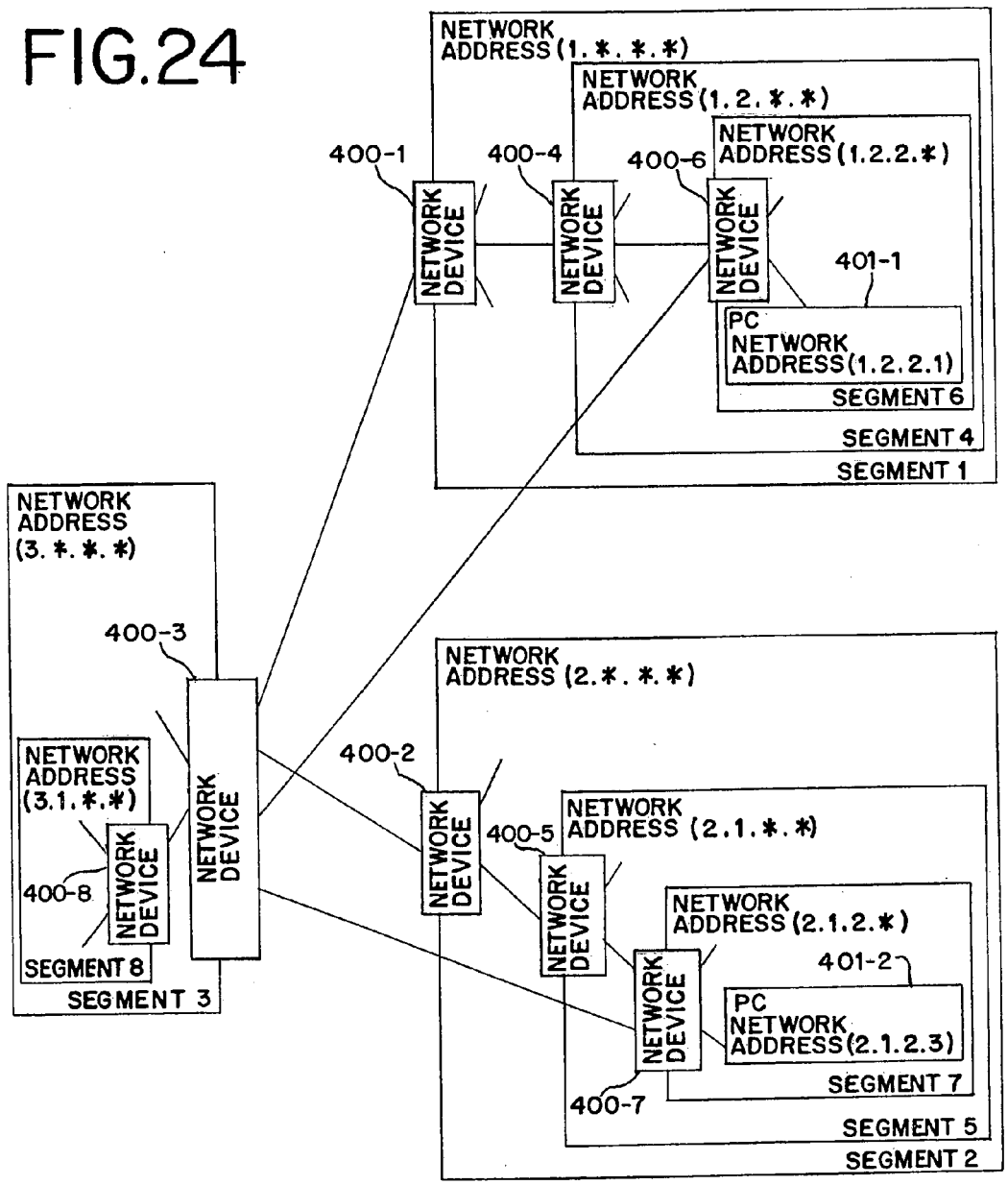
FIG. 24 is a connection diagram of conventional computer network.

As well as the description in FIG. 26, hereunder, the description will proceed to the operation of system on entering as the search data 2 the network address (2, 1, 2, 3), expressed in quaternary, of the user's terminal (PC) 401-2 shown in FIG. 24.

In the associative memory 1-0, at the first, the primary searching associative memory 4-0 carries out the primary search for the storage data coincident with the search data 2 taking the mask information into account, and as a result, the structured data (2, *, *, *) and (2, 1, 2, *) in quaternary stored in the primary associative memory words 7-1-0 and 7-3-0, respectively, are coincident with the search data 2. The primary searching associative memory 4-0 performs the logical sum operation for the in-quaternary storage data (2, 0, 0, 0) and (2, 1, 2, 0) stored in the primary associative memory words 7-1-0 and 7-3-0, respectively, coincident with the search data 2 with the storage data confirmed in the valid state, and produces the calculated 8-bit state of (10, 01, 10, 00), expressed in binary, as the intermediate data 6-1-0 through 6-8-0, into the intermediate data arithmetic section 9. In the associative memory 1-1 as well as the associative memory 1-0, at the first, the primary searching associative memory 4-1 carries out the primary search for the storage data coincident with the search data 2 taking the mask information into account, and as a result, the structured data (2, 1, *, *) in quaternary stored in the primary associative memory word 7-2-1 is coincident with the search data 2. The primary searching associative memory 4-1 produces as the intermediate data 6-1-1 through 6-8-1 the in-quaternary storage data (10, 01, 00, 00) stored in the primary associative memory word 7-2-1 coincident with the search data 2, into the intermediate data arithmetic section 9.

The intermediate data arithmetic section 9 produces as the 8-bit optimized intermediate data 10-1 through 10-8 the intermediate data with the least number of bits in invalid state among the in-binary "10, 01, 10, 00" of intermediate data 6-1-0 through 6-8-0 and the in-binary "10, 01, 00, 00" of intermediate data 6-1-1 through 6-8-1. In an example of the associative memory system in FIG. 1, the logical sum operation is performed for the same bit position by the logical sum means 13 with the intermediate data in the confirmed valid state, and the calculated values "10, 01, 00, 00" in binary are produced as 8-bit optimized intermediate data 10-1 through 10-8 into the associative memories 1-0 and 1-1.

The secondary searching associative memory 5-0 carries out the secondary search for the secondary storage data that is completely coincident with the optimized intermediate data 10-1 through 10-8, and as a result, only the secondary storage data stored in the associative memory word 8-3-0 is coincident with the optimized intermediate data. The secondary searching associative memory 5-0 supplies the valid state "1" to the corresponding match line 3-3-0 and the invalid state "0" to other match lines 3-0-0, 3-1-0 and 3-2-0. Like the above, the secondary searching associative memory 5-1 carries out the secondary search for the secondary storage data that is completely coincident with the optimized intermediate data 10-1 through 10-8, and as a result, the secondary storage data stored in all associative memory words 8-0-1 through 8-3-1 is not coincident with the optimized intermediate data. The secondary searching associative memory 5-1 supplies the invalid state "0" to all corresponding match lines 3-0-1 through 3-3-1.

Therefore, the associative memories 1-0 and 1-1 send "1000" and "0000", expressed in binary, to the address signal producing section 11 via the match lines 3-0-0 through 3-3-0 and the match lines 3-0-1 through 3-3-1, respectively. The logical sum means 14 produces as the 4-bit optimum matched signals 15-0 through 15-3 the in-binary "1000" obtained after the logical sum operation is performed for the same bit position of the match lines 3-0-0 through 3-3-0 and the match lines 3-0-1 through 3-3-1 with the match line in the confirmed valid state, into the encoder 20. The encoder 20 encodes the optimum matched signals 15-0 through 15-3 supplied to the binary and produces the encoded "11" in binary as the low address signal 21 outside the address signal producing section 11.

Further, since the valid-state signal is included in the match lines 3-0-0 through 3-3-0, the match searching means 16-0 produces the valid state "1" as the match searching signal 17-0 to the encoder 18. On the other hand, since the valid-state signal is not included in the match lines 3-0-1 through 3-3-1, the match searching means 16-1 produces the invalid state "0" as the match searching signal 17-1 to the encoder 18. The encoder 18 encodes the in-binary value "01" of match searching signals 17-0 and 17-1 supplied to the binary and produces the encoded "0" in binary as the top address signal 19 outside the address signal producing section 11.

Concatenating the in-binary value "0" of the top address signal 19 and the in-binary value "11" of the low address signal 21, which are produced from the address signal producing section 11, as the top and low sides of address output signal 12, respectively, allows to obtain the in-binary value "011" of the address output signal 12.

As a result, it indicates that the in-binary value "011" corresponding to the primary associative memory word 7-3-0 storing the optimum structured data (2, 1, 2, *) in quaternary is obtained as the correct address output signal 12 regardless of the associative memory system 200, according to the first embodiment of this invention shown in FIG. 1, storing the structured data in the primary associative memory words 7-0-0 through 7-3-1 without putting data into order at random.

It also indicates that the associative memory system 200, according to the first embodiment of this invention shown in FIG. 1, is different from the second example of the system comprising a plurality of the conventional associative memories connected in FIG. 27 and can obtain the correct value even without the priority encoder.

The above-mentioned matters mean that the associative memory system 200 can carry out the optimum secondary search in the whole system since the intermediate data arithmetic section 9 produces as the 8-bit optimized intermediate data 10-1 through 10-8 the intermediate data with the least number of bits in invalid state among the intermediate data 6-1-0 through 6-8-0 and the intermediate data 6-1-1 through 6-8-1, into the associative memories 1-0 and 1-1 for the secondary search. Thus, the priority encoder is not needed since all of the match lines 3-0-1 through 3-3-1 of the associative memory 1-1 that do not store the optimum data are put in the invalid state. Since the values of intermediate data 6-1-0 through 6-8-0 produced by the primary search become the secondary search data for the associative memory 1-0 storing the further optimum data, it indicates that the structured data may be stored in the primary associative memory words 7-0-0 through 7-s-r without putting data into order at random as well as the conventional associative memory 300 shown in FIG. 23.

It is needless to say that constructing a pipeline with a timely application of the memory means for the optimum matched signals 15-0 through 15-s and the match searching signals 17-0 through 17-r, or the match lines 3-0-0 through 3-s-r can boost the frequency of the clock signal.

Further, it is needless to say that constructing a pipeline with a timely application of the memory means for the intermediate data (6-1-0 through 6-n-0) through (6-1-r through 6-n-r) or the optimized intermediate data 10-1 through 1-n can boost the frequency of the clock signal.

This example of the associative memory 1-k is described for the primary searching associative memory 4-k and the secondary searching associative memory 5-k to be used for the primary search and the secondary search, respectively. Here, it is needless to say that the associative memory system 200 can be constructed completely as well as the case that one associative memory carries out the primary search and the secondary search by sharing the components. In addition, it is needless to say that one associative memory using n-bit (m×p) words may comprise the secondary searching associative memories 5-1 through 5-r. And also, it is evident that some pieces of associative memories having the capacity of n-bit (m×p) words in total can also comprise those.

The System in the Second Embodiment of Invention

Now, description will be made in details about the associative memory system according to the second embodiment of this invention with reference to the figures. FIG. 3 is a block diagram of the associative memory system 201 using n-bit (m×p) words and an example of operation according to the second embodiment of this invention.

The associative memory system 201 comprises the first through p-th n-bit m-word associative memories 1-0 through 1-r, the intermediate data arithmetic section 9 and the address signal producing section 25, and enters n-bit search data 2 and produces the address output signal 12. In FIG. 3 showing the associative memory system 201 as well as the description of an operation of the associative memory system 200 according to the first embodiment of this invention in FIG. 2, an example of system operation will be described when the associative memories 1-0 and 1-1 comprising four words of eight bits are connected and the structured data is stored into the primary associative memory words 7-0-0 through 7-3-1 without putting data into order at random. It is assumed here that the associative memory 1-1 reserves the top addresses in the address space of eight words in total. Of course, it is needless to say that comprising can be also done as well when some pieces of any n-bit m-word associative memory 1 are connected.

In comparison with the associative memory system 200 according to the first embodiment of this invention shown in FIG. 1, the associative memories 1-0 through 1-r and the intermediate data arithmetic section 9 in the associative memory system 201 according to the second embodiment of this invention shown in FIG. 3 are found to be constructed as well as those in the associative memory system 200 according to the first embodiment of this invention, but only the internal component of the address signal producing section 25 is different Hereunder, only the different parts or contents will be described.

Every the associative memory 1-k (k: an integer of more than 0 (zero) and less than "r"), the address signal producing section 25 is provided with the encoder 22-k and the match searching means 16-k to encode the match lines 3-0-k through 3-s-k and also, provided with the encoder 18 and the selecting means 24.

In comparison with the address signal producing section 319 in the second example of system that a plurality of the conventional associative memories are connected in FIG. 27, the address signal producing section 25 including the encoders 22-0 through 22-r, the match searching means 16-0 through 16-r and selecting means 24 in the associative memory system 201 according to the second embodiment of this invention shown in FIG. 3 is found to be the same construction as the conventional address producing section 319 shown in FIG. 27. The different matter is only that the priority encoder 315 in the conventional address signal producing section 319 shown in FIG. 27 is replaced with the encoder 18 in the address signal producing section 25 of the associative memory system 201 according to the second embodiment of this invention shown in FIG. 3. The encoder 18 is different from the priority encoder 315 shown in FIG. 27 in only the priority function that the former has not The encoder 18 is provided with the functions to enter the match searching signals 17-0 through 17-r produced by the match searching means 16-0 through 16-r and transfer the encoded one as the top address signal 19 into the selecting means 24 and outside the address signal producing section 25. It is needless to say that the following description takes an example of encoding data to the binary by the encoders 22-0, 22-1 and 18, but other encoding operation may be performed. In addition, it is needless to say that data may be directly transferred to a memory word line that is not illustrated. Next referring to FIG. 3, description will be mad about the operation of associative memory system according to the second embodiment of this invention. As well as FIG. 1, in this example, herein, description will be made with the mask valid state "0" and invalid state "1" and also with the storage data valid state "1" and invalid state "0", respectively. In addition, description will be made with the intermediate data 6 valid state "1" and invalid state "0" and also with the match line 3 valid state "1" and invalid state "0", respectively, as well as the storage data.

It is assumed here that the primary associative memory words 7-0-0 through 7-3-1 of the primary searching associative memories 4-0 and 4-1 store the storage data and mask information (data) without putting data into order so as to represent (1, *, *, *), (2, *, *, *), (1, 2, 2, *), (2, 1, 2, *), (3, 1, *, *), (1, 2, *, *), (2, 1, *, *) and (3, *, *, *) in quaternary as the structured data, respectively, as well as the description in FIG. 1. It is also assumed that the associative memory words 8-0-0 through 8-3-1 of the secondary searching associative memories 5-0 and 5-1 store as the secondary storage data the same in-quaternary values (1, 0, 0, 0), (2, 0, 0, 0), (1, 2, 2, 0), (2, 1, 2, 0), (3, 1, 0, 0), (1, 2, 0, 0), (2, 1, 0, 0) and (3, 0, 0, 0) as the storage data stored in the primary associative memory words 7-0-0 through 7-3-1 corresponding to the primary searching associative memories 4-0 and 4-1 as well as the description in FIG. 1.

As well as the description in FIG. 1, when the network address (2, 1, 2, 3), expressed in quaternary, of the user's terminal (PC) 401-2 shown in FIG. 24 is entered as the search data 2, the associative memories 1-0 and 1-1 and the intermediate data arithmetic section 9 operate as well as the description in FIG. 1, as a result, only the match line 3-3-0 among the match lines 3-0-0 through 3-3-1 transfers the valid state "1" of mach line to the address signal producing section 25, and other match lines 3-0-0 through 3-2-0 and 3-0-1 through 3-3-1 are given the invalid state "0" of mach line. Therefore, the associative memories and 1-1 send "1000" and "0000", expressed in binary, to the address signal producing section 25 via the match lines 3-0-0 through 3-3-0 and the match lines 3-0-1 through 3-3-1, respectively.

Thus, the priority-less encoder 22-0 corresponding to the associative memory 1-0 produces "11" expressed in binary as the matched address signal 23-0, into the selecting means 24, and then, the match searching means 16-0 puts the match searching signal 17-0 in the valid state "1". The priority-less encoder 22-1 corresponding to the associative memory 1-1 produces "00" expressed in binary as the matched address signal 23-1, into the selecting means 24, and then, the match searching means 16-1 puts the match searching signal 17-1 in the invalid state "0".

Since the valid state "1" is brought to only the match searching signal 17-0 between the match searching signals 17-0 and 17-1 supplied to the encoder 18 in FIG. 3, the encoder 18, which is different from the priority encoder 315 in FIG. 27, transfers the in-binary "0" as the top address signal 19 into the selecting means 24 and outside the address signal producing section 25.

The selecting means 24 selects the matched address signal 23-0, "11" expressed in binary, corresponding to the top address signal 19, "0" expressed in binary, supplied from the encoder 18, and produces the low address signal 21 outside the address signal producing section 25.

Concatenating the in-binary value "0" of the top address signal 19 and the in-binary value "11" of the low address signal 21, which are produced from the address signal producing section 25, as the top and low sides of address output signal 12, respectively, allows to obtain the in-binary value "011" of the address output signal 12. Therefore, it indicates that the associative memory system 201, according to the second embodiment of this invention shown in FIG. 3, is different from the second example of the system comprising a plurality of the conventional associative memories connected in FIG. 27 and can obtain the correct searched data corresponding to the search data 2 even without the priority encoder as well as an operation of the associative memory system 200 according to the first embodiment of this invention in FIG. 2.

The above-mentioned matters mean that the associative memory system 201, as well as the associative memory system 200 according to the first embodiment of this invention, can carry out the optimum secondary search in the whole system since the intermediate data arithmetic section 9 produces as the 8-bit optimized intermediate data 10-1 through 10-8 the intermediate data with the least number of bits in invalid state among the intermediate data 6-1-0 through 6-8-0 and the intermediate data 6-1-1 through 6-8-1, into the associative memories 1-0 and 1-1 for the secondary search. Thus, the priority encoder is not needed since all of the match lines 3-0-1 through 3-3-1 of the associative memory 1-1 that do not store the optimum data are put in the invalid state.

The construction of address signal producing section 25 in this example is more complicated than that of the address signal producing section 11 shown in FIG. 1, however, the number of long lines can be reduced by physically locating the corresponding encoder 22-$k$ and the match searching means 16-$k$ each other at the close positions every associative memory 1-$k$ ($k$: an integer of more than 0 (zero) and less than "r"). Since the area of the associative memories 1-0 through 1-$r$ is extremely large, the match lines 3-0-0 through 3-$s$-$r$ become very long to connect the associative memories. As a result, the address signal producing section 25 in this example can reduce the consumable electrical power due to the signal delay time and wiring electrical capacity in comparison with the address signal producing section 11 shown in FIG. 1. Further, the area of associative memories can be made smaller by reducing the wiring area.

Of course, it is evident that the correct results can be obtained by using the address signal producing section 319 provided with the priority encoder 315 shown in FIG. 27 in stead of the address signal producing section 25 in this example. In this case, it is also needless to say that the structured data can be stored in the primary associative memory words 7-0-0 through 7-3-1 without putting data into order.

It is needless to say that constructing a pipeline with a timely application of the memory means for the matched address signals 23-0 through 23-$r$ and the match searching signals 17-0 through 17-$r$, or the match lines 3-0-0 through 3-$s$-$r$ can boost the frequency of the clock signal.

In addition, this example of the associative memory 1-$k$ is described for the primary searching associative memory 4-$k$ and the secondary searching associative memory 5-$k$ to be used for the primary search and the secondary search, respectively. Here, it is needless to say that the associative memory system 201 can be constructed completely as well as the case that one associative memory carries out the primary search and the secondary search by sharing the components.

[The Second System of Intermediate Data Arithmetic Section]

Next, an example of the second system of intermediate data arithmetic section in the associative memory system of this invention will be described. FIG. 4 is a block diagram of the second system of intermediate data arithmetic section in the associative memory system of this invention. The intermediate data arithmetic section 26 produces as the n-bit optimized intermediate data 10-1 through 10-$n$ the intermediate data with the least number of bits in invalid state among the first through p-th n-bit intermediate data (6-1-0 through 6-$n$-0) through (6-1-$r$ through 6-$n$-$r$) supplied from the first through p-th associative memories that are not illustrated as well as the intermediate data arithmetic section 9 shown in FIG. 1. The second system of intermediate data arithmetic section 26 shown in FIG. 4 comprises the maximum value selecting means 27 to produce as the n-bit optimized intermediate data 10-1 through 10-$n$ the maximum value obtained by comparing the first through p-th n-bit intermediate data (6-1-0 through 6-$n$-0) through (6-1-$r$ through 6-$n$-$r$) supplied as the values in binary, respectively. The network addresses are of the hierarchical structure as shown in FIG. 24, so that the intermediate data with the least number of bits in invalid state becomes the maximum value in binary.

Next referring to FIG. 5, description will be made about an operation of the second system of intermediate data arithmetic section 26 in the associative memory system of this invention. This example is that the intermediate data 6-1-0 through 6-8-0 of the network address (2, 1, 2, 0) expressed in quaternary and the intermediate data 6-1-1 through 6-8-1 of the network address (2, 1, 0, 0) expressed in quaternary are respectively supplied to the intermediate data arithmetic section 26 from the two associative memories comprising eight bits that are not illustrated as well as the FIG. 1. And also, as well as FIG. 1, this example presets the valid and invalid states of intermediate data 6 as "1" and "0", respectively.

The value of intermediate data 6-1-0 through 6-8-0 is expressed "10011000" in binary and "152" in decimal. Similarly, the value of intermediate data 6-1-1 through 6-8-1 is expressed "10010000" in binary and "144" in decimal. Therefore, the maximum value selecting means 27 selects the intermediate data 6-1-0 through 6-8-0 as the maximum value obtained after comparing with the intermediate data 6-1-1 through 6-8-1 and produces the optimized intermediate data 10-1 through 10-8 outside the intermediate data arithmetic section 26. As a result, it is found that the correct value is obtained as the optimized intermediate data 10-1 through 10-8.

When the valid and invalid states of intermediate data 6 are set as "0" and "1", respectively, it is needless to say that the minimum value selecting means is constructed to produce as the n-bit optimized intermediate data 10-1 through 10-$n$ the minimum value obtained by comparing the first through p-th n-bit intermediate data (6-1-0 through 6-$n$-0) through (6-1-$r$ through 6-$n$-$r$) supplied as the values in binary, respectively.

In addition, it is needless to say that constructing a pipeline with a timely application of the memory means for the intermediate data (6-1-0 through 6-$n$-0) through (6-1-$r$ through 6-$n$-$r$) or the optimized intermediate data 10-1 through 10-$n$ can boost the frequency of the clock signal.

[The Third System of Intermediate Data Arithmetic Section]

Figure 6:
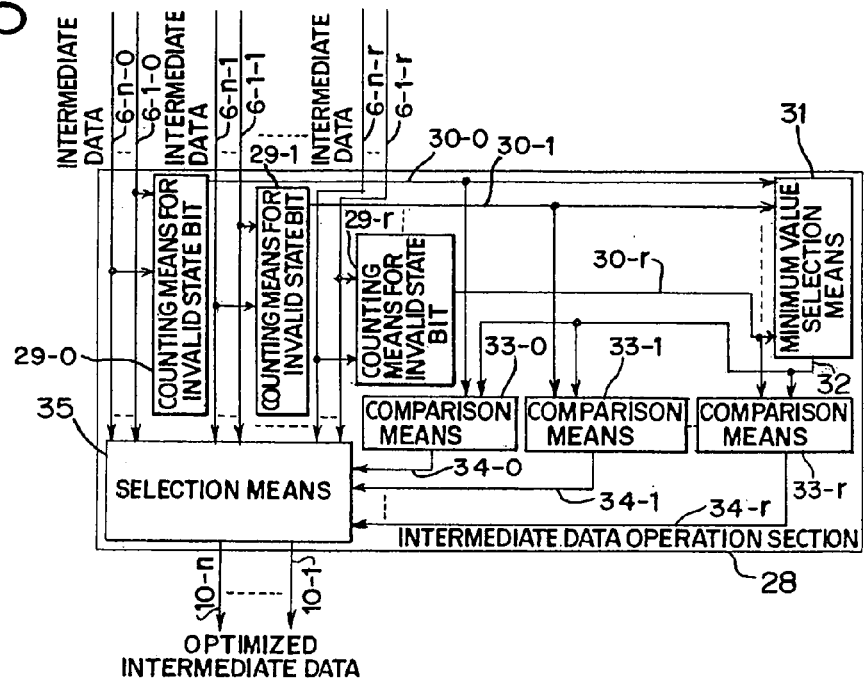
FIG. 6 is a block diagram of the third system of intermediate data arithmetic section in the associative memory system of this invention.

Next, an example of the third system of intermediate data arithmetic section in the associative memory system of this invention will be described. FIG. 6 is a block diagram of the third system of intermediate data arithmetic section in the associative memory system of this invention. The intermediate data arithmetic section 28 produces as the n-bit optimized intermediate data 10-1 through 10-n the intermediate data with the least number of bits in invalid state among the first through p-th n-bit intermediate data (6-1-0 through 6-n-0) through (6-1-r through 6-n-r) supplied from the first through p-th associative memories that are not illustrated as well as the intermediate data arithmetic section 9 shown in FIG. 1. The third system of intermediate data arithmetic section 28 shown in FIG. 6 is provided with the counting means 29-0 through 29-r for the number of bits in the invalid state, the comparison means 33-0 through 33-r, the minimum value selecting means 31, and the selecting means 35.

The k-th counting means 29-k for the number of bits in the invalid state stores the corresponding n-bit intermediate data 6-1-k through 6-n-k and counts the number of bits in the invalid state for the intermediate data expressed from the lowest hierarchical unit to the top hierarchical unit of network address until the first bit in the valid state appears in the intermediate data. The counting means 29-k for the number of bits in the invalid state produces the counted result as the signal 30-k for the number of bits in the invalid state, into the minimum value selecting means 31 and comparison means 33-k.

The minimum value selecting means 31 compares the signals 30-0 through 30-r for the number of bits in the invalid state supplied from the counting means 29-0 through 29-r for the number of bits in the invalid state, respectively, and produces the lowest value as the minimum value signal 32 into the comparison means 33-0 through 33-r.

The k-th comparison means 33-k compares the corresponding signal 30-k for the number of bits in the invalid state and the minimum value signal 32, and produces the valid state to the selection enabling signal 34-k when the two signals match each other.

Otherwise, the k-th comparison means 33-k produces the invalid sate. Therefore, the selection enabling signal 34-k becomes valid only when the k-th signal 30-k for the number of bits in the invalid state is the minimum value among the signals 30-0 through 30-r for the number of bits in the invalid state.

The selecting means 35 produces as the optimized intermediate data 10-1 through 10-n the intermediate data 6-1-k through 6-n-k corresponding to the selection enabling signal 34-k in the valid state among the selection enabling signals 34-0 through 34-r, outside the intermediate data arithmetic section 28. In other words, when the number of bits in the invalid state for the intermediate data expressed from the lowest hierarchical unit to the top hierarchical unit of network address is counted until the first bit in the valid state appears in the intermediate data, the intermediate data 6-1-k through 6-n-k that will become the minimum value is produced as the optimized intermediate data 10-1 through 10-n.

Figure 7:
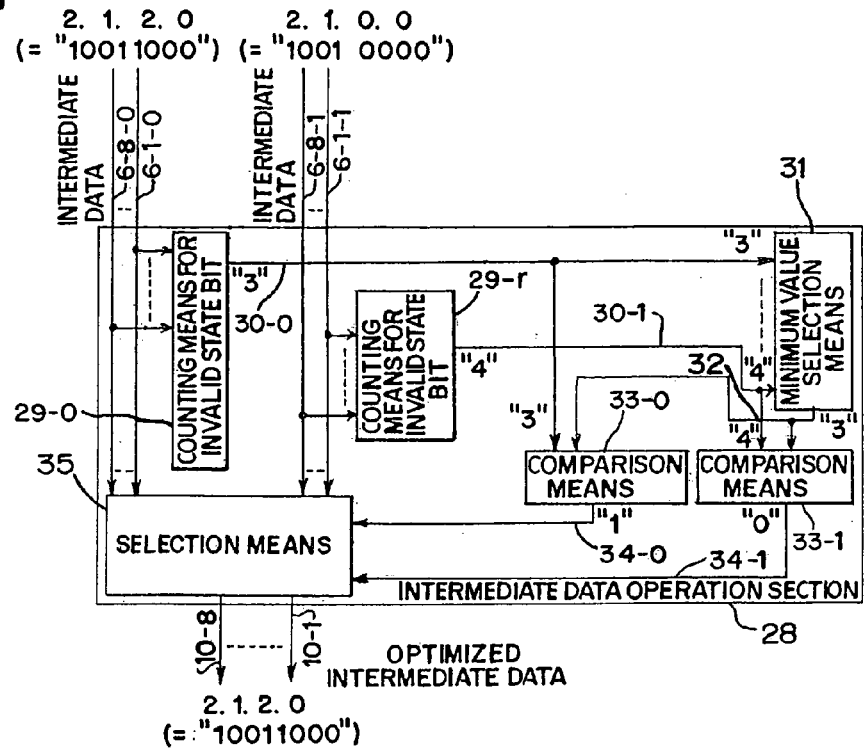
FIG. 7 is a block diagram of an operation of the third system of intermediate data arithmetic section in the associative memory system of this invention.

Next referring to FIG. 7, description will be made about an operation of the third system of intermediate data arithmetic section 28 in the associative memory system of this invention. This example is that the intermediate data 6-1-0 through 6-8-0 of the network address (2, 1, 2, 0) expressed in quaternary and the intermediate data 6-1-1 through 6-8-1 of the network address (2, 1, 0, 0) expressed in quaternary are respectively supplied to the intermediate data arithmetic section 28 from the two associative memories comprising eight bits that are not illustrated as well as the FIG. 1. And also, as well as FIG. 1, this example presets the valid and invalid states of intermediate data 6 as "1" and "0", respectively.

As shown in FIG. 24, the top and low hierarchical units of network address are expressed at the left and right sides, respectively.

The counting means 29-0 for the number of bits in the invalid state counts the invalid state "0" from the bits at the right side until the first valid state "1" appears in the intermediate data 6-1-0 through 6-8-0 expressed "10011000" in binary, and produces the obtained value "3" in decimal as the signal 30-0 for the number of bits in the invalid state.

The counting means 29-1 for the number of bits in the invalid state counts the invalid state "0" from the bits at the right side until the first valid state "1" appears in the intermediate data 6-1-1 through 6-8-1 expressed "10010000" in binary, and produces the obtained value "4" in decimal as the signal 30-1 for the number of bits in the invalid state.

The minimum value selecting means 31 compares the signals 30-0 and 30-1 for the number of bits in the invalid state supplied from the counting means 29-0 and 29-1 for the number of bits in the invalid state, respectively, and produces the lowest value "3" expressed in decimal as the minimum value signal 32 into the comparison means 33-0 and 33-1.

The comparison means 33-0 compares the corresponding value "3", expressed in decimal, of signal 30-0 for the number of bits in the invalid state and the value "3", expressed in decimal, of the minimum value signal 32, and produces the valid state to the selection enabling signal 34-0 since the two signals match each other. The comparison means 33-1 compares the corresponding value "4", expressed in decimal, of signal 30-1 for the number of bits in the invalid state and the value "3", expressed in decimal, of the minimum value signal 32, and produces the invalid state to the selection enabling signal 34-1 since the two signals do not match. The selecting means 35 produces as the optimized intermediate data 10-1 through 10-8 the intermediate data 6-1-0 through 6-8-0 of the network address (2, 1, 2, 0), expressed in quaternary, corresponding to the selection enabling signal 34-0 in the valid state between the selection enabling signals 34-0 and 34-1 supplied, outside the intermediate data arithmetic section 28. As a result, it is found that the correct value is obtained as the optimized intermediate data 10-1 through 10-8. This is because the symbol "*" represents "don't care" for the bits of structured data with the corresponding bit of storage data put in the invalid state and the corresponding bit of mask information (data) put in the valid state in the associative memories 1-0 through 1-r, so that the optimized intermediate data 10-1 through 10-n matches the intermediate data 6-1-k through 6-n-k that will be the minimum value when the number of bits in the invalid state for the intermediate data expressed from the lowest hierarchical unit to the top hierarchical unit of network address is counted until the first bit in the valid state appears in the intermediate data.

Further, it is needless to say that constructing a pipeline with a timely application of the memory means for the intermediate data (6-1-0 through 6-n-0) through (6-1-r through 6-n-r) or the optimized intermediate data 10-1 through 10-n can boost the frequency of the clock signal.

In this example, the counting means 29-k for the number of bits in the invalid state counts the number of bits in the invalid state for the intermediate data expressed from the lowest hierarchical unit to the top hierarchical unit of network address in the intermediate data 6-1-k through 6-n-k until the first bit in the valid state appears in the intermediate data in order to reduce the circuit scale. However, it is evident that counting may be done simply for the number of all bits in the invalid state in the intermediate data 6-1-k through 6-n-k.

The System in the Third Embodiment of Invention

Figure 8:
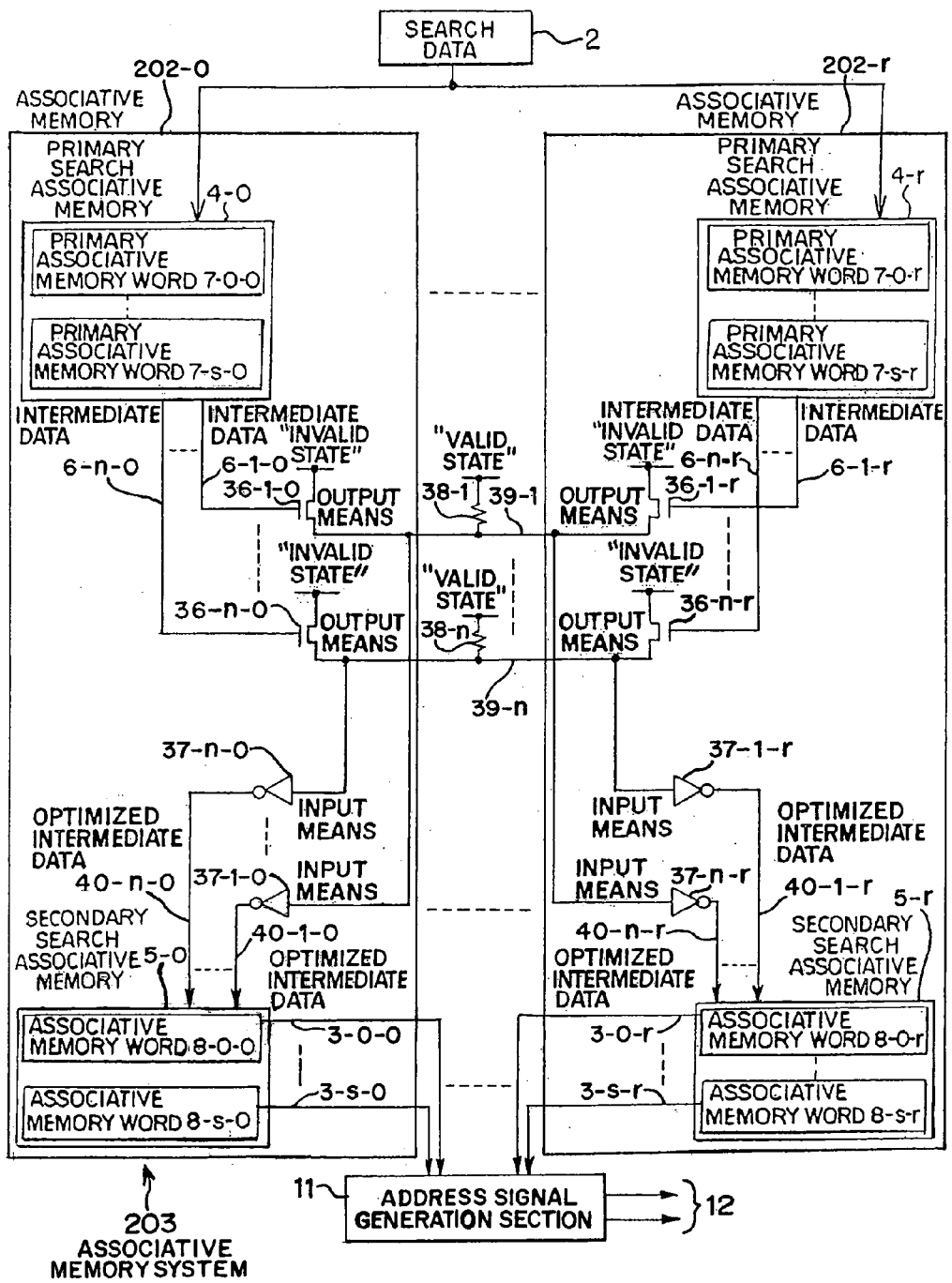
FIG. 8 is a block diagram of the associative memory system according to the third embodiment of this invention.

Now, description will be made in details about the associative memory system according to the third embodiment of this invention with reference to the figures. FIG. 8 is a block diagram of the associative memory system 203 using n-bit (m×p) words according to the third embodiment of this invention.

The associative memory system 203 comprises the first through p-th n-bit m-word associative memories 202-0 through 202-r, the first through n-th resisters 38-1 through 38-n and the address signal producing section 11, and enters n-bit search data 2 and produces the address output signal 12.

In comparison with the associative memory system 200 according to the first embodiment of this invention shown in FIG. 1, the address signal producing section 12 in the associative memory system 203 according to the third embodiment of this invention shown in FIG. 8 is found to be constructed as well as that in the associative memory system 200 according to the first embodiment of this invention, but only the internal construction of associative memories 202-0 through 202-r and the application of resisters 38-1 through 38-n instead of the intermediate data arithmetic section 9 are different Hereunder, only the different parts or contents will be described.

The associative memory 202-k (k: an integer of more than 0 (zero) and less than "r") comprises the primary searching associative memory 4-k, the secondary searching associative memory 5-k, the output means 36-1-k through 36-n-k and the input means 37-1-k through 37-n-k. In comparison with the associative memory 1-k shown in FIG. 1, it is found that the associative memory 202-k shown in FIG. 8 is constructed as well as the primary searching associative memory 4-k, and the secondary searching associative memory 5-k is constructed as well as the associative memory 1-k shown in FIG. 1.

In comparison with the associative memory 1-k shown in FIG. 1, the different matters are only that the output means 36-1-k through 36-n-k are connected to the intermediate data 6-1-k through 6-n-k supplied from the primary searching associative memory 4-k, the input means 37-1-k through 37-n-k produce the optimized intermediate data 37-1-k through 37-n-k to be entered into the secondary searching associative memory 5-k, and the logical connection sum signals 39-1 through 39-n that are the output signals of the output means 36-1-k through 36-n-k are produced outside the associate memory 202-k and into the input means 37-1-k through 37-n-k, respectively. Hereunder, only the different parts or contents will be described.

The j-th G: an integer of more than 1 and less than "n") output means 36-j-k is put between the electric potential of the intermediate data in the invalid state and the logical connection sum signal 39-j, so that the continuity state is set when the intermediate data 36-j-k is put into the valid state, or the opened state is set when the intermediate data 36-j-k is put into the invalid state. Therefore, the output means 36-j-k transfers the invalid sate of intermediate data to the logical connection sum signal 39-j when the intermediate data 36-j-k is put into the valid state, and puts the logical connection sum signal 39-j into the opened state when the intermediate data 36-j-k is put into the invalid state.

The j-th input means 37-j-k inverts the state of the logical connection sum signal 39-j supplied and produces it as the optimized intermediate data 40-j-k into the secondary searching associative memory 5-k.

The logical connection sum signals 39-1 through 39-n produced from the associative memories 202-0 through 202-r make the corresponding bits connected each other, and are connected to the electric potential of intermediate data in the valid state via the corresponding registers 38-1 through 38-n.

Like the above, as a result, the output operation of the valid state to the j-bit intermediate data 6-j-k in even one primary memory 4-k makes the j-bit optimized intermediate data lines 40-j-0 through 40-j-r, which are entered into all the secondary associative memories 5-0 through 5-r, comprise the wired OR connection to put the intermediate data into the valid state. The above-mentioned matter is logically equivalent to the logical sum means 13 of the intermediate data arithmetic section 9 shown in FIG. 1.

Therefore, it is found that the whole associative memory system 203 is logically equivalent to the associative memory system 200 shown in FIG. 1.

Since the associative memory system 203, in this example, realizes the construction equivalent to the intermediate data arithmetic section shown in FIG. 1 by means of the wired OR connection, the associative memory system 203 is provided with only the first through n-th lines of the logical connection sum signals 39-1 through 39-n, excepting the match lines (3-0-0 through 3-s-0) through (3-0-r through 3-s-r). The associative memory 202-k is provided with only the first through n-th terminals required to enter and supply the logical connection sum signals 39-1 through 39-n, excepting the search data and the match lines 3-0-k through 3-s-k. For example, when comprising the associative memory system 203 shown in FIG. 8 by using the four 64-bit associative memories 1-0 through 1-3, the number of above-mentioned lines between the associative memories is 64, and the number of above-mentioned terminals required for the associative memory 202-k is 64.

The associative memory system 200, shown in FIG. 1, is provided with the n×p lines to produce the n-bit intermediate data (6-1-0 through 6-n-0) through (6-1-r through 6-n-r) to the intermediate data arithmetic section 9 by the first through p-th associative memories through 1-r, respectively, and the first trough n-th lines of optimized intermediate data 10-1 through 10-n to produce data to the associative memories 1-0 through 1-r by the intermediate data arithmetic section 9. Thus, the associative memory system 200 is provided with the n×(p+1) lines between the associative memories 1-0 through 1-r, excepting the match lines (3-0-0 through 3-s-0) through (3-0-r through 3-s-r). The associative memory 1-k requires the 2n-th terminals in total including the n-th terminals to produce the n-bit intermediate data 6-1-k through 6-n-k and the n-th terminals to enter the n-bit optimized intermediate data 10-1 through 10-n, excepting the search data and the match lines 3-0-k through 3-s-k. For example, when comprising the associative memory system 200 shown in FIG. 1 by using the four 64-bit associative memories 1-0 through 1-3, the number of above-mentioned lines between the associative memories is 320, and the number of above-mentioned terminals required for the associative memory 1-k is 128.

In comparison with the associative memory system 200 shown in FIG. 1, therefore, the associative memory system 203 according to the third embodiment of this invention shown in FIG. 8 can greatly reduce the number of long lines and the number of terminals required for the associative memory 202. Since the area of associative memory 202 is extremely large, the line between the associative memories becomes extremely long.

In comparison with the associative memory system 200 shown in FIG. 1, as a result, the associative memory system 203 in this example can reduce the consumable electrical power due to the signal delay time and wiring electrical capacity. Further, the area of associative memories can be made smaller by reducing the wiring area. The great reduction of the number of terminals required for the associative memory 202 can also make smaller the area of the associative memory 202.

This example of the associative memory 202-$k$ is described for the primary searching associative memory 4-$k$ and the secondary searching associative memory 5-$k$ to be used for the primary search and the secondary search, respectively. Here, it is needless to say that the associative memory system 203 can be constructed completely as well as the case that one associative memory carries out the primary search and the secondary search by sharing the components.

In addition, it is needless to say that the associative memory system 203 can be constructed by pre-charging the intermediate data in the valid state before starting the primary search operation instead of connecting the logical connection sum signals 39-1 through 39-$n$ to the intermediate data in the valid state via the registers 38-1 through 38-$n$.

The System in the Forth Embodiment of Invention

Figure 9:
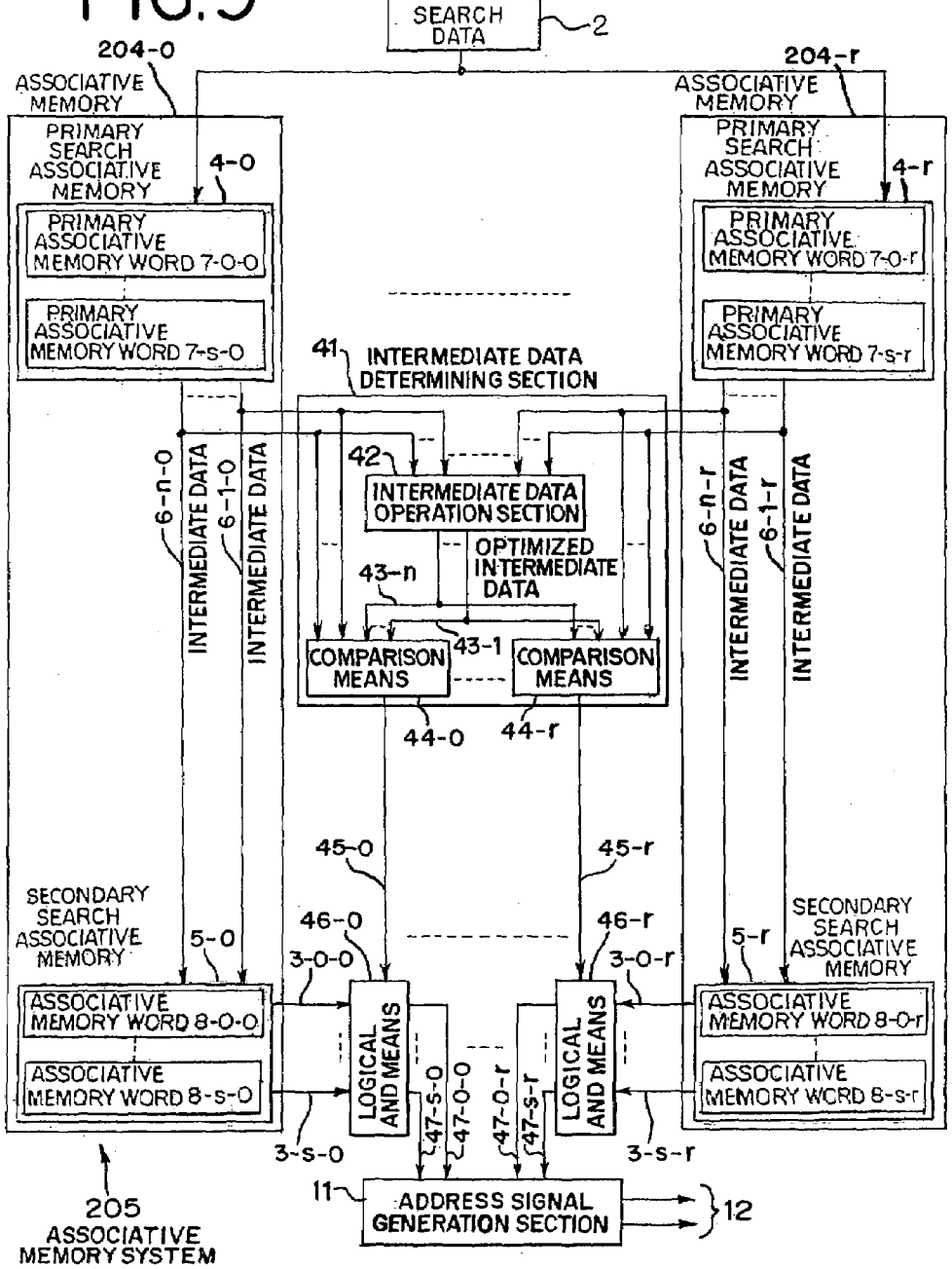
FIG. 9 is a block diagram of the associative memory system according to the fourth embodiment of this invention.

Now, description will be made in details about the associative memory system according to the forth embodiment of this invention with reference to the figures. FIG. 9 is a block diagram of the associative memory system 205 using n-bit (m×p) words according to the forth embodiment of this invention.

The associative memory system 205 comprises the first through p-th n-bit m-word associative memories 204-0 through 204-$r$, the first through p-th logical AND means 46-0 46-$r$, the intermediate data determination section 41 and the address signal producing section 11, and enters n-bit search data 2 and produces the address output signal 12.

In comparison with the conventional associative memory 300-$k$ shown in FIG. 27, it is found that the k-th associative memory 204-$k$ can be constructed as well as the conventional associative memory 300-$k$ shown in FIG. 27, excepting the transfer operation of the intermediate data 6-1-$k$ through 6-$n$-$k$ into the secondary searching associative memory 5-$k$ and outside the associative memory 204-$k$.

The address signal producing section 11 can construct the system completely as well as the address signal producing section 11 shown in FIG. 1, excepting that the match lines 3-0-0 through 3-$s$-$r$ is replaced with the active match lines 47-0-0 through 47-$s$-$r$ for the input operation. Of course, it is needless to say that the address signal producing section 25 shown in FIG. 3 can also construct the system.

The intermediate data determination section 41 produces the valid state the valid search signals 45-0 through 45-$r$ corresponding to the intermediate data with the least number of bits in invalid state among the first through p-th n-bit intermediate data (6-1-0 through 6-$n$-0) through (6-1-$r$ through 6-$n$-$r$) supplied from the first through p-th associative memories 204-0 through 204-$r$. The intermediate data determination section 41 consists of the intermediate data arithmetic section 42 and the first through p-th comparison means 44-0 through 44-$r$. The intermediate data arithmetic section 41 produces as the n-bit optimized intermediate data 43-1 through 43-$n$ the intermediate data with the least number of bits in invalid state among the first through p-th n-bit intermediate data (6-1-0 through 6-$n$-0) through (6-1-$r$ through 6-$n$-$r$) supplied from the first through p-th associative memories 204-0 through 204-$r$, into the comparison means 44-0 through 44-$r$.

Therefore, the intermediate data arithmetic section 42 can construct the system completely as well as the intermediate data arithmetic section 9 shown in FIG. 1. Of course, it is needless to say that the system can be constructed by using the intermediate data arithmetic section 26 of the system in the second embodiment of invention shown in FIG. 4 or the intermediate data arithmetic section 28 of the system in the third embodiment of invention shown in FIG. 6.

The k-th comparison means 44-$k$ compares the corresponding intermediate data 6-1-$k$ through 6-$n$-$k$ and the optimized intermediate data 43-1 through 43-$n$, and produces the valid state to the valid search signal 45-$k$ when the two pieces of data match each other.

Otherwise, the k-th comparison means 44-$k$ produces the invalid sate. Therefore, the valid search signal 45-$k$ becomes valid only when the k-th intermediate data 6-1-$k$ through 6-$n$-$k$ for the number of bits in the invalid state is the minimum value among the first through p-th n-bit intermediate data (6-1-0 through 6-$n$-0) through (6-1-$r$ through 6-$n$-$r$).

The logical AND means 46-$k$ corresponding to the k-th associate memory 204-$k$ produces as the active mach lines 47-0-$k$ through 47-$s$-$k$ the match lines 3-0-$k$ through 3-$s$-$k$ supplied from the associative memory 204-$k$, into the address signal producing section 11, when the corresponding valid search signal 45-$k$ is put in the valid state. Otherwise, when the valid search signal 45-$k$ is put in the invalid state, the logical AND means 46-$k$ produces the invalid state into all of the first through m-th active match lines 47-0-$k$ through 47-$s$-$k$.

The Operation in the Forth Embodiment of Invention

Figure 10:
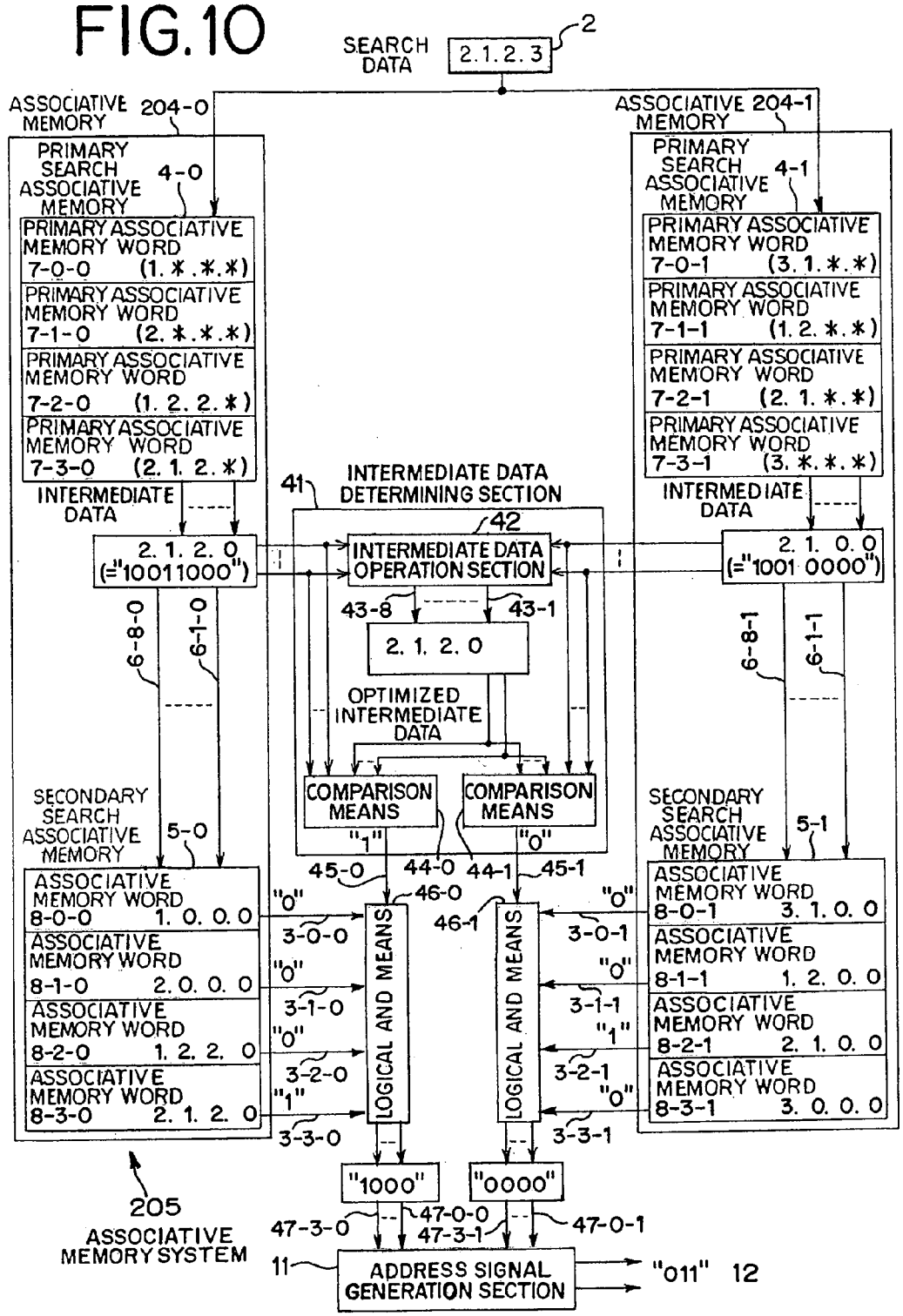
FIG. 10 is a view for describing an operation of the associative memory system according to the fourth embodiment of this invention.

Next referring to FIG. 10, description will be mad about the operation of associative memory system according to the forth embodiment of this invention. FIG. 10 is a view for describing an operation of the associative memory system according to the forth embodiment of this invention when the associative memories 204-0 and 204-1 comprising four words of eight bits are connected as well as the description of FIG. 1 and FIG. 26 and the structured data is stored into the primary associative memory words 7-0-0 through 7-3-1 without putting data into order at random. It is assumed here that the associative memory 204-1 reserves the top addresses in the address space of eight words in total as well as the description of FIG. 1 and FIG. 26.

As well as FIG. 1 and FIG. 26, in this example, herein, description will be made with the mask valid state "0" and invalid state "1" and also with the storage data valid state "1" and invalid state "0", respectively. In addition, description will be made with the intermediate data 6 valid state "1"

and invalid state "0" and also with the match line 3 valid state "1" and invalid state "0", respectively, as well as the storage data.

It is assumed here that the primary associative memory words 7-0-0 through 7-3-1 of the primary searching associative memories 4-0 and 4-1 store the storage data and mask information (data) without putting data into order so as to represent (1, *, *, *), (2, *, *, *), (1, 2, 2, *), (2, 1, 2, *), (3, 1, *, *), (1, 2, *, *), (2, 1, *, *) and (3, *, *, *) in quaternary as the structured data, respectively, as well as the description in FIG. 1 and FIG. 26. It is also assumed that the associative memory words 8-0-0 through 8-3-1 of the secondary searching associative memories 5-0 and 5-1 store as the secondary storage data the same in-quaternary values (1, 0, 0, 0), (2, 0, 0, 0), (1, 2, 2, 0), (2, 1, 2, 0), (3, 1, 0, 0), (1, 2, 0, 0), (2, 1, 0, 0) and (3, 0, 0, 0) as the storage data stored in the primary associative memory words 7-0-0 through 7-3-1 corresponding to the primary searching associative memories 4-0 and 4-1 as well as the description in FIG. 1 and FIG. 26.

As well as the description in FIG. 26, when the network address (2, 1, 2, 3), expressed in quaternary, of the user's terminal (PC) 401-2 shown in FIG. 24 is entered as the search data 2, the associative memories 204-0 and 204-1 operate as well as the conventional associative memories 300-0 and 300-1 shown in FIG. 26. After the primary search operation with input of the search data 2 in the primary searching associative memory 4-0 of the associative memory 204-0, the primary associative memory words 7-1-0 and 7-3-0 match the search data, the intermediate data 6-1-0 through 6-8-0, (2, 1, 2, 0) expressed in quaternary and "10011000" expressed in binary, is produced into the secondary searching associative memory 5-0 and the intermediate data determination section 41. After the secondary search operation with input of the intermediate data 6-1-0 through 6-8-0 in the secondary searching associative memory 5-0, the associative memory word 8-3-0 matches the search data and "1000" in binary is transferred into the match lines 3-0-0 through 3-3-0. After the primary search operation with input of the search data 2 in the primary searching associative memory 4-0 of the associative memory 204-1, the primary associative memory words 7-2-1 matches the search data, the intermediate data 6-1-1 through 6-8-1, (2, 1, 0, 0) expressed in quaternary and "10010000" expressed in binary, is produced into the secondary searching associative memory 5-1 and the intermediate data determination section 41. After the secondary search operation with input of the intermediate data 6-1-1 through 6-8-1 in the secondary searching associative memory 5-1, the associative memory word 8-2-1 matches the search data and "0100" in binary is transferred into the match lines 3-0-1 through 3-3-1.

The intermediate data arithmetic section 42 of the intermediate data determination section 41 produces as the optimized intermediate data 43-1 through 43-8 the intermediate data, "10011000" expressed in binary and (2, 1, 2, 0) expressed in quaternary, with the least number of bits in invalid state among the in-binary "10011000" of intermediate data 6-1-0 through 6-8-0 and the in-binary "10010000" of intermediate data 6-1-1 through 6-8-1.

The comparison means 44-0 compares the corresponding intermediate data 6-1-0 through 6-8-0, "10011000" expressed in binary, and the value of optimized intermediate data 43-1 through 43-8, and produces the valid state to the valid search signal 45-0 since the two pieces of data match each other. The comparison means 44-1 compares the corresponding intermediate data 6-1-1 through 6-8-0, "10010000" expressed in binary, and the value of optimized intermediate data 43-1 through 43-8, and produces the invalid state to the valid search signal 45-1 since the two pieces of data do not match each other.

The logical AND means 46-0 produces the match lines 3-0-0 through 3-3-0, "1000" expressed in binary, supplied from the associative memory 204-0 to the active match lines 47-0-0 through 47-3-0 since the corresponding valid search signal 45-0 is put in the valid state. The logical AND means 46-1 produces the invalid state of match line to all the active match lines 47-0-1 through 47-3-1 since the corresponding valid search signal 45-1 is put in the invalid state. Therefore, the active match lines 47-0-1 through 47-3-1 becomes "0000" in binary. As a result, only the active match line 47-3-0 is put in the valid state signal among the signals entered in the address signal producing section 11 as well as the description in FIG. 2, so that it is found that the address signal producing section 11 can produce the correct value "011", expressed in binary, into the address output signal 12 as well as the description in FIG. 2.

In this example of operation, when the intermediate data 6-1-$k$ through 6-8-$k$ is not the optimum among the first through p-th intermediate data (6-1-0 through 6-8-0) through (6-1-$r$) through (6-8-$r$) according to the match lines 3-0-$k$ through 3-$s$-$k$ obtained after the secondary search operation with the secondary searching associative memory 5-$k$ for the intermediate data 6-1-$k$ through 6-8-$k$ produced by the primary searching associative memory 4-$k$ in the k-th associative memory 204-$k$, putting all the match lines 3-0-$k$ through 3-$s$-$k$ in the invalid state and then entering them in the address signal producing section 11 allows obtaining the optimum address output signal 12 in the whole associative memory system 205. On the other hand, the associative memory system 200 according to the first embodiment of this invention is constructed to obtain the optimum address output signal 12 in the whole associative memory system by carrying out the secondary search operation with the secondary searching associative memories 5-0 through 5-$r$ to enter the optimized intermediate data 10-1 through 10-8 selected as the optimum data, in the whole associative memory system 200, from the first through p-th intermediate data (6-1-0 through 6-8-0) through (6-1-$r$ through 6-8-$r$) by means of the intermediate data arithmetic section 9. In the associative memory system 200 according to the first embodiment of this invention, therefore, the secondary searching associative memories 5-0 through 5-$r$ could not start the secondary search operation until the intermediate data arithmetic section 9 produces data. In this example of operation, however, it is possible to boost the computing speed greatly in the whole associative memory system 205 since the operation of intermediate data determination section 41 and the secondary search operation with the secondary searching associative memories 5-0 through 5-$r$ can be executed at the same time.

In addition, the n-bit optimized intermediate data is not required to enter into the p-th associative memories 204-0 through 204-$r$, so that the n×p long lines can be reduced in the whole associative memory system 205 and also, the n-th terminals for the associative memory 204 can be reduced. In comparison with the associative memory system 200 shown in FIG. 1, as a result, the associative memory system 205 in this example can reduce the consumable electrical power due to the signal delay time and wiring electrical capacity.

Further, the area of associative memories can be made smaller by reducing the wiring area. The great reduction of the number of terminals required for the associative memories can also make smaller the area of the associative memory 205.

This example of the associative memory 204-*k* is described for the primary searching associative memory 4-*k* and the secondary searching associative memory 5-*k* to be used for the primary search and the secondary search, respectively. Here, it is needless to say that the associative memory system 205 can be constructed completely as well as the case that one associative memory carries out the primary search and the secondary search by sharing the components.

[The Second System and Operation of Intermediate Data Determination Section]

Figure 11:
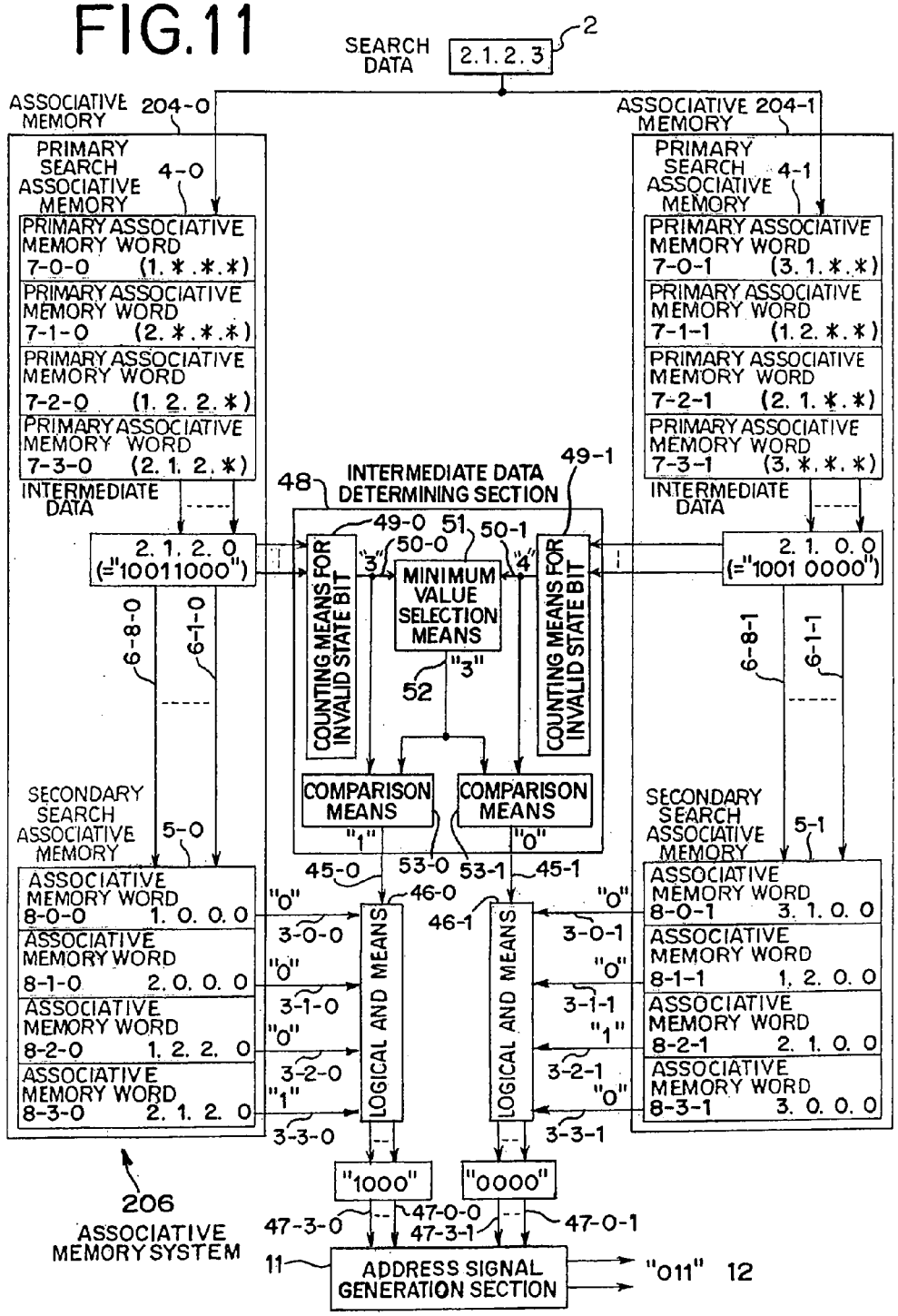
FIG. 11 is a block diagram of the second system and an operation of intermediate data determination section in the associative memory system of this invention.

Now, description will be made about the second system of intermediate data determination section in the associative memory system of this invention. FIG. 11 is a block diagram of the second system of intermediate data determination section 48 in the associative memory system 206 of this invention and an operation in the associative memory system 206.

The associative memory system 206 comprises the first through p-th n-bit m-word associative memories 204-0 through 204-*r*, the intermediate data determination section 48 and the address signal producing section 11, and enters n-bit search data 2 and produces the address output signal 12. In comparison with the associate memory system 205 shown in FIG. 9, the different matter is only that the intermediate data determination section 41 is replaced with the intermediate data determination section 48 according to the second embodiment of this invention, others can be constructed completely as well as the associate memory system 205. In the associate memory system 206 in FIG. 11, an example of system operation will be described when the associative memories 204-0 and 204-1 comprising four words of eight bits are connected as well as the description of an operation of the associative memory system according to the fourth embodiment of this invention shown in FIG. 10 and data is stored into the primary associative memory words 7-0-0 through 7-3-1 and the associative memory words 8-0-0 through 8-3-1 as well as the description in FIG. 10.

It is assumed here that the associative memory 204-1 reserves the top addresses in the address space of eight words in total. Of course, it is needless to say that comprising can be also done as well when some pieces of any n-bit m-word associative memory 204 are connected.

As well as the intermediate data determination section 41 shown in FIG. 9, the intermediate data determination section 48 produces the valid state the valid search signals 45-0 through 45-*r* corresponding to the intermediate data with the least number of bits in invalid state among the first through p-th n-bit intermediate data (6-1-0 through 6-*n*-0) through (6-1-*r* through 6-*n*-*r*) supplied from the first through p-th associative memories.

The k-th counting means 49-*k* for the number of bits in the invalid state stores the corresponding n-bit intermediate data 6-1-*k* through 6-*n*-*k* and counts the number of bits in the invalid state for the intermediate data expressed from the lowest hierarchical unit to the top hierarchical unit of network address until the first bit in the valid state appears in the intermediate data. The counting means 49-*k* for the number of bits in the invalid state produces the counted result as the signal 50-*k* for the number of bits in the invalid state, into the minimum value selecting means 51 and comparison means 53-*k*.

The minimum value selecting means 51 compares the signals 50-0 through 50-*r* for the number of bits in the invalid state supplied from the counting means 49-0 through 49-*r* for the number of bits in the invalid state, respectively, and produces the lowest value as the minimum value signal 52 into the comparison means 53-0 through 53-*r*.

The k-th comparison means 53-*k* compares the corresponding signal 50-*k* for the number of bits in the invalid state and the minimum value signal 52, and produces the valid state to the valid search signal 45-*k* when the two signals match each other. Otherwise, the k-th comparison means 53-*k* produces the invalid sate. Therefore, the valid search signal 45-*k* becomes valid only when the k-th signal 50-*k* for the number of bits in the invalid state is the minimum value among the signals 50-0 through 50-*r* for the number of bits in the invalid state. In other words, when the number of bits in the invalid state for the intermediate data expressed from the lowest hierarchical unit to the top hierarchical unit of network address is counted until the first bit in the valid state appears in the intermediate data, the valid state is produced to only the valid search signal 45-*k* corresponding to the intermediate data 6-1-*k* through 6-*n*-*k* that will become the minimum value.

Next referring to FIG. 11, description will be made about an operation of the second system of intermediate data determination section 48 in the associative memory system of this invention. This example presets the valid and invalid states of intermediate data 6 as "1" and "0", respectively. As shown in FIG. 24, the top and low hierarchical units of address are expressed at the left and right sides, respectively. It is here assumed that the associative memories 204-0 and 204-1 operate as well as in FIG. 10 and the intermediate data 6-1-0 through 6-8-0 of the network address (2, 1, 2, 0) expressed in quaternary and the intermediate data 6-1-1 through 6-8-1 of the network address (2, 1, 0, 0) expressed in quaternary are respectively supplied to the intermediate data determination section 48.

The counting means 49-0 for the number of bits in the invalid state counts the invalid state "0" from the bits at the right side until the first valid state "1" appears in the intermediate data 6-1-0 through 6-8-0 expressed "10011000" in binary, and produces the obtained value "3" in decimal as the signal 50-0 for the number of bits in the invalid state.

The counting means 49-1 for the number of bits in the invalid state counts the invalid state "0" from the bits at the right side until the first valid state "1" appears in the intermediate data 6-1-1 through 6-8-1 expressed "10010000" in binary, and produces the obtained value "4" in decimal as the signal 50-1 for the number of bits in the invalid state.

The minimum value selecting means 51 compares the signals 50-0 and 50-1 for the number of bits in the invalid state supplied from the counting means 49-0 and 49-1 for the number of bits in the invalid state, respectively, and produces the lowest value "3" expressed in decimal as the minimum value signal 52 into the comparison means 53-0 and 53-1.

The comparison means 53-0 compares the corresponding value "3", expressed in decimal, of signal 50-0 for the number of bits in the invalid state and the value "3", expressed in decimal, of the minimum value signal 52, and produces the valid state to the valid search signal 45-0 since the two signals match each other. The comparison means 53-1 compares the corresponding value "4", expressed in decimal, of signal 50-1 for the number of bits in the invalid state and the value "3", expressed in decimal, of the minimum value signal 52, and produces the invalid state to the valid search signal 45-1 since the two signals do not match. As a result, it is found that the correct value is obtained as the valid search signal 45-0 and 45-1. This is because the symbol "*" represents "don't care" for the bits of structured data with the corresponding bit of storage data put in the invalid state and the corresponding bit of mask information (data) put in the valid state in the associative memories 204-0 through 204-$r$, so that the optimum search operation is performed by only the associative memory 204-$k$ producing the intermediate data 6-1-$k$ through 6-$n$-$k$ that will be the minimum value when the number of bits in the invalid state for the intermediate data expressed from the lowest hierarchical unit to the top hierarchical unit of network address is counted until the first bit in the valid state appears in the intermediate data.

In the associative memory system 206 shown in FIG. 11, when the associative memory 204-$k$ is incorporated with the counting means 49-$k$ for the number of bits in the invalid state corresponding to the associative memory 204-$k$ the number of long lines and terminals for the associative memory 204 can be reduced as follows.

When the output data of the counting means for the number of bits in the invalid is encoded to the binary data only for the p-th signal 50-$k$ for the number of bits in the invalid state, excepting the long match lines (3-0-0 through 3-$s$-0) through (3-0-$r$ through 3-$s$-$r$) to connect the components for the associative memory system 206, the number of these lines is p×[1+log 2 n] ([ ]: Gauss). The associative memory 204-$k$ requires only the terminals to produce the signal 50-$k$ for the number of bits in the invalid state, excepting the search data and the match lines 3-0-$k$ through 3-$s$-$k$. For example, when constructing the associative memory system 206 by using the four 64-bit associative memories 1-0 through 1-3, the number of lines is 7 to represent "0" to "64" in decimal for the number of bits in the signal 50 for the number of bits in the invalid state, and the total number of lines above-mentioned between the associative memories is 28. The necessary number of terminals above-mentioned for the associative memory 204-$k$ is 7.

The associative memory system 205 shown in FIG. 9 is provided with the n×p lines to enable the first through p-th associative memories 204-0 through 204-$r$ to produce the n-bit intermediate data (6-1-0 through 6-$n$-0) through (6-1-$r$ through 6-$n$-$r$), respectively, into the intermediate data determination section 41. Therefore, the associative memory system 205 is provided with the n×p lines between the associative memories 204-0 through 204-$r$, excepting the match lines (3-0-0 through 3-$s$-0) through (3-0-$r$ through 3-$s$-$r$).

The associative memory 204-$k$ requires the first through n-th terminals to produce the n-bit intermediate data 6-1-$k$ through 6-$n$-$k$, excepting the search data and the match lines 3-0-$k$ through 3-$s$-$k$. For example, when constructing the associative memory system 205 shown in FIG. 9 by using the four 64-bit associative memories 204-0 through 204-3, the total number of lines above-mentioned between the associative memories is 256, and the necessary number of terminals above-mentioned for the associative memory 204-$k$ is 64.

In the associative memory system 206 shown in FIG. 11, therefore, when the associative memory 204-$k$ is incorporated with the counting means 49-$k$ for the number of bits in the invalid state corresponding to the associative memory 204-$k$, the number of long lines and terminals for the associative memory 204 can be greatly reduced rather than the associative memory system 205 shown in FIG. 9. The area of associative memory 204 is extremely large, so that the lines between associative memories become extremely long. As a result, the associative memory system 206 in this example can reduce the consumable electrical power due to the signal delay time and wiring electrical capacity in comparison with the associative memory system 205 shown in FIG. 9. Further, the area of associative memories can be made smaller by reducing the wiring area. The great reduction of the number of terminals required for the associative memories can also make smaller the area of the associative memory 206.

This example of the associative memory 204-$k$ is described for the primary searching associative memory 4-$k$ and the secondary searching associative memory 5-$k$ to be used for the primary search and the secondary search, respectively. Here, it is needless to say that the associative memory system 206 can be constructed completely as well as the case that one associative memory carries out the primary search and the secondary search by sharing the components.

In this example, the counting means 49-$k$ for the number of bits in the invalid state counts the number of bits in the invalid state for the intermediate data expressed from the lowest hierarchical unit to the top hierarchical unit of network address in the intermediate data 6-1-$k$ through 6-$n$-$k$ until the first bit in the valid state appears in the intermediate data in order to reduce the circuit scale. However, it is evident that counting may be done simply for the number of all bits in the invalid state in the intermediate data 6-1-$k$ through 6-$n$-$k$.

The System in the Fifth Embodiment of Invention

Figure 12:
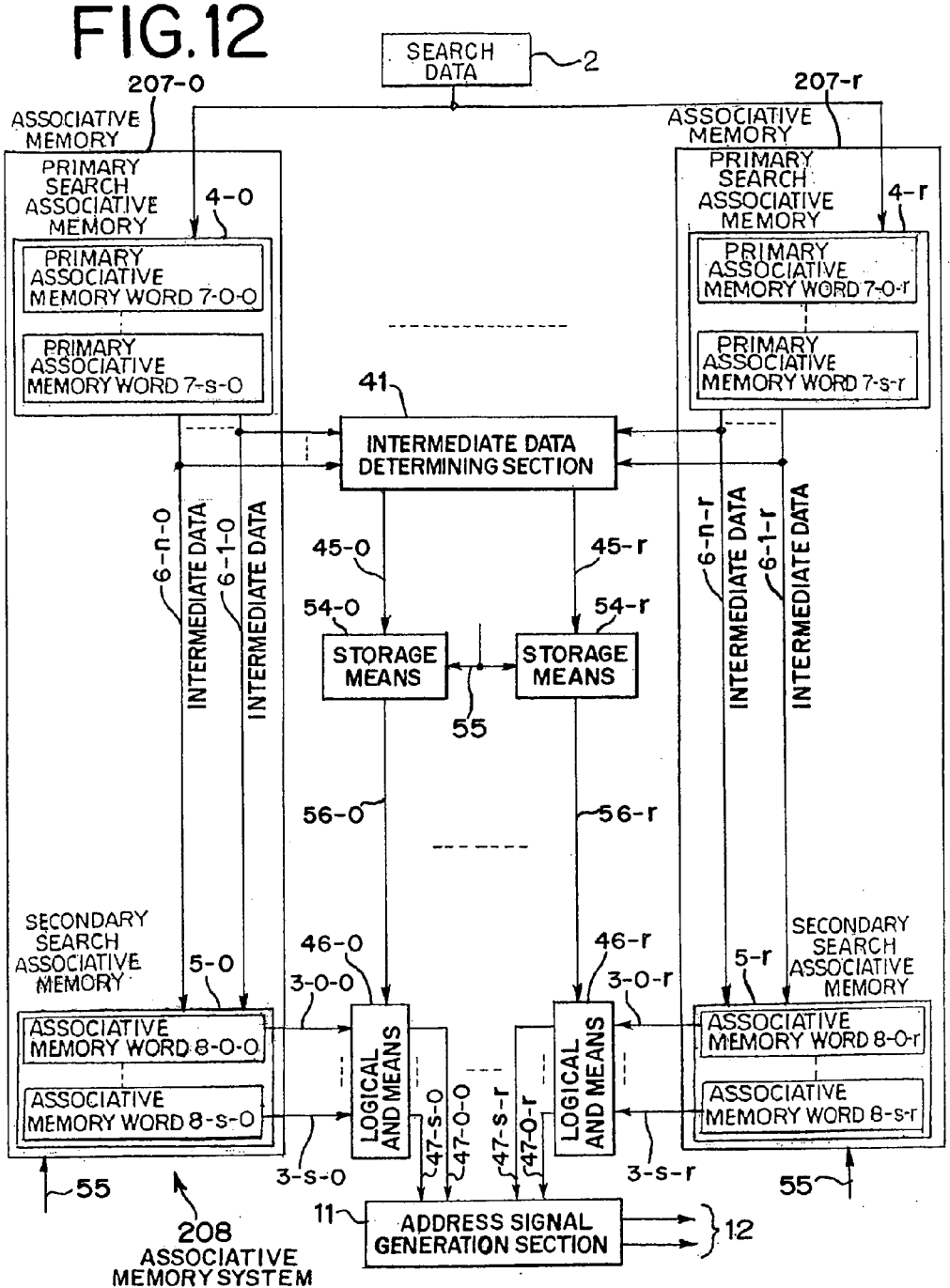
FIG. 12 is a block diagram of the associative memory system according to the fifth embodiment of this invention.

Now, description will be made in details about the associative memory system according to the fifth embodiment of this invention with reference to the figures. FIG. 12 is a block diagram of the associative memory system 208 using n-bit (m×p) words according to the fifth embodiment of this invention.

The associative memory system 208 comprises the first through p-th n-bit m-word associative memories 207-0 through 207-$r$, the first through p-th logical AND means 46-0 46-$r$, the intermediate data determination section 41, the address signal producing section 11 and the first through p-th memory circuits 54-0 through 54-$r$, and enters n-bit search data 2 and clock signal 55, and produces the address output signal 12.

In comparison with the associative memory system 205 according to the forth embodiment of this invention shown in FIG. 9, the different matters are only that the clock signal 55 is entered into the associative memories 207-0 through 207-$r$, the memory circuits 54-0 through 54-$r$ are supplied to produce the clock signal 55 between the intermediate data determination section 41 and logical AND means 46-0 through 46-$r$, and the input signals of logical AND means 46-0 through 46-$r$ are replaced with the synchronized valid search signals 56-0 through 56-$r$ supplied from the memory circuits 54-0 through 54-$r$ in the associative memory system 208 according to the fifth embodiment of this invention shown in FIG. 12. Hereunder, only the different parts or contents will be described.

In the associative memory system 208 according to the fifth embodiment of this invention, it requires the time of α-clock (α: an integer of more than 1) with the clock signal 55 until the secondary searching associative memory 5-$k$ puts the match lines 3-0-*k* through 3-*s*-*k* into the valid state after the primary searching associative memory 4-*k* of the associate memory 207-*k* (k: an integer of more than 0 (zero) and less than "r") produces the intermediate data 6-1-*k* through 6-*n*-*k*. Therefore, the memory circuit 54-*k* produces the synchronized valid search signal 56-*k* that delays the valid search signal 45-*k* by the time of α-clock with the clock signal, and synchronizes the timing of input to the logical AND means 46-*k* with the match lines 3-0-*k* through 3-*s*-*k*. Herein, it is needless to say that the position of installing the memory circuit 54-*k* is not limited at the position shown in FIG. 12 and the associative memory system 208 can be constructed even by installing the memory circuit 54-*k* at any position from the output terminals of intermediate data 6-1-*k* through 6-*n*-*k* of the primary searching associative memory 207-*k* to the input terminals of logical AND means 46-*k*. At this time, it is needless to say that the memory means can be installed at several positions dispersed when the value α is an integer of more than 2.

As a result, constructing a pipeline can boost the frequency of the clock signal.

It is also needless to say that the delay means may be installed instead of the memory means in order to synchronize the timing of input to the logical AND means 46-*k* with the match lines 3-0-*k* through 3-*s*-*k*.

It is also needless to say that FIG. 12 shows an example of the associative memory system 208 by means of the intermediate data determination section 41 and the address signal producing section 11 as well as in FIG. 9, but the same system can be constructed by using the second system of intermediate data determination section 48 shown in FIG. 11 or by using the address signal producing section 25 shown in FIG. 3.

This example of the associative memory 207-*k* is described for the primary searching associative memory 4-*k* and the secondary searching associative memory 5-*k* to be used for the primary search and the secondary search, respectively. Here, it is needless to say that the associative memory system 208 can be constructed completely as well as the case that one associative memory carries out the primary search and the secondary search by sharing the components.

In addition, it is evident that the area can be reduced by using a part of the components as the same purpose for both the primary searching associative memory and the corresponding secondary searching associative memory in the associative memory system according to the first through fifth embodiments of this invention described above. For example, it is possible to use a part of the components since the same value is stored into both the means to store the memory data in the i-th primary associative memory word and the means to store the secondary memory data in the corresponding associative memory word of the corresponding secondary searching associative memory.

The System in the Sixth Embodiment of Invention

Now, description will be made in details about the associative memory system according to the sixth embodiment of this invention with reference to the figures. In the sixth embodiment of this invention, when a plurality of words coincident with all storage data corresponding to the input data are found in the search operation taking the mask information into account, for the search data consisting of the plural number of partial search state, a signal to distinguish the least number of words is produced after comparing, among the coincident words, the number of bits of mask information (data) put in the valid state comprising the structured data every search digits in consideration of priority in order. For example, this associative memory system is the case that a plurality of the associative memories, described in the International Patent Application No. PCT/JP01/03562, are connected.

Figure 13:
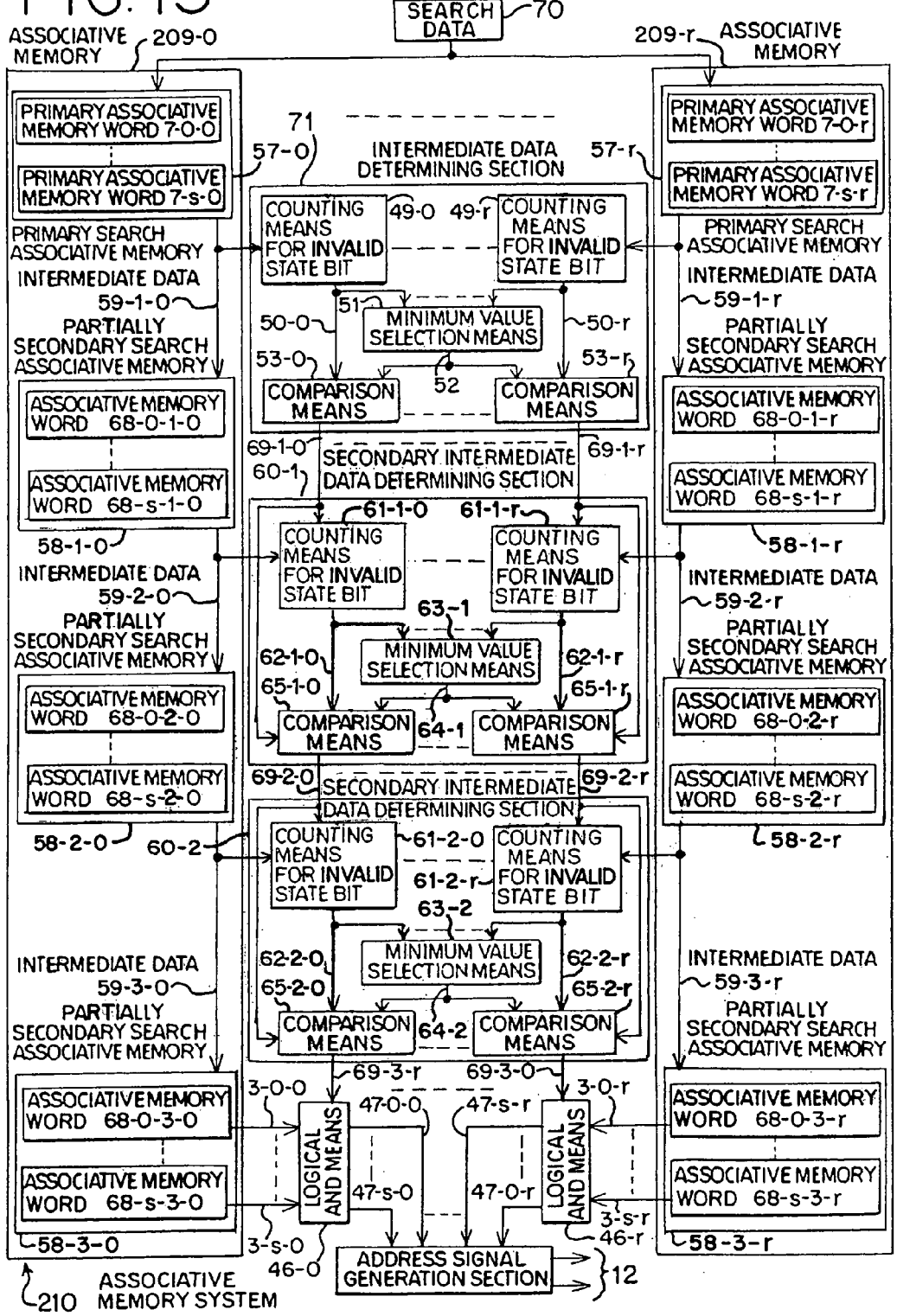
FIG. 13 is a block diagram of the associative memory system according to the sixth embodiment of this invention.

FIG. 13 is a block diagram of the associative memory system 210 using n-bit (m×p) words according to the sixth embodiment of this invention. The associative memory system 210 comprises the first through p-th n-bit m-word associative memories 209-0 through 209-*r* to enter the search data 70 consisting of the first through q-th partial search state, the first through p-th logical AND means 46-0 46-*r*, the intermediate data determination section 71, the first through (q−1)-th secondary intermediate data determination section 60-1 through 60-*h* (h: an integer of more than 1 and less than "t") and the address signal producing section 11 to supply the address signal 12. The k-th associative memory 209-*k* comprises the primary searching associative memory 57-*k* and the first through q-th partial secondary searching associative memories 58-1-*k* through 58-*q*-*k* to carry out the secondary search every digits corresponding to the the first through q-th partial search state of search data 70.

FIG. 13 is a block diagram of the associative memory system 210 showing an example of the search data 70 consisting of 3-piece partial search state. Of course, it is needless to say that the search data 70 can be constructed even with any number of partial search state.

The primary searching associative memory 57-*k* is provided with the primary associative memory words 7-0-*k* through 7-*s*-*k* that can store m-piece structured data consisting of the n-bit storage data and mask information (data) to search all the partial search state of search data 70. Hereupon, the symbol "*" represents "don't care" for the bits of structured data with the corresponding bit of storage data put in the invalid state and the corresponding bit of mask information (data) put in the valid state. The primary searching associative memory 57-*k* carries out the primary search for the storage data coincident with all the partial search state of the search data 70 taking the mask information into account, among the primary associative memory words 7-0-*k* through 7-*s*-*k*, performs the logical sum operation for the coincident storage data in the confirmed valid state, and produces only the bit unit corresponding to the partial search state having the first priority in order of search data in the calculated values as the intermediate data 59-1-*k*, into the intermediate data determination section 71 and the partial secondary searching associative memory 58-1-*k*. In other words, excepting the production of intermediate data 59-1-*k* from only the bit unit corresponding to the partial search state having the first priority in order of search data, the primary searching associative memory 57-*k* can be constructed as well as the conventional primary searching associative memory 302 shown in FIG. 26.

The h-th (h: an integer of more than 1 and less than "t") partial secondary searching associative memory 58-*h*-*k* is provided with the associative memory words 68-0-*h*-*k* through 68-*s*-*h*-*k*, and the same value as the storage data stored in the corresponding primary associative memory word 7-*i*-*k* is stored as the h-th secondary storage data into the i-th (i: an integer of more than 0 (zero) and less than "m") associative memory word 68-*i*-*h*-*k*. The partial secondary searching associative memory 58-*h*-*k* compares the search data with only the bit digits corresponding to the partial search state of the h-th priority in order among the h-th secondary storage data stored in the associative memory words 68-0-*h***-*k* through 68-*s*-*h*-*k*, with the intermediate data 59-*h*-*k*, performs the logical sum operation for the coincident h-th secondary storage data in the confirmed valid state, and produces as the intermediate data 59-(*h*+1)-k only the bit digits corresponding to the partial search state of the (h+1)th priority in order for the search data among the obtained values, into the secondary intermediate data determination section 60-***h* and the partial secondary searching associative memory 58-(*h*+1)-k. In other words, excepting the second search of only the bit digits corresponding to the partial search state of the h-th priority in order among the h-th secondary storage data and the addition of function to produce the intermediate data **59-*h*-*k* from only the bit digits corresponding to the partial search state of the (h+1)th priority in order for the search data, the system can be constructed as well as the conventional secondary searching memory 303 shown in FIG. 26**.

It is needless to say that only the same value as the bit digits corresponding to the partial search state of the h-th and (h+1)-th priorities in order for the search data stored in the corresponding primary memory word **7-*i*-*k* of may be stored as the h-th storage data in the i-th (i: an integer of more than 0 (zero) and less than "m") associative memory word 68-*i*-*h*-*k***.

The q-th partial secondary searching associative memory **59-*q*-*k* is provided with the associative memory words 68-0-*q*-*k* through 68-*s*-*q*-*k*, and the same value as the storage data stored in the corresponding primary associative memory word 7-*i*-*k* is stored as the q-th secondary storage data into the i-th (i: an integer of more than 0 (zero) and less than "m") associative memory word 68-*i*-*q*-*k*. The partial secondary searching associative memory 58-*q*-*k* compares the search data with only the bit digits corresponding to the partial search state of the q-th priority in order among the q-th secondary storage data stored in the associative memory words 68-0-*q*-*k* through 68-*s*-*q*-*k*, with the intermediate data 59-*q*-*k*, and produces the valid order state of match line to the match lines 3-O-k through 3-*s*-k corresponding to the coincident q-th secondary storage data. In other words, excepting the second search of only the bit digits corresponding to the partial search state of the q-th priority in order among the q-th secondary storage data, the system can be constructed as well as the conventional secondary searching memory 303 shown in FIG. 26**.

It is needless to say that only the same value as the bit digits corresponding to the partial search state of the q-th priority in order for the search data stored in the corresponding primary memory word **7-*i*-*k* of may be stored as the q-th storage data in the i-th (i: an integer of more than 0 (zero) and less than "m") associative memory word 68-*i*-*q*-*k***.

In comparison with the intermediate data determination section 48 shown in FIG. 11, the intermediate data determination section 71 can be constructed as well as the intermediate data determination section 48 shown in FIG. 11, excepting the replacement of signals supplied from the associate memories 209-0 through **209-*r* with the intermediate data 59-1-0 through 59-1-*r*. It is needless to say that the intermediate data determination section 71 can be also constructed by performing the above-mentioned adjustment for the intermediate data determination section 41 shown in FIG. 9. At this time, it is needless to say that the intermediate data determination section 71 can be constructed by using the intermediate data arithmetic section 42 shown in FIG. 9, the intermediate data arithmetic section 9 shown in FIG. 1, the intermediate data arithmetic section 26 shown in FIG. 4, the intermediate data arithmetic section shown in FIG. 6, or other logically equivalent means. The intermediate data determination section 71 produces the valid state to the valid search signals 69-1-0 through 69-1-*r* corresponding to the intermediate data with the least number of bits in invalid state among the first through p-th intermediate data (59-1-0 through 59-1-*r*) supplied from the first through p-th associative memories 204-0 through 204-*r***.

When comparing the secondary intermediate data determination section 60-*h* (h: an integer of more than 1 and less than "t") with the intermediate data determination section 48 shown in FIG. 11, the different matters are only that the signals supplied from the associative memories 209-0 through **209-*r* are replaced with the intermediate data 59-(*h*+1)-0 through 59(*h*+1)-r and the valid search signals 69-*h*-0 through 69-*h*-*r* are entered into the corresponding counting means 61-*h*-0 through 61-*h*-*r* for the number of bits in the invalid state and the comparison means 65-*h*-0 through 65-*h*-*r***, respectively.

The k-th counting means **61-*h*-*k* for the number of bits in the invalid state, as well as the counting means 49-*k* for the number of bits in the invalid state shown in FIG. 11 when the corresponding valid search signal 69-*h*-*k* is in the valid state, produces the values obtained after counting the number of bits in the invalid state for the intermediate data expressed from the lowest hierarchical unit to the top hierarchical unit of network address among the corresponding intermediate data 59-(*h*+1)-k until the first bit in the valid state appears in the intermediate data, into the signal 62-*h*-*k*** for the number of bits in the invalid state.

Otherwise, when the corresponding valid search signal **69-*h*-*k* is in the invalid state, the the k-th counting means 61-*h*-*k* for the number of bits in the invalid state produces the same values as the number of bits in the intermediate data 59-(*h*+1)-k corresponding to the signal 62-*h*-*k*** for the number of bits in the invalid state.

The minimum value selecting means **63-*h* compares the signals 62-*h*-0 through 62-*h*-*r* for the number of bits in the invalid state supplied from the counting means 61-*h*-0 through 61-*h*-*r* for the number of bits in the invalid state, respectively, and produces the lowest value as the minimum value signal 64-*h* into the comparison means 65-*h*-0 through 65-*h*-*r***.

The k-th comparison means **65-*h*-*k* produces the valid state into the corresponding valid search signal 69-(*h*+1)-k only when the valid search signal 69-*h*-*k* is in the valid state and the corresponding signal 62-*h*-*k* for the number of bits in the invalid state is coincident with the minimum value signal 64-*h* in comparison. Otherwise, the k-th comparison means 65-*h*-*k* produces the invalid state into the corresponding valid search signal 69-(*h*+1)-k**.

Herewith, the secondary intermediate data determination section 60-*h* produces the valid state into only the valid search signal 69-(*h*+1)-0 through 69-(*h*+1)-r corresponding to the intermediate data with the least number of bits in invalid state when the corresponding valid search signal **69-*h*-*k* is compared with only the signals in valid state among the first through p-th intermediate data 59-(*h*+1)-0 through 59-(*h*+1)-r supplied from the first through p-th associative memories 209-0 through 209-*r***.

The logical AND means 46-0 through **46-*r* can be constructed completely as well as the logical AND means 46-0 through 46-*r* shown in FIG. 9, excepting the introduction of valid search signal 69-*q*-0 through 69-*q*-*r* for the input operation. And also, the address signal producing section 11 can be constructed completely as well as the address signal producing section 11 shown in FIG. 1, excepting the replacement of the match lines 3-0-0 through 3-*s-r* with the active match lines 47-0-0 through 47-*s-r* for the input operation. Of course, it is needless to say that the address signal producing section 11 can be constructed by using the address signal producing section 25 shown in FIG. 3**.

In this example, the counting means 49-0 through **49-*r* and the counting means 61-*h*-0 through 61-*h*-*r*** for the number of bits in the invalid state counts the number of bits in the invalid state for the intermediate data expressed from the lowest hierarchical unit to the top hierarchical unit of network address in the corresponding intermediate data until the first bit in the valid state appears in the intermediate data in order to reduce the circuit scale.

However, it is evident that counting may be done simply for the number of all bits in the invalid state in the intermediate data.

The Operation in the Sixth Embodiment of Invention

Figure 14:
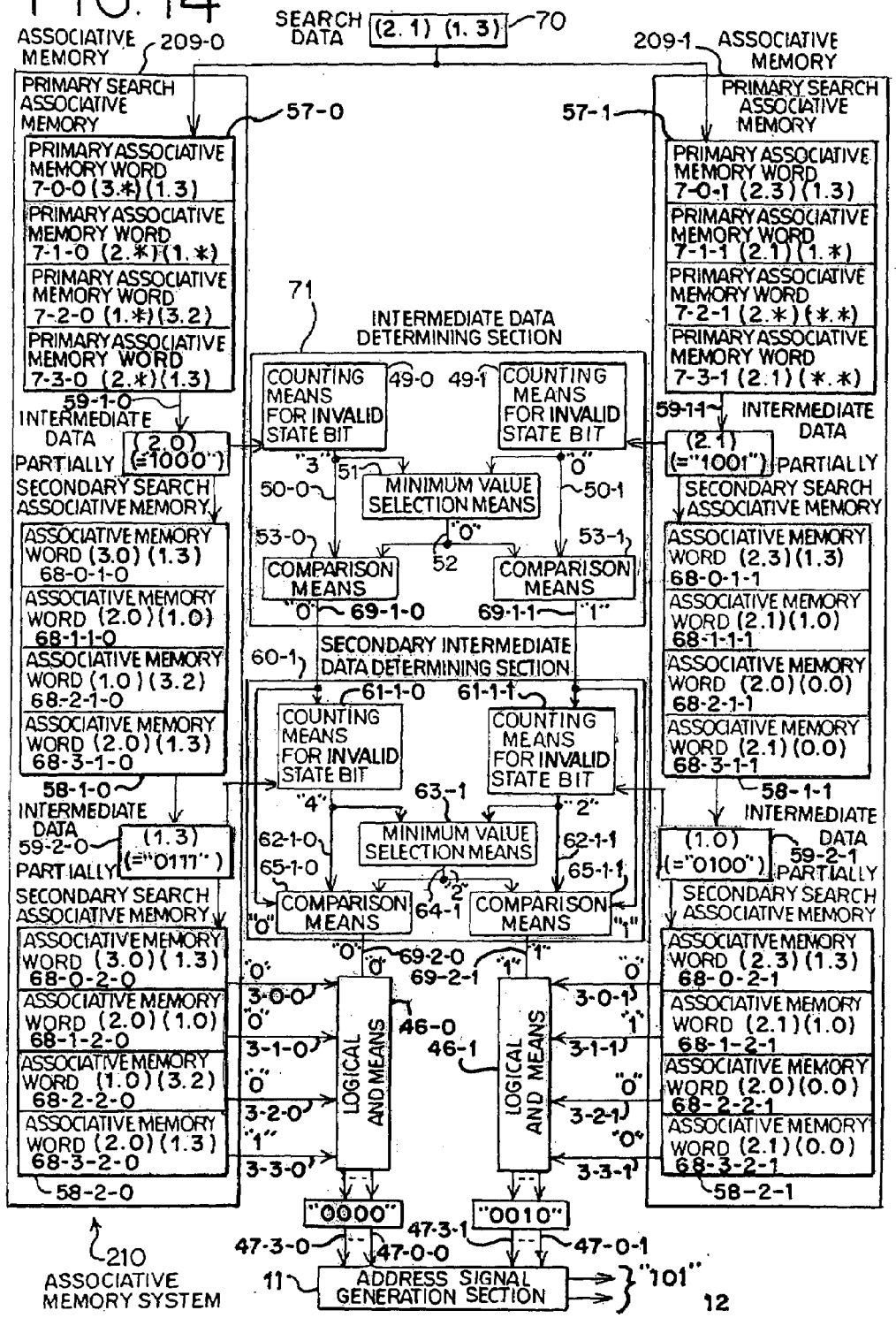
FIG. 14 is a view for describing an operation of the associative memory system according to the sixth embodiment of this invention.

Next referring to FIG. 14, description will be mad about the operation of associative memory system 210 according to the sixth embodiment of this invention when the associative memories 209-0 and 209-1 comprising four words of eight bits are connected to enter the 8-bit search data 70 comprising two partial search states of in-quaternary (2, 1) having the first priority in order and (1, 3) having the second priority in order and the structured data is stored into the primary associative memory words 7-0-0 through 7-3-1 without putting data into order at random. It is assumed here that the associative memory 209-1 reserves the top addresses in the address space of eight words in total as well as in FIG. 1.

In this example, as well as in FIG. 1, description will be made with the mask valid state "0" and invalid state "1" and also with the storage data valid state "1" and invalid state "0", respectively. In addition, description will be made with the intermediate data 59 valid state "1" and invalid state "0" and also with the match line 3 valid state "1" and invalid state "0", respectively, as well as the storage data.

It is assumed here that the primary associative memory words 7-0-0 through 7-3-0, four words, of the primary searching associative memory 57-0 store the storage data and mask information (data) so as to represent (3, *, 1, 3), (2, *, 1, *), (1, *, 3, 2) and (2, *, 1, 3), expressed in quaternary, as the structured data, respectively. It is assumed here that the primary associative memory words 7-0-1 through 7-3-1, four words, of the primary searching associative memory 57-1 store the storage data and mask information (data) so as to represent (2, 3, 1, 3), (2, 1, 1, *), (2, *, *, *) and (2, 1, *, *), expressed in quaternary, as the structured data, respectively. As well as the conventional primary search associative memory 302 described in FIG. 23, the valid state "0" of mask information (data) is stored into the corresponding bit of mask information (data) and the invalid state "0" of storage data is stored into the corresponding bit of storage data, respectively, to represent the "don't care" state with the symbol "*". In other words, the storage data (3, 0, 1, 3), (2, 0, 1, 0), (1, 0, 3, 2) and (2, 0, 1, 3), expressed in quaternary, are stored into the primary associative memory words 7-0-0 through 7-3-0, respectively, and the mask information (3, 0, 3, 3), (3, 0, 3, 0), (3, 0, 3, 3) and (3, 0, 3, 3), expressed in quaternary, are stored respectively.

The storage data (2, 3, 1, 3), (2, 1, 1, 0), (2, 0, 0, 0) and (2, 1, 0, 0), expressed in quaternary, are stored into the primary associative memory words 7-0-1 through 7-3-1, respectively, and the mask information (3, 3, 3, 3), (3, 3, 3, 0), (3, 0, 0, 0) and (3, 3, 0, 0), expressed in quaternary, are stored respectively. The top 4-bit state of storage data and mask information (data) corresponds to the partial search state of search data 70 with the first priority in order, and the low 4-bit state of storage data and mask information (data) corresponds to the partial search state of search data 70 with the second priority in order.

The associative memory words **68-*i*-1-0 (i: an integer of more than 0 (zero) and less than 3) of the partial secondary searching associative memory 58-1-0 and the associative memory words 68-*i*-2-0 of the partial secondary searching associative memory 58-2-0 store as the first secondary storage data and the second secondary storage data, respectively, the same values (3, 0, 1, 3), (2, 0, 1, 0), (1, 0, 3, 2) and (2, 0, 1, 3), expressed in quaternary, as the storage data stored in the primary associative memory words 7-*i*-0 corresponding to the primary searching associative memory 57-0**.

The associative memory words **68-*i*-1-1 (i: an integer of more than 0 (zero) and less than 3) of the partial secondary searching associative memory 58-1-1 and the associative memory words 68-*i*-2-1 of the partial secondary searching associative memory 58-2-1 store as the first secondary storage data and the second secondary storage data, respectively, the same values (2, 3, 1, 3), (2, 1, 1, 0), (2, 0, 0, 0) and (2, 1, 0, 0), expressed in quaternary, as the storage data stored in the primary associative memory words 7-*i*-*i* corresponding to the primary searching associative memory 57-1**.

Next, the description will proceed to the operation of associative memories 209-0 and 209-1 on entering the search data 70 of (2, 1, 1, 3), expressed in quaternary. In the associative memory 209-0, at the first, the primary searching associative memory 57-0 carries out the primary search for the storage data coincident with the search data 70 taking the mask information into account, and as a result, the structured data (2, *, 1, *) and (2, *, 1, 3) in quaternary stored in the primary associative memory words 7-1-0 and 7-3-0, respectively, are coincident with the search data 70. The primary searching associative memory 57-0 performs the logical sum operation for the in-quaternary storage data (2, 0) and (2, 0), the state corresponding to the partial search state of search data 70 with the first priority in order, stored in the primary associative memory words 7-1-0 and 7-3-0, respectively, with the storage data confirmed in the valid state, and produces the calculated 4-bit state of (2, 0) expressed in quaternary and "1000" expressed in binary as the intermediate data 59-1-0, into the intermediate data determination section 71 and the partial secondary searching associative memory 58-1-0. In the associative memory 209-1 as well as the associative memory 209-0, at the first, the primary searching associative memory 57-1 carries out the primary search for the storage data coincident with the search data 70 and all bits taking the mask information into account, and as a result, the structured data (2, 1, 1, *), (2, *, *, *) and (2, 1, *, *) in quaternary stored in the primary associative memory word 7-1-1, 7-2-1 and 7-3-1 is coincident with the search data 70. The primary searching associative memory 57-1 performs the logical sum operation for the in-quaternary storage data (2, 1), (2, 0) and (2, 1), the state corresponding to the partial search state of search data 70 with the first priority in order, stored in the primary associative memory words 7-1-1, 7-2-1 and 7-3-1, respectively, with the storage data confirmed in the valid state, and produces the calculated 4-bit state of (2, 1) expressed in quaternary and "1001" expressed in binary as the intermediate data 59-1-1, into the intermediate data determination section 71 and the partial secondary searching associative memory 58-1-1.

The partial secondary searching associative memory 58-1-0 carries out the secondary search operation to compare the intermediate data 59-1-0 of (2, 0), expressed in quaternary, with only the bit state corresponding to the partial search state of search data 70 with the first priority in order among the first secondary storage data stored in the associative memory words 68-0-1-0 through 68-3-1-0, and as a result, the associative memory words 68-1-1-0 and 68-3-1-0 are coincident with the intermediate data. The partial secondary searching associative memory 58-1-0 performs the logical sum operation for the in-quaternary storage data (1, 0) and (1, 3), the state corresponding to the partial search state of search data 70 with the second priority in order in the first secondary storage data, stored in the coincident associative memory words 68-1-1-0 and 68-3-1-0, respectively, with the storage data confirmed in the valid state, and produces the calculated 4-bit state of (1, 3) expressed in quaternary and "0111" expressed in binary as the intermediate data 59-2-0, into the secondary intermediate data determination section 60-1 and the partial secondary searching associative memory 58-2-0. Similarly, the partial secondary searching associative memory 58-1-1 carries out the secondary search operation to compare the intermediate data 59-1-1 of (2, 1), expressed in quaternary, with only the bit state corresponding to the partial search state of search data 70 with the first priority in order among the first secondary storage data stored in the associative memory words 68-0-1-1 through 68-3-1-1, and as a result, the associative memory words 68-1-1-1 and 68-3-1-1 are coincident with the intermediate data. The partial secondary searching associative memory 58-1-1 performs the logical sum operation for the in-quaternary storage data (1, 0) and (0, 0), the state corresponding to the partial search state of search data 70 with the second priority in order in the first secondary storage data, stored in the coincident associative memory words 68-1-1-1 and 68-3-1-1, respectively, with the storage data confirmed in the valid state, and produces the calculated 4-bit state of (1, 0) expressed in quaternary and "0100" expressed in binary as the intermediate data 59-2-1, into the secondary intermediate data determination section 60-1 and the partial secondary searching associative memory 58-2-1.

The partial secondary searching associative memory 58-2-0 carries out the secondary search operation to compare the intermediate data 59-2-0 of (1, 3), expressed in quaternary, with only the bit state corresponding to the partial search state of search data 70 with the second priority in order among the second secondary storage data stored in the associative memory words 68-0-2-0 through 68-3-2-0, and as a result, the associative memory word 68-3-2-0 is coincident with the intermediate data. The partial secondary searching associative memory 58-2-0 supplies the valid state of match line to the match line 3-3-0 corresponding to the coincident associative memory word 68-3-2-0, and the invalid state to other match lines. The partial secondary searching associative memory 58-2-1 carries out the secondary search operation to compare the intermediate data 59-2-1 of (1, 0), expressed in quaternary, with only the bit state corresponding to the partial search state of search data 70 with the second priority in order among the second secondary storage data stored in the associative memory words 68-0-2-1 through 68-3-2-1, and as a result, the associative memory word 68-1-2-1 is coincident with the intermediate data. The partial secondary searching associative memory 58-2-1 supplies the valid state of match line to the match line 3-1-1 corresponding to the coincident associative memory word 68-1-2-1, and the invalid state to other match lines.

The counting means 49-0 for the number of bits in the invalid state, which is included in the intermediate data determination section 71, counts the invalid state "0" from the bits at the right side until the first valid state "1" appears in the intermediate data 59-1-0 of "1000" expressed in binary, and produces the obtained value "3" in decimal as the signal 50-0 for the number of bits in the invalid state. The counting means 49-1 for the number of bits in the invalid state counts the invalid state "0" from the bits at the right side until the first valid state "1" appears in the intermediate data 59-1-1 of "1001" expressed in binary, and produces the obtained value "0" in decimal as the signal 50-1 for the number of bits in the invalid state. The minimum value selecting means 51 compares the signals 50-0 and 50-1 for the number of bits in the invalid state supplied from the counting means 49-0 and 49-1 for the number of bits in the invalid state, respectively, and produces the lowest value "0" expressed in decimal as the minimum value signal 52 into the comparison means 53-0 and 53-1. The comparison means 53-0 compares the corresponding value "3", expressed in decimal, of signal 50-0 for the number of bits in the invalid state and the value "0", expressed in decimal, of the minimum value signal 52, and produces the invalid state to the valid search signal 69-1-0 since the two signals do not match. The comparison means 53-1 compares the corresponding value "0", expressed in decimal, of signal 50-1 for the number of bits in the invalid state and the value "0", expressed in decimal, of the minimum value signal 52, and produces the valid state to the valid search signal 69-1-1 since the two signals match each other.

The counting means 61-1-0 for the number of bits in the invalid state, which is included in the secondary intermediate data determination section 60-1, counts the invalid state "0" from the bits at the right side until the first valid state "1" appears in the intermediate data 59-2-0 of "0111" expressed in binary, and as a result, the value "0" expressed in decimal is obtained. At this time, since the corresponding valid search signal 69-1-0 is in the invalid state, the counting means 61-1-0 for the number of bits in the invalid state produces not the counted value "0", expressed in decimal, but the value "4", expressed in decimal, of bit number of counted intermediate data 59-2-0 as the signal 62-1-0 for the number of bits in the invalid state. The counting means 61-1-1 for the number of bits in the invalid state counts the invalid state "0" from the bits at the right side until the first valid state "1" appears in the intermediate data 59-2-1 of "0100" expressed in binary, and as a result, the value "2" expressed in decimal is obtained. At this time, since the corresponding valid search signal 69-1-1 is in the valid state, the counting means 61-1-1 for the number of bits in the invalid state produces the counted value "2", expressed in decimal, as the signal 62-1-1 for the number of bits in the invalid state. The minimum value selecting means 63-1 compares the signals 62-1-0 and 62-1-1 for the number of bits in the invalid state supplied from the counting means 61-1-0 and 61-1-1 for the number of bits in the invalid state, respectively, and produces the lowest value "2" expressed in decimal as the minimum value signal 64-1 into the comparison means 65-1-0 and 65-1-1.

The comparison means 65-1-0 supplies the invalid sate to the valid search signal 69-2-0 since the valid search signal 69-1-0 is in the invalid state. Since the valid search signal

69-1-0 is in the valid state, the comparison means 65-1-1 compares the corresponding value "2", expressed in decimal, of signal 62-1-1 for the number of bits in the invalid state and the value "2", expressed in decimal, of the minimum value signal 64-1, and supplies the valid state to the valid search signal 69-2-1 since the two signals match each other. When the optimum data is determined only between the intermediate data 59-2-0 and 59-2-1 according to the partial bit state of search data 70 with the second priority in order, the intermediate data 59-2-0 supplied from the associative memory 209-0 is selected as the optimum data, but the associative memory 209-0 has been already determined to be invalid by the intermediate data determination section 71, so that the intermediate data 59-2-0 is excepted from the determination of optimum data.

The logical AND means 46-0 produces the invalid state of match line to all the active match lines 47-0-0 through 47-3-0 since the corresponding valid search signal 69-2-0 is put in the invalid state. Therefore, the active match lines 47-0-0 through 47-3-0 becomes "0000" in binary. The logical AND means 46-1 produces the value "0010", expressed in binary, of the match lines 3-0-1 through 3-3-1 supplied from the associative memory 209-1 to the active match lines 47-0-1 through 47-3-1 since the corresponding valid search signal 69-2-1 is put in the valid state.

Therefore, only the active match line 47-1-1 is put in the valid state among the signals entered into the address signal producing section 11 that produces the value "101", expressed in binary, as the address output signal 12. In an example of system in FIG. 14, it is evident that the mask information (data) with the minimum number of bits in the valid state among the coincident structured data corresponding to the search data 70 provided with the partial search state of (2, 1), expressed in quaternary, with the first priority in order and the partial search state of (1, 3), expressed in quaternary, with the second priority in order is the in-quaternary (2, 1, 1, *) stored in the primary associative memory word 7-1-1 of the associative memory 209-1. Therefore, it is found that the address signal producing section 11 supplies the correct address output signal 12.

In an example of operation in the associative memory 209-$k$, only when the structured data stored in the associative memory 209-$k$ is finally kept optimum by means of the logical AND means 46-$k$ while carrying out the partial secondary search operation by the partial secondary searching associative memory 58-1-$k$ to enter the intermediate data 59-1-$k$ and determining how optimum is the structured data stored in the associative memory 209-$k$ by the intermediate data determination section 71 at the same time, or while carrying out the partial secondary search operation by the partial secondary searching associative memory 58-($h$+1)-k to enter the intermediate data 59($h$+1)-k ($h$: an integer of more than 1 and less than "t") and determining how optimum is the structured data stored in the associative memory 209-$k$ by the secondary intermediate data determination section 60-$h$ at the same time, the whole associative memory system 210 is constructed to obtain the optimum address signal 12 by transferring the state of the match lines 3-0-$k$ through 3-$s$-$k$ supplied from the associative memory 209-$k$, into the address signal producing section Therefore, since the secondary search operation and the determination of intermediate data can be executed simultaneously, the whole associative memory system 210 is not made lower than the single associative memory 209 in the operation speed.

When the delay time is caused by the clock signal, which is not illustrated, from entering the intermediate data 59-$h$-$k$ into the partial secondary searching associative memory 58-$h$-$k$ to producing the intermediate data 59-($h$+1)-k, or when the delay time is caused by the clock signal, which is not illustrated, from entering the intermediate data 59-$q$-$k$ into the partial secondary searching associative memory 58-$q$-$k$ to producing data into the match line 3-0-$k$ through 3-$s$-$k$, it is evident that the memory means is timely supplied to enter the clock signal into the valid search signals 69-$h$-$k$ and 69-$q$-$k$ for synchronization.

In an example of system in FIG. 13, when one clock is required by the clock signal, which is not illustrated, from entering the intermediate data 59-1-$k$ to producing the intermediate data 59-2-$k$, or from entering the intermediate data 59-2-$k$ to producing data into the match line 3-0-$k$ through 3-3-$k$, the pipeline system can be realized by supplying one piece of memory means to delay one clock in the valid search signals 69-1-$k$ and 69-2-$k$ for synchronization. This construction allows the highest frequency of the clock signal in the associative memory system to be boosted greatly.

Of course, it is evident that the correct address output signal 12 can be obtained even by the other system without the intermediate data determination section 71, the secondary intermediate data determination sections 60-1 through 60-$q$ and the logical AND means 46-0 through 46-$r$, as well as the associative memory system 200 according to the first embodiment of this invention shown in FIG. 1, that the j-th optimized intermediate data obtained after the intermediate data 59-$j$-0 through 59-$j$-$r$ (j: an integer of more than 1 and less than "q") supplied from the associative memories 209-0 through 209-$r$ are entered into the j-th intermediate data operation section constructed as well as the intermediate data operation section 9 shown in FIG. 1, is supplied into the partial secondary searching associative memories 58-$j$-0 through 59-$j$-$r$, and the match lines 3-0-0 through 3-$s$-$r$ supplied from the associative memories 209-0 through 209-$r$ are directly entered into the address signal producing section 11. At this time, it is needless to say that the j-th intermediate data operation section can be constructed as well as the intermediate data operation section 26 shown in FIG. 4 or the intermediate data operation section 28 shown in FIG. 6. It is also evident that the j-th optimized intermediate data may be constructed to be produced by the logical wire connection as the associative memory system 203 according to the third embodiment of this invention shown in FIG. 8. The above-mentioned matters enable the circuit system to be simplified. In this case, it is needless to say that the partial secondary searching associative memories 58-$j$-0 through 58-$j$-$r$ may be constructed by one piece of associative memory using the (m×p) words. In addition, it is evident that the any pieces of associative memories using the (m×p) words in total can be used. In this example, it is needless to say that the counting means 61-$h$-$k$ for the number of bits in the invalid state supplies the number of bits of intermediate data 59-($h$+1)-k when the valid search signal 69-$h$-$k$ is put in the invalid state, but a value larger than the number of bits of intermediate data 59-($h$+1)-k may be produced. Herein, in the associative memory system 210 shown in FIG. 13, when the associative memory 209-$k$ is incorporated with the counting means 49-$k$ for the number of bits in the invalid state, corresponding to the associative memory 209-$k$, and the counting means 61-1-$k$ through 61-$h$-$k$ for the number of bits in the invalid state, the number of long lines can be extremely reduced and the number of terminals required for the associative memory 209 can be also extremely reduced as well as the description of associative memory system 206 in FIG. 11. Further, it can reduce the consumable electrical power due to the signal delay time and wiring electrical capacity. The area of associative memories can be made smaller by reducing the wiring area. The number of terminals in the associative memories is extremely reduced, so that the area of associative memories can be also made smaller. And also, it is evident that the secondary intermediate data determination section 60 in which all valid state is entered into the valid search signal 69 at the completion of the primary searching operation can be used instead of the intermediate data determination section 71.

[The Second System of Secondary Intermediate Data Determination Section]

Next, an example of the second system of secondary intermediate data determination section in the associative memory system of this invention will be described. FIG. 15 is a block diagram of the second system of secondary intermediate data determination section in the associative memory system 210 of this invention. The h-th (h: an integer of more than 1 and less than "t") secondary intermediate data determination section 72-$h$, shown as an example of the second system, consists of the intermediate data operation section 75-$h$, the first through p-th comparison means 78-$h$-0 through 78-$h$-$r$ and the first through p-th invalidating means 73-$h$-0 through 73-$h$-$r$.

When comparing the secondary intermediate data determination section 72-$h$, shown as an example of the second system, with the intermediate data determination section 41 shown in FIG. 9, the different matters are only that the valid search signals 69-$h$-0 through 69-$h$-$r$ are entered, the invalidating means 73-$h$-$k$ is put between the intermediate data 59-($h$+1)-k supplied from the k-th associative memory 209-$k$ and the intermediate data operation section 75-$h$, and the valid search signal 69-$h$-$k$ is entered into the invalidating means 73-$h$-$k$ and the comparison means 78-$h$-$k$, but other matters are of the same contents.

The k-th invalidating means 73-$h$-$k$ produces the intermediate data 59-($h$+1)-k as the active intermediate data 74-$h$-$k$ when the valid search signal 69-$h$-$k$ is put in the valid state, but it produces the invalid state of intermediate data to all bits of the active intermediate data 74-$h$-$k$ when the valid search signal 69-$h$-$k$ is put in the invalid state.

The intermediate data operation section 75-$h$ produces as the optimized intermediate data 77-$h$ the intermediate data with the least number of bits in invalid state among the first through p-th active intermediate data 74-$h$-0 through 74-$h$-$r$, into the comparison means 78-$h$-0 through 78-$h$-$r$. The intermediate data operation section 75-$h$ shown in FIG. 15 consists of the logical sum means 76-$k$ completely as well as the intermediate data operation section 9 shown in FIG. 1. Since the invalid state of intermediate data is supplied to all bits of the active intermediate data 74-$h$-0 through 74-$h$-$r$ corresponding to the valid search signals 69-$h$-0 through 69-$h$-$r$ put in the invalid state, it does not affect the results of logical sum operation.

The k-th comparison means 78-$h$-$k$ produces the valid state to the corresponding valid search signal 69-($h$+1)-k only when the valid search signal 69-$h$-$k$ is put in the valid state and the corresponding active intermediate data 74-$h$-$k$ is coincident with the optimized intermediate data 77-$h$ in comparison, and otherwise, it produces the invalid state to the corresponding valid search signal 69-($h$+1)-k.

Herewith, as well as the secondary intermediate data determination section 60-$h$ shown in FIG. 13, the secondary intermediate data determination section 72-$h$ produces the valid state to the valid search signal 69-($h$+1)-0 through 69-($h$+1)-$r$ corresponding to the intermediate data with the least number of bits in the invalid state when comparing the corresponding valid search signal 69-$h$-$k$ only put in the valid state among the first through p-th intermediate data 59-($h$+1)-0 through 59-($h$+1)-$r$ supplied from the first through p-th associative memories 209-0 through 209-$r$.

[The Third System of Secondary Intermediate Data Determination Section]

Next, an example of the third system of secondary intermediate data determination section in the associative memory system of this invention will be described. FIG. 16 is a block diagram of the third system of secondary intermediate data determination section in the associative memory system 210 of this invention. The h-th (h: an integer of more than 1 and less than "t") secondary intermediate data determination section 79-$h$, shown as an example of the third system, consists of the intermediate data operation section 80-$h$, the first through p-th comparison means 78-$h$-0 through 78-$h$-$r$ and the first through p-th invalidating means 73-$h$-0 through 73-$h$-$r$.

When comparing the secondary intermediate data determination section 79-$h$, shown as an example of the second system, with the second system of secondary intermediate data determination section 72-$h$ shown in FIG. 15, the different matter is only that the intermediate data operation section 80-$h$ consists of the maximum value selecting means 81-$h$ as well as the intermediate data operation section 26 shown in FIG. 4, but other matters are of the same contents.

Since the invalid state of intermediate data is supplied to all bits of the active intermediate data 74-$h$-0 through 74-$h$-$r$ corresponding to the valid search signals 69-$h$-0 through 69-$h$-$r$ put in the invalid state, it does not affect the results of maximum value selecting operation.

Therefore, as well as the secondary intermediate data determination section 60-$h$ shown in FIG. 13, the secondary intermediate data determination section 79-$h$ produces the valid state to the valid search signal 69-($h$+1)-0 through 69($h$+1)-$r$ corresponding to the intermediate data with the least number of bits in the invalid state when comparing the corresponding valid search signal 69-$h$-$k$ only put in the valid state among the first through p-th intermediate data 59-($h$+1)-0 through 59-($h$+1)-$r$ supplied from the first through p-th associative memories 209-0 through 209-$r$. Herewith, it is needless to say that the correct valid search signal 69($h$+1)-0 through 69-($h$+1)-$r$ is obtained even by constructing the secondary intermediate data determination section 72-1 through 72-$t$ using the intermediate data operation section 28 shown in FIG. 6.

In addition, it is evident that the area can be reduced by using a part of the components as the same purpose for both the k-th primary searching associative memory 57-$k$ and the corresponding secondary searching associative memories 58-1-$k$ through 58-$q$-$k$ in the associative memory system 210 according to the sixth embodiments of this invention described above. For example, it is possible to use a part of the components since the same value is stored into both the means to store the memory data in the i-th primary associative memory word 7-I-k and the means to store the first through q-th secondary memory data in the corresponding associative memory words 68-$i$-1-$k$ through 68-$i$-$q$-$k$.

The System in the Seventh Embodiment of Invention

Now, description will be made in details about the associative memory system according to the seventh embodiment of this invention with reference to the figures. In the seventh embodiment of this invention, when a plurality of words coincident with all storage data corresponding to the input data are found in the search operation taking the mask information into account, for the search data consisting of the plural number of partial search state, the means are shared to construct the primary searching associative memory and the secondary searching associative memory by incorporating a function to supply the signal to distinguish the least number of words and the control circuit supplying the signal to select the execution of the primary search operation and the partial secondary search operation according to the clock signal after comparing, among the coincident words, the number of bits of mask information (data) put in the valid state comprising the structured data every partial search state in consideration of priority in order. For example, this associative memory system is the case that a plurality of the associative memories, described in the International Patent Application No. PCT/JP01/03562, are connected.

FIG. 17 is a block diagram of the associative memory system 212 using n-bit (m×p) words according to the seventh embodiment of this invention. The associative memory system 212 comprises the first through p-th n-bit m-word associative memories 211-0 through 211-$r$ to enter the search data 70 consisting of the first through q-th partial search state, the first through p-th logical AND means 99-0 through 99-$r$, the first through p-th memory means 89-0 through 89-$r$, the control means 91, the intermediate data determination section 85, and the address signal producing section 11 to supply the address signal 12. The k-th associative memory 211-$k$ is controlled by the clock signal 55 and is provided with the memory means 87-$k$ and the associative memory 82-$k$ to be used for both the primary and secondary search operation.

The associative memory 82-$k$ to be used for both the primary and secondary search operation is provided with the associative memory words 84-0-$k$ through 84-$s$-$k$ that can store m-piece structured data consisting of the n-bit storage data and mask information (data) to search all the partial search state of search data 70. Hereupon, the symbol "*" represents "don't care" for the bits of structured data with the corresponding bit of storage data put in the invalid state and the corresponding bit of mask information (data) put in the valid state. At the first clock of clock signal 55, the associative memory 82-$k$ to be used for both the primary and secondary search operation carries out the primary search for the storage data coincident with all the partial search state of the search data 70 taking the mask information into account, among the associative memory words 84-0-$k$ through 84-$s$-$k$, performs the logical sum operation for the coincident storage data in the confirmed valid state, produces only the bit unit corresponding to the partial search state having the first priority in order of search data in the calculated values as the intermediate data 83-$k$, into the intermediate data determination section 85, and stores the intermediate data 83-$k$ into the memory means 87-$k$ at the time of transfer to the next clock. At the (h+1)-th clock operation (h: an integer of more than 1 and less than "q"), the associative memory 82-$k$ to be used for both the primary and secondary search operation, compares only the bit unit corresponding to the partial search state having the h-th priority in order of search data among the storage data stored in the associative memory words 84-0-$k$ through 84-$s$-$k$, with the previous intermediate data 88-$k$ supplied from the memory means 87-$k$, performs the logical sum operation for the coincident storage data in the confirmed valid state, produces only the bit unit corresponding to the partial search state having the (h+1)-th priority in order of search data in the calculated values as the intermediate data 83-$k$, into the intermediate data determination section 85, and stores the intermediate data 83-$k$ into the memory means 87-$k$ at the time of transfer to the next clock. The valid state is produced to the match lines 3-0-$k$ through 3-$s$-$k$ corresponding to the coincident associative memory words 84-0-$k$ through 84-$s$-$k$ every execution of the primary and secondary search operation. It is needless to say that the valid state is produced to the match lines 3-0-$k$ through 3-$s$-$k$ corresponding to the coincident associative memory words 84-0-$k$ through 84-$s$-$k$ after the execution of secondary search operation corresponding to the partial search state having the q-th priority in order, and at the completion of other search operation, it may be constructed to hold the value of match line. After the execution of secondary search operation corresponding to the partial search state having the q-th priority in order, any value may be supplied as the intermediate data 83-$k$. For example, it is needless to say that all bits may produce the valid or invalid state of intermediate data, or it may be constructed to hold the previous value.

In comparison with the secondary intermediate data determination section 60 shown in FIG. 13, the intermediate data determination section 85 can be constructed as well as the secondary intermediate data determination section 60 shown in FIG. 13, excepting the replacement of input signal designation to the intermediate data 83-0 through 83-$r$ and the valid holding signals 90-0 through 90-$r$. The intermediate data determination section 85 produces the valid state to the valid search signals 86-0 through 86-$r$ corresponding to the intermediate data with the least number of bits in the invalid state when comparing the corresponding valid holding signal 90-$k$ only put in the valid state among the first through p-th intermediate data 83-0 through 83-$r$ supplied from the first through p-th associative memories 211-0 through 211-$r$.

The logical AND means 99-0 through 99-$r$ can be constructed completely as well as the the logical AND means 46-0 through 46-$r$ described in FIG. 13, excepting the replacement of input signal designation to the valid holding signals 90-0 through 90-$r$. The address signal producing section 11 can be constructed completely as well as the address signal producing section 11 shown in FIG. 1, excepting the replacement of the match lines 3-0-0 through 3-$s$-$r$ to the active match lines 47-0-0 through 47-$s$-$r$. Of course, it is needless to say that the same system can be constructed by using the address signal producing section 25 shown in FIG. 3. When the associative memories 82-0 through 82-$r$ to be used for both the primary and secondary search operation produce the valid state to the match lines 3-0-0 through 3-$s$-$r$ corresponding to the coincident associative memory words 84-0-0 through 84-$s$-$r$ every the primary and secondary search operation, the address output signal 12 after the execution of secondary search operation corresponding to the partial search state having the q-th priority in order is the correct search result for the search data 70, and the value of address output signal 12 shall be ignored after the execution of other search operation. Of course, it is needless to say that the system may be constructed to hold, after the execution of other search operation, the value of address output signal 12 after the execution of the secondary search operation corresponding to the partial search state having the q-th quality in order.

The control means 91 produces the valid state to the initializing signal 92 before the execution of the primary search operation according to the clock signal 55, and also supplies the valid state to the storage control signal 93 every termination of the primary and secondary search operation.

The invalid state may be supplied to the storage control signal 93 after the execution of secondary search operation corresponding to the partial search state having the q-th priority in order. Described is an example of the above-mentioned associative memories 82-0 through 82-r to be used for both the primary and secondary search operation at the termination of one clock, but it is needless to say that the control means 91 may supply the valid state to the storage control signal 93 so as to synchronize the timing of output operation for the intermediate data 83-0 through 83-r and the match lines (3-0-0 through 3-s-0) through (3-0-r through 3-s-r) when it needs the plural number of clocks.

The memory means 89-0 through 89-r modify the storage state to the valid sate when the initializing signal 92 is put in the valid state. When the storage control signal 93 is put in the valid state, the state of corresponding valid search signals 86-1 through 86-r is stored.

The memory means 89-0 through 89-r supply the storage state to the corresponding valid holding signals 90-0 through 90-r, respectively.

The Operation in the Seventh Embodiment of Invention

Next referring to FIG. 18, FIG. 19 and FIG. 20, description will be mad about the operation of associative memory system 212 according to the seventh embodiment of this invention when the associative memories 211-0 and 211-1 comprising four words of eight bits are connected to enter the 8-bit search data 70 comprising two partial search states of in-quaternary (2, 1) having the first priority in order and (1, 3) having the second priority in order and the structured data is stored into the associative memory words 84-0-0 through 84-3-1 without putting data into order at random. It is assumed here that the associative memory 211-1 reserves the top addresses in the address space of eight words in total as well as in FIG. 1. The associative memories 82-0 through 82-1 to be used for both the primary and secondary search operation shall terminate by one clock. The valid state shall be supplied to the match lines 3-0-0 through 3-3-1 corresponding to the coincident associative memory words 84-0-0 through 84-3-1 every primary and secondary search operation.

In this example, as well as in FIG. 1, description will be made with the mask valid state "0" and invalid state "1" and also with the storage data valid state "1" and invalid state "0", respectively. In addition, description will be made with the intermediate data 59 valid state "1" and invalid state "0" and also with the match line 3 valid state "1" and invalid state "0", respectively, as well as the storage data.

It is assumed here that, as well as the primary search memory 57-0 shown in FIG. 14, the associative memory words 84-0-0 through 84-3-0, four words, of the associative memory 82-0 to be used for both the primary and secondary search operation store the storage data and mask information (data) so as to represent (3, *, 1, 3), (2, *, 1, *), (1, *, 3, 2) and (2, *, 1, 3), expressed in quaternary, as the structured data, respectively. It is assumed here that the associative memory words 84-0-1 through 84-3-1, four words, of the associative memories 82-1 to be used for both the primary and secondary search operation store the storage data and mask information (data) so as to represent (2, 3, 1, 3), (2, 1, 1, *), (2, *, *, *) and (2, 1, *, *), expressed in quaternary, as the structured data, respectively. As well as the conventional primary search associative memory 302 described in FIG. 23, the valid state "0" of mask information (data) is stored into the corresponding bit of mask information (data) and the invalid state "0" of storage data is stored into the corresponding bit of storage data, respectively, to represent the "don't care" state with the symbol "*".

In other words, the storage data (3, 0, 1, 3), (2, 0, 1, 0), (1, 0, 3, 2) and (2, 0, 1, 3), expressed in quaternary, are stored into the associative memory words 84-0-0 through 84-3-0, respectively, and the mask information (3, 0, 3, 3), (3, 0, 3, 0), (3, 0, 3, 3) and (3, 0, 3, 3), expressed in quaternary, are stored respectively.

The storage data (2, 3, 1, 3), (2, 1, 1, 0), (2, 0, 0, 0) and (2, 1, 0, 0), expressed in quaternary, are stored into the associative memory words 84-0-1 through 84-3-1, respectively, and the mask information (3, 3, 3, 3), (3, 3, 3, 0), (3, 0, 0, 0) and (3, 3, 0, 0), expressed in quaternary, are stored respectively. The top 4-bit state of storage data and mask information (data) corresponds to the partial search state of search data 70 with the first priority in order, and the low 4-bit state of storage data and mask information (data) corresponds to the partial search state of search data 70 with the second priority in order.

Next, the description will proceed to the operation of associative memory 212 at the first clock on entering the search data 70 of (2, 1, 1, 3), expressed in quaternary, referring to FIG. 18.

In the associative memory 211-0, at the first, the associative memory 82-0 to be used for both the primary and secondary search operation carries out the primary search for the storage data coincident with the search data 70 taking the mask information into account, and as a result, the structured data (2, *, 1, *) and (2, *, 1, 3) in quaternary stored in the associative memory words 84-1-0 and 84-3-0, respectively, are coincident with the search data 70. The associative memory 82-0 to be used for both the primary and secondary search operation performs the logical sum operation for the in-quaternary storage data (2, 0) and (2, 0), the state corresponding to the partial search state of search data 70 with the first priority in order, stored in the primary associative memory words 84-1-0 and 84-3-0, respectively, with the storage data confirmed in the valid state, produces the calculated 4-bit state of (2, 0) expressed in quaternary and "1000" expressed in binary as the intermediate data 83-0, into the intermediate data determination section 85 and stores the intermediate data 83-0 into the memory means 87-0 at the time of transfer from the first clock to the second clock.

In the associative memory 211-1 as well as the associative memory 211-0, at the first, the associative memory 82-1 to be used for both the primary and secondary search operation carries out the primary search for the storage data coincident with the search data 70 and all bits taking the mask information into account, and as a result, the structured data (2, 1, 1, *), (2, *, *, *) and (2, 1, *, *) in quaternary stored in the associative memory words 84-1-1, 84-2-1 and 84-3-1 is coincident with the search data 70. The associative memory 82-1 to be used for both the primary and secondary search operation performs the logical sum operation for the in-quaternary storage data (2, 1), (2, 0) and (2, 1), the state corresponding to the partial search state of search data 70 with the first priority in order, stored in the coincident associative memory words 84-1-1, 84-2-1 and 84-3-1, respectively, with the storage data confirmed in the valid state, produces the calculated 4-bit state of (2, 1) expressed in quaternary and "1001" expressed in binary as the intermediate data 83-1, into the intermediate data determination section 85 and stores the intermediate data 83-1 into the memory means 87-1 at the time of transfer from the first clock to the second clock.

Prior to starting the primary search operation by the associative memories 211-0 and 211-1, the values stored in the memory means 89-0 and 89-1 shall be initialized to the valid state by the initializing signal 92 supplied from the control means 91. Therefore, the memory means 89-0 produces the valid state "1" to the valid holding signal 90-0, and the memory means 89-1 produces the valid state "1" to the valid holding signal 90-1.

The associative memory 211-0 supplies the valid state to the match lines 3-1-0 and 3-3-0, and the associative memory 211-1 supplies the valid state to the match lines 3-1-1, 3-2-1 and 3-3-1. Since the valid holding signals 90-0 and 90-1 are put in the valid state, the logical AND means 99-0 and 99-1 send data to the address signal producing section 11 via the active match lines 47-0-0 through 47-3-1, and then the address signal producing section 11 produces the address output signal 12 that is put in the "unstable" state.

Herewith, the first clock operation of associative memories 211-0 through 211-1 is not the execution of secondary search operation corresponding to the partial search state having the second priority in order, so that the value of address output signal 12 is invalid and is ignored in an example of this operation.

Since the valid holding signals 90-0 and 90-1 are put in the valid state, the intermediate data determination section 85 compares the intermediate data 83-0 and 83-1 for the number of bits in the invalid state, and produces the valid state "1" to the valid search signal 86-1 corresponding to the intermediate data 83-1 with the least number of bits in the invalid state and the invalid state "0" to other valid search signal 86-0, respectively.

Since the control means 91 supplies the valid state to the storage control signal 93, the memory means 89-0 and 89-1 store the invalid state "0" for the valid search signal 86-0 and the valid state "1" for the valid search signal 86-1, respectively, at the time of transfer from the first clock to the second clock.

Next, the description will proceed to the operation of associative memory 212 at the second clock on entering the search data 70 of (2, 1, 1, 3), expressed in quaternary, referring to FIG. 19. The associative memory 82-0 to be used for both the primary and secondary search operation, performs the secondary search operation to compare only the bit unit corresponding to the partial search state having the first priority in order of search data 70 among the storage data stored in the associative memory words 84-0-0 through 84-3-0, without considering the mask information (data) corresponding to the previous intermediate data 88-0 of (2, 0), expressed in quaternary, supplied from the memory means 87-0 and as a result, the associative memory words 84-1-0 and 84-3-0 are coincident with the search data 70. The associative memory 82-0 to be used for both the primary and secondary search operation performs the logical sum operation for the in-quaternary storage data (1, 0) and (1, 3), the state corresponding to the partial search state of search data 70 with the second priority in order, stored in the coincident associative memory words 84-1-0 and 84-3-0, respectively, with the storage data confirmed in the valid state, produces the calculated 4-bit state of (1, 3) expressed in quaternary and "0111" expressed in binary as the intermediate data 83-0, into the intermediate data determination section 85 and stores the intermediate data 83-0 into the memory means 87-0 at the time of transfer from the second clock to the third clock.

Similarly, the associative memory 82-1 to be used for both the primary and secondary search operation, performs the secondary search operation to compare only the bit unit corresponding to the partial search state having the first priority in order of search data 70 among the storage data stored in the associative memory words 84-0-1 through 84-3-1, without considering the mask information (data) corresponding to the previous intermediate data 88-1 of (2, 1), expressed in quaternary, supplied from the memory means 87-1 and as a result, the associative memory words 84-1-1 and 84-3-1 are coincident with the search data 70. The associative memory 82-1 to be used for both the primary and secondary search operation performs the logical sum operation for the in-quaternary storage data (1, 0) and (0, 0), the state corresponding to the partial search state of search data 70 with the second priority in order, stored in the coincident associative memory words 84-1-1 and 84-3-1, respectively, with the storage data confirmed in the valid state, produces the calculated 4-bit state of (1, 0) expressed in quaternary and "0100" expressed in binary as the intermediate data 85-1, into the intermediate data determination section 85 and stores the intermediate data 85-1 into the memory means 87-1 at the time of transfer from the second clock to the third clock.

The associative memory 211-0 supplies the valid state to the match lines 3-1-0 and 3-3-0, and the associative memory 211-1 supplies the valid state to the match lines 3-1-1 and 3-3-1. Since the valid holding signal 90-1 is put in the valid state, the logical AND means 99-0 and 99-1 send data to the address signal producing section 11 via the active match lines 47-0-0 through 47-3-1, and then the address signal producing section 11 produces the address output signal 12 that is put in the "unstable" state. Herewith, the second clock operation of associative memories 211-0 through 211-1 is not the execution of secondary search operation corresponding to the partial search state having the second priority in order, so that the value of address output signal 12 is invalid and is ignored in an example of this operation.

Since the valid holding signal 90-0 is put in the valid state, the intermediate data determination section 85 compares the intermediate data 83-1 for the number of bits in the invalid state, and produces the valid state "1" to the valid search signal 86-1 corresponding to the intermediate data 83-1 with the least number of bits in the invalid state and the invalid state "0" to other valid search signal 86-0, respectively.

Since the control means 91 supplies the invalid state to the storage control signal 93, the memory means 89-0 and 89-1 store the invalid state "0" for the valid search signal 86-0 and the valid state "1" for the valid search signal 86-1, respectively, at the time of transfer from the second clock to the third clock.

Next, the description will proceed to the operation of associative memory 212 at the third clock on entering the search data 70 of (2, 1, 1, 3), expressed in quaternary, referring to FIG. 20.

The associative memory 82-0 to be used for both the primary and secondary search operation, performs the secondary search operation to compare only the bit unit corresponding to the partial search state having the second priority in order of search data 70 among the storage data stored in the associative memory words 84-0-0 through 84-3-0, without considering the mask information (data) corresponding to the previous intermediate data 88-0 of (1, 3), expressed in quaternary, supplied from the memory means 87-0 and as a result, the associative memory word 84-3-0 is coincident with the search data 70, and then the valid state of match line is supplied to the corresponding match line 3-3-0. The associative memory 82-0 to be used for both the primary and secondary search operation terminates the secondary search operation for all of the partial search state of the search data 70, so that as the intermediate data 83-0 in this example, the values of all bits in the valid state are entered into the intermediate data determination section 85 and are stored into the memory means 87-0 at the time of transfer from the third clock to the fourth clock.

Similarly, the associative memory 82-1 to be used for both the primary and secondary search operation, performs the secondary search operation to compare only the bit unit corresponding to the partial search state having the second priority in order of search data 70 among the storage data stored in the associative memory words 84-0-1 through 84-3-1, without considering the mask information (data) corresponding to the previous intermediate data 88-1 of (1, 0), expressed in quaternary, supplied from the memory means 87-1 and as a result, the associative memory word 84-1-1 is coincident with the search data 70, and then the valid state of match line is supplied to the corresponding match line 3-1-1. The associative memory 82-1 to be used for both the primary and secondary search operation terminates the secondary search operation for all of the partial search state of the search data 70, so that as the intermediate data 85-1 in this example, the values of all bits in the valid state are entered into the intermediate data determination section 85 and are stored into the memory means 87-1 at the time of transfer from the third clock to the fourth clock.

Since the valid holding signal 90-0 is put in the invalid state, the intermediate data determination section 85 compares the intermediate data 83-1 for the number of bits in the invalid state, and produces the valid state "1" to the valid search signal 86-1 corresponding to the intermediate data 83-1 with the least number of bits in the invalid state and the invalid state "0" to other valid search signal 86-0, respectively.

Since the control means 91 supplies the invalid state to the storage control signal 93, the memory means 89-0 and 89-1 keep to store the invalid state "0" and the valid state "1", respectively.

The logical AND means 99-1 produces the invalid state of match line to all the active match lines 47-0-0 through 47-3-0 since the corresponding valid holding signal 90-0 is put in the invalid state. Therefore, the active match lines 47-0-0 through 47-3-0 becomes "0000" in binary. Since the corresponding valid holding signal 90-1 is put in the valid state, the logical AND means 99-1 produces the value "0010", expressed in binary, of the match lines 3-0-1 through 3-3-1 supplied from the associative memory 211-1, into the active match lies 47-0-1 through 47-3-1. As a result, only the active match line 47-2-1 is put in the valid state signal among the signals entered in the address signal producing section 11, and the address signal producing section 11 produces the value "101", expressed in binary, as the address output signal 12. In the examples of FIGS. 18, 19 and 20, it is evident that the in-quaternary value (2, 1, 1, *) stored in the associative memory word 84-1-1 incorporated in the associative memory 211-1 is the least number of bits in priority of mask information (data) among the structured data stored in the coincident associative memory system 212 for the search data 70 provided with the partial search state with the first priority in order, (2, 1) expressed in quaternary, and the partial search state with the second priority in order, (1, 3) expressed in quaternary. Therefore, it is found that the address signal producing section 11 supplies the correct address output signal 12.

Of course, it is evident that the correct address output signal 12 can be obtained even by the other system without the intermediate data determination section 85, the logical AND means 99-0 through 99-r, the memory means 89-0 through 89-r and the control means 91, as well as the associative memory system 200 according to the first embodiment of this invention shown in FIG. 1, that the optimized intermediate data obtained after the intermediate data 83-0 through 83-r supplied from the associative memories 211-0 through 211-r are entered into the intermediate data operation section constructed as well as the intermediate data operation section 9 shown in FIG. 1, is supplied into the memory means 87-0 through 87-r, and the match lines 3-0-0 through 3-s-r supplied from the associative memories 211-0 through 211-r are directly entered into the address signal producing section 11.

At this time, it is needless to say that the intermediate data operation section can be constructed as well as the intermediate data operation section 26 shown in FIG. 4 or the intermediate data operation section 28 shown in FIG. 6. It is also evident that the optimized intermediate data may be constructed to be produced by the logical wire connection as the associative memory system 203 according to the third embodiment of this invention shown in FIG. 8. The above-mentioned matters enable the circuit system to be simplified.

In this example, it is needless to say that the counting means 94-k for the number of bits in the invalid state supplies the number of bits of intermediate data 83-k when the valid search signal 90-k is put in the invalid state, but a value larger than the number of bits of intermediate data 80-k may be produced.

Herein, in the associative memory system 212 shown in FIG. 17, when the associative memory 211-k is incorporated with the counting means 94-k for the number of bits in the invalid state, corresponding to the associative memory 211-k, the number of long lines can be extremely reduced and the number of terminals required for the associative memory 211 can be also extremely reduced as well as the description of associative memory system 206 in FIG. 11. Further, it can reduce the consumable electrical power due to the signal delay time and wiring electrical capacity. The area of associative memories can be made smaller by reducing the wiring area. The number of terminals in the associative memories is extremely reduced, so that the area of associative memories can be also made smaller.

When the address signal producing section 25 shown in FIG. 3 is used instead of the address signal producing section 11 in the associative memory system according to the third to seventh embodiments of this invention described above, it is needless to say that the area of associative memories and the number of terminals in the associative memories can be further reduced, as above mentioned, by incorporating the encoder 22-k corresponding to the associative memory 211-k and the match detecting means 16-k into the associative memory 221-k.

The Eighth Embodiment of Invention

Next referring to FIG. 21, description will be made about an example of the network device system using the associate memory system 200 to count the transfer network address according to the first embodiment of this invention. FIG. 21 is a block diagram of network device system using the associative memories to calculate the transfer network address according to the first embodiment of this invention.

Figure 25:
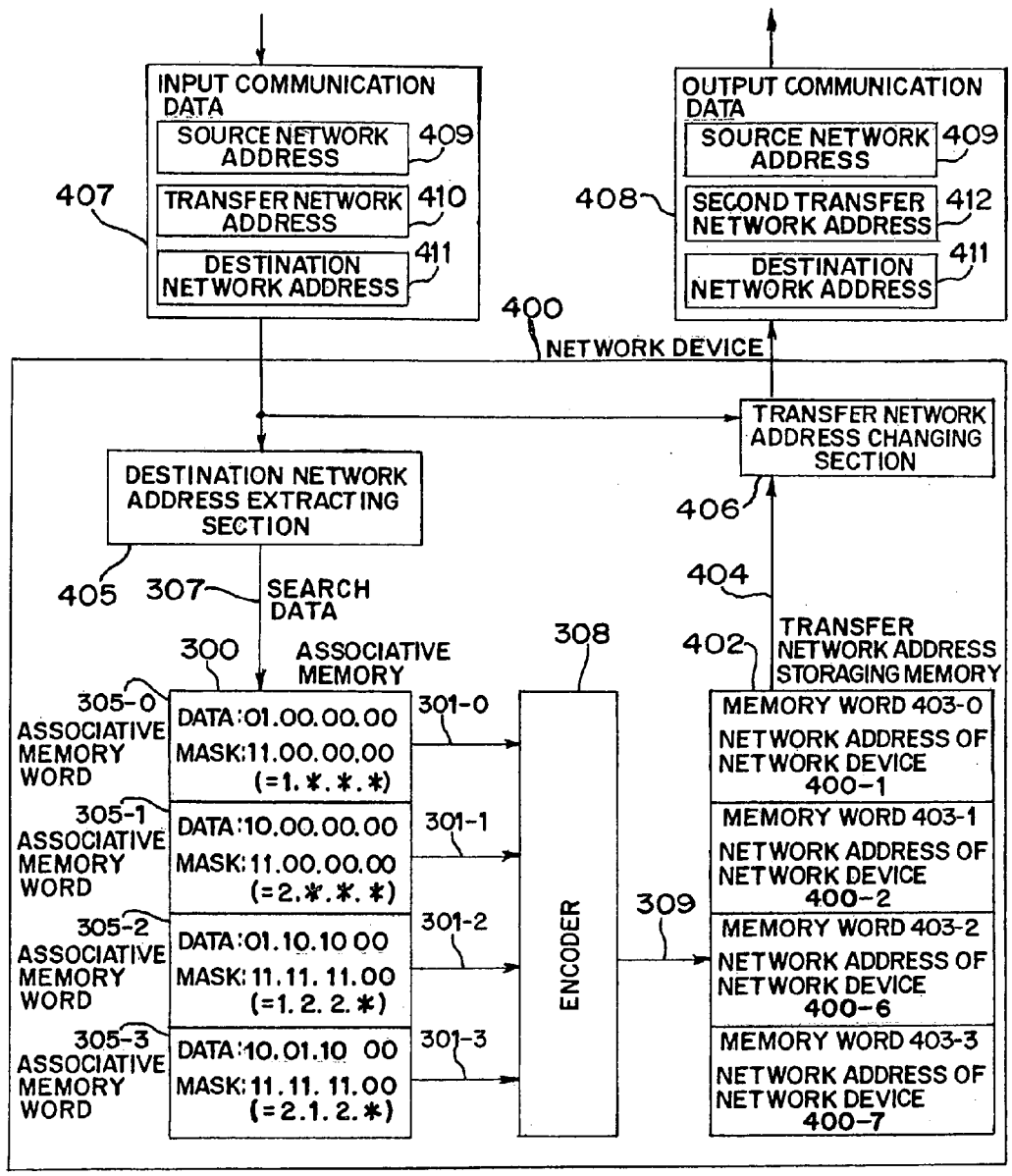
FIG. 25 is a block diagram of conventional network device using the conventional associative memory to calculate the transfer network address.

As well as the conventional network device 400 shown in FIG. 25, the network device 101 shown in FIG. 21 enters the input communication data 407 and transfers the output communication data 408. The input communication data 407 is provided with the source network address 409, the transfer network address 410 and the destination network address 411. The output communication data 409 is provided with the source network address 409, the second transfer network address 412 and the destination network address 411. The transfer network address 410 of the input communication data 407 is the network address of the network device 101 shown in FIG. 21.

The network device 101 of this invention shown in FIG. 21 consists of the destination network address extracting section 405, the associative memory system 200 according to the first embodiment of this invention, the transfer network address storage memory 102 and the transfer network address changing section 406.

In comparison with the conventional network device 400 described in FIG. 25, the different matters are that the conventional n-bit m-word associative memory 300 to search the optimum structured data for the search data 307 supplied from the destination network address extracting section 405 and the encoder 308 to encode the match lines 301-0 through 301-3 supplied from the associative memory 300, into the address output signal 309, in FIG. 25 are constructed by application of the associative memory system 200 using n-bit (m×p)-words according to the first embodiment of this invention comprising the first through p-th n-bit m-word associative memories 1-0 through 1-r, and together with this matter, the m-word transfer network address storage memory 402 is modified to the (m×p) words transfer network address storage memory, but other components are constructed in the same way.

The associative memory system 200 shown in FIG. 21, as well as the system in FIG. 1, consists of the first through p-th n-bit m-word associative memories 1-0 through 1-r, the intermediate data operation section 9 and the address signal producing section 11, and enters the n-bit search data 2 and transfers the address output signal 12. Therefore, as it is evident from the description for operation of the associative memory system 200 according to the first embodiment of this invention, it is found that the number of pieces of the structured data which can be stored is increased by p times, but others operate completely in the same way in comparison with the combination of the conventional n-bit m-word associative memory 300 and the encoder 308 shown in FIG. 25.

Herewith, the network device 101 consisting of the associative memory system 200 of this invention that is provided with the plural number of associative memories 1-0 through 1-r does not stop the data transfer operation due to being unnecessary to put data into order and allows the data transfer speed to be increased greatly over the network system even when updating the structured data that is stored.

Since the expensive high-speed CPU system is not required to put data into order, the total price of network devices can be reduced. In addition, since the priority encoder is not needed, it shortens the encoding time, so that it can make the communication data transfer speed higher and the price of network device lower, respectively.

The Ninth Embodiment of Invention

Next referring to FIG. 22, description will be made about an example of the network device system using the associate memory system 212 to determine the transfer permission according to the second embodiment of this invention. FIG. 22 is a block diagram of network device system using the associative memories for operation of transfer permission according to the second embodiment of this invention.

The network device 103 shown in FIG. 22 enters the input communication data 407 and transfers the output communication data 408. The input communication data 407 is provided with the source network address 409, the transfer network address 410 and the destination network address 411. The output communication data 408 is provided with the source network address 409, the second transfer network address 412 and the destination network address 411. The transfer network address 410 of the input communication data 407 is the network address of the network device 103 shown in FIG. 22.

The network device 103 of this invention shown in FIG. 22 consists of the source network address, the destination network address extracting section 104, the associative memory system 212 according to the seventh embodiment of this invention, the transfer permission information storage memory 105, the transfer network address operation section 108, the transfer network address changing section 406 and the data transfer section 107.

The source network address and destination network address extracting section 104 extracts the source network address 409 and the destination network address 410 from the input communication data 407, and supplies the destination network address 410 as the search data 2 into the transfer network address operation section 108. The search data 70 including both source network address 409 and destination network address 410 extracted as the partial search state are transferred into the associate memory system The transfer network address operation section 108 searches the network addresses that are represented by the stored internal structured data and are coincident with the destination network address 410 entered as the search data 2, selects the coincident structured data with the least number of bits in a mask valid state, and is provided with the function to produce as the memory data signal 404 the second transfer network address corresponding to the network address represented by the pertinent structured data.

The transfer network address changing section 406 changes the transfer network address 410 in the input communication data 407 to the second transfer network address 412 according to the memory data signal 404, and supplies the changed communication data 109 into the data transfer section 107.

Therefore, the operation of the source network address and destination network address extracting section 104 for the transfer network address 410 in the input communication data, the transfer network address operation section 108 and the transfer network address changing section 406 is completely the same as the conventional network address device 400 shown in FIG. 23. Thus, the transfer network address operation section 108 can be constructed easily by using the associative memory system 101 and the transfer network address storage memory 402 in the network device 101 of this invention shown in FIG. 21.

The construction of associative memory system 212 shown in FIG. 22 is the same as in FIG. 17. The associative memory system 212 is provided with the first through p-th associative memories 211-0 through 211-r, and stores the structured data combining the source network address and the transfer network address in the words of the k-th associative memory 211-k. In this example, description will be made under the state with the first priority in order for the source network address 409 among the partial search state comprising the search data 70. Of course, it is needless to say that the partial search state corresponding to the destination network address 411 may be provided with the first priority in order.

As well as the description of operation of the associative memory system 212 according to the seventh embodiment of this invention above-mentioned, when the plural number of words are coincident with all memory data after performing the primary search operation to compare the structured data stored in the first to p-th associative memories 211-0 through 211-r taking the mask information into account for the source network address 409 supplied from the destination network address and destination network address extracting section 104 and the search data 70 including the destination network address 410 as the partial search state, the associative memory system 212 selects the memory data with the least number of bits in the invalid state included in the bit state corresponding to the source network address 409 having the first priority in order among the memory data of coincident words, selects the memory data with the least number of bits in the invalid state included in the bit state corresponding to the destination network address 411 having the second priority in order among the selected memory data, and produces the address output signal 12 to access the words of transfer permission information storage memory 105 corresponding to the pertinent memory data.

The transfer permission information storage memory stores the control data to indicate the available or unavailable transfer state of the input communication data coincident with the pertinent structured data for the words corresponding to the structured data combining the source network address and the transfer network address stored in the words of the associative memory system 212, and the address output signal 12 supplies as the transfer control signal 106 the control data stored in the corresponding words, into the data transfer section.

When the transfer control signal 107 indicates the available state of transfer permission, the data transfer section 107 transfers the changed communication data 109 to the network device corresponding to the second transfer network address 412, but when the transfer control signal 107 indicates the unavailable state of transfer permission, the data transfer section 107 does not transfer the changed communication data 109. Herewith, it is able to carry out the so-called packet filtering operation.

In this example, construction is made by the associative memory system 212 according to the seventh embodiment of this invention. However, it is needless to say that construction is also made by the associative memory system 210 according to the sixth embodiment of this invention.

As mentioned above, the network device 103 consisting of the associative memory system 212 of this invention that is provided with the plural number of associative memories 211-0 through 211-r does not stop the data transfer operation due to being unnecessary to put data into order and allows the data transfer speed to be increased greatly over the network system even when updating the structured data that is stored.

Since the expensive high-speed CPU system is not required to put data into order, the total price of network devices can be reduced. In addition, since the priority encoder is not needed, it shortens the encoding time, so that it can make the communication data transfer speed higher and the price of network device lower, respectively.

Since it is necessary to put data into order, the network device 103 of this invention allows the associative memory 211 to be added or eliminated easily, and can change the storage capacity of structured data flexibly on the network scale.

[Applicability of the Invented Associative Memory Systems in the Industries]

As mentioned above, the invented associative memory systems have the effect of being able to supply the signals to distinguish the optimum structured data in the plural number of memory data coincident with the search data during the search operation even when the structured data is written, updated and eliminated without putting data into order for the plural number of associative memories connected to increase the memory capacity.

The search time of the invented associative memory systems that are constructed to perform the determination of intermediate data and the secondary searching operation simultaneously like the fourth embodiment of this invention, is the same as the search time of single associate memory, and also has the effect of being able to perform the high-speed search operation.

Since the number of long lines with the large parasitic line capacity can be reduced greatly over the associative memory by incorporating the function to encode and produce both or one of intermediate data and match line into the associative memories, the invented associative memory systems have the effect of being able to shorten the search time due to shortening of signal delay time and reduce the consumable power due to reducing of line capacity. In addition, the invented associative memory systems have the effect of being able to reduce the total area of associative memory system greatly and make the price of the whole system lower due to the reduction of line area and the great reduction of the number of terminals in the associate memories. Further, since the priority encoder is not required, the searching speed can be made higher over the system and the area of associative memory system can be made smaller.

The network device, which is incorporated with the invented associative memory system that connects the plural number of associative memories to increase the memory capacity, has the advantages of being able to eliminate, add and modify the network address represented by the structured data without stopping the data transfer operation. As mentioned above, the application of the invented associative memory system allows the network address represented by the structured data to be eliminated, added and modified without putting data into order within the time required for the ordinary memory access.

Herewith, it becomes unnecessary to take the invalid network communication time for putting data into order that is required for the conventional network device, and the advantage of making the operation management easy is given. Since the elimination, addition and modification of network address represented by the structured data are reflected quickly on the system, the data transfer speed and safety over the network are improved. Further, it becomes easy to perform the software operation to manage the structured data of the associative memory system.

The network device incorporated with the invented associative memory system is provided with the efficacy of being able to reduce the total cost of network device that can carry out the high-speed transfer address counting and determination of transfer permission. As mentioned above, the introduction of the invented associative memory system that can perform the high-speed determination of transfer permission does not need to install the expensive high-speed CPU system for putting data into order and is able to reduce greatly the total area of associative memory system.

The use of the invented network device offers the advantages that the memory capacity can be increased and decreased flexibly according to the increase and decrease of data on the network scale, the high-speed data transfer can be carried out, and also the easy-operation-management network system can be constructed.

What is claimed is:

1. An associative memory system, which outputs an address output signal identifying a network address of a transfer destination with an input of an n-bit (n is an integer equal to or greater than 1) search data, comprising:
   i) p (p is an integer equal to or greater than 2) primary searching associative memories for storing m (m is an integer equal to or greater than 2) pieces of structured data including primary storage data whose single word is n bits in length and mask information, comparing said search data with said primary storage data for each single word with consideration given to corresponding said mask information, carrying out a logical operation among said primary storage data, each of which is matched with said search data, and outputting an operation result as n-bit intermediate data;
   ii) an intermediate data operating unit for selecting intermediate data with a least number of invalid state bits out of p pieces of said intermediate data and outputting the intermediate data as n-bit optimized intermediate data;
   iii) p secondary searching associative memories for storing m pieces of secondary storage data whose single word is n bits in length corresponding to said primary storage data, comparing said optimized intermediate data with said secondary storage data for each single word, and allocating a valid state for matched data or an invalid state for unmatched data to m match lines corresponding to each word; and
   iv) an address signal generating unit for generating an address output signal for searching for a state of m×p said match lines and identifying the network address of the transfer destination from said secondary storage data corresponding to the match lines allocated to the valid state.

2. An associative memory system as claimed in claim 1, wherein said intermediate data operating unit comprises logical sum operation means for carrying out a logical sum operation (an OR operation) of said plurality of intermediate data at the same bit position, with a valid state of storage data as true.

3. An associative memory system as claimed in claim 1, wherein said intermediate data operating unit selects a maximum value, regarding said intermediate data as a binary notation value with a valid state of storage data as true, among said plurality of intermediate data.

4. An associative memory system as claimed in claim 1, wherein said intermediate data operating unit includes a plurality of invalid state counting means for counting the number of bits in an invalid state among said intermediate data supplied, minimum value selecting means for selecting the minimum value among operation results output from said plurality of invalid state counting means, and selection means for selecting intermediate data corresponding to said minimum value to output it as said optimized intermediate data.

5. An associative memory system as claimed in claim 4, wherein said invalid state counting means counts the number of bits in an invalid state of storage data from one side of bit position of said intermediate data toward the other side up to the bit just before the first bit in a valid state of storage data.

6. An associative memory system as claimed in claim 4, wherein said invalid state counting means is contained in the corresponding associative memory.

7. An associative memory system as claimed in claim 1, wherein said intermediate data operating unit includes a wired logic-OR circuit of said intermediate data, with a valid state of storage data as true in order to share output terminals of said intermediate data and input terminals of said optimized intermediate data.

8. An associative memory system as claimed in claim 1, wherein said intermediate data operating unit includes storage means for enabling a pipeline process.

9. An associative memory system as claimed in claim 1, wherein said intermediate data determining unit includes means for synchronizing timing of outputting a detection signal to said detection signal lines with a termination of secondary searching operation carried out in parallel.

10. An associative memory system as claimed in claim 1, wherein a common memory is used as said memory for storing the primary storage data and said memory for storing the secondary storage data.

11. An associative memory system as claimed in claim 1, wherein said address signal generating unit includes match detecting means for detecting whether or not a valid state is allocated to said corresponding match lines, logical-OR means for carrying out a logical sum operation of said match line signals, first encoding means for encoding an output signal of said logical-OR means into a field of an address signal, and second encoding means for encoding an output signal of said match detecting means into another field of the address signal.

12. An associative memory system as claimed in claim 1, wherein said address signal generating unit includes match detecting means for detecting whether or not a valid state is allocated to said corresponding match lines, first encoding means for encoding said match line signal into a field of an address signal, second encoding means for encoding an output signal of said match detecting means into another field of the address signal, and selection and selection means for selecting an output signal of said first encoding means in response to an operation result of said second encoding means.

13. An associative memory system as claimed in claim 12, wherein the corresponding associative memory contains said match detecting means and said first encoding means.

14. An associative memory system, which outputs an address output signal identifying a network address of a transfer destination with an input of n-bit (n is an integer equal to or greater than 1) search data, comprising:
   i) p (p is an integer equal to or greater than 2) primary searching associative memories for storing m (m is an integer equal to or greater than 2) pieces of structured data including primary storage data whose single word is n bits in length and mask information, comparing said search data with said primary storage data for each single word with consideration given to corresponding said mask information, carrying out a logical operation among said primary storage data, each of which is matched with said search data, and outputting an operation result as n-bit intermediate data;
   ii) an intermediate data determining unit for selecting intermediate data with a least number of invalid state bits as optimized intermediate data out of p pieces of said intermediate data, comparing the optimized intermediate data with each intermediate data, and allocating a valid state for matched data or an invalid state for unmatched data to n detection signal lines corresponding to respective intermediate data;

iii) p secondary searching associative memories for storing m pieces of secondary storage data whose single word is n bits in length corresponding to said primary storage data, comparing said intermediate data with said secondary storage data for each single word, and allocating a valid state for matched data or an invalid state for unmatched data to m match lines corresponding to each word; word;

iv) match signal outputting means for allocating a state having been allocated to said match lines to effective match lines corresponding to said match lines when a valid state is allocated to said detection signal lines or for allocating an invalid state to effective match lines corresponding to said match lines when an invalid state is allocated to those;

v) an address signal generating unit for generating an address output signal for searching for a state of m×p said effective match lines and identifying the network address of the transfer destination from said secondary storage data corresponding to said effective match lines allocated to a valid state.

15. An associative memory system as claimed in claim 14, wherein said intermediate data determining unit comprises:

an intermediate data operating unit for selecting intermediate data with a least number of invalid state bits out of said intermediate data supplied and outputting it as optimized intermediate data; and intermediate data comparing means for outputting a valid state only for said detection signal lines of the intermediate data coincident with said optimized intermediate data.

16. An associative memory system as claimed in claim 15, wherein said intermediate data operating unit comprises logical sum operation means for carrying out a logical sum operation (an OR operation) of said plurality of intermediate data at the same bit position, with a valid state of storage data as true.

17. An associative memory system as claimed in claim 15, wherein said intermediate data operating unit selects a maximum value, regarding said intermediate data as a binary notation value with a valid state of storage data as true, among said plurality of intermediate data.

18. An associative memory system as claimed in claim 15, wherein said intermediate data operating unit includes a plurality of invalid state counting means for counting the number of bits in an invalid state among said intermediate data supplied, minimum value selecting means for selecting the minimum value among operation results output from said plurality of invalid state counting means, and selection means for selecting intermediate data corresponding to said minimum value to output it as said optimized intermediate data.

19. An associative memory system as claimed in claim 18, wherein said invalid state counting means counts the number of bits in an invalid state of storage data from one side of bit position of said intermediate data toward the other side up to the bit just before the first bit in a valid state of storage data.

20. An associative memory system as claimed in claim 18, wherein said invalid state counting means is contained in the corresponding associative memory.

21. An associative memory system as claimed in claim 15, wherein said intermediate data operating unit includes storage means for enabling a pipeline process.

22. An associative memory system as claimed in claim 14, wherein said intermediate data determining unit includes a plurality of invalid state counting means for counting the number of bits in an invalid state among said intermediate data supplied, minimum value selecting means for selecting the minimum value among operation results output from said plurality of invalid state counting means, and minimum value comparing means for outputting a valid state only to said detecting signal lines of the intermediate data corresponding to said minimum value.

23. An associative memory system as claimed in claim 22, wherein said invalid state counting means counts the number of bits in an invalid state of storage data from one side of bit position of said intermediate data toward the other side up to the bit just before the first bit in a valid state of storage data.

24. An associative memory system as claimed in claim 22, wherein said invalid state counting means is contained in the corresponding associative memory.

25. An associative memory system as claimed in claim 14, wherein a common memory is used as said memory for storing the primary storage data and said memory for storing the secondary storage data.

26. An associative memory system as claimed in claim 14, wherein said address signal generating unit includes match detecting means for detecting whether or not a valid state is allocated to said corresponding match lines, logical-OR means for carrying out a logical sum operation of said match line signals, first encoding means for encoding an output signal of said logical-OR means into a field of an address signal, and second encoding means for encoding an output signal of said match detecting means into another field of the address signal.

27. An associative memory system as claimed in claim 14, wherein said address signal generating unit includes match detecting means for detecting whether or not a valid state is allocated to said corresponding match lines, first encoding means for encoding said match line signal into a field of an address signal, second encoding means for encoding an output signal of said match detecting means into another field of the address signal, and selection means for selecting an output signal of signal of said first encoding means in response to an operation result of said second encoding means.

28. An associative memory system as claimed in claim 27, wherein the corresponding associative memory contains said match detecting means and said first encoding means.

29. An associative memory system, which inputs n-bit (n is an integer equal to or greater than 1) search data composed of k (k is an integer equal to or greater than 2) partial search fields with an order of priority and outputs an address output signal identifying a network address of a transfer destination, comprising:

i) p (p is an integer equal to or greater than 2) primary searching associative memories for storing m (m is an integer equal to or greater than 2) pieces of structured data including primary storage data whose single word is n bits in length composed of k search fields and mask information, comparing said search data with said primary storage data for each single word with consideration given to corresponding said mask information, carrying out a logical operation among said primary storage data, each of which is matched with said search data, and outputting only bit fields corresponding to partial search fields with the first order of priority among the operation results as first intermediate data;

ii) an intermediate data determining unit for allocating a valid state for the first intermediate data with a least number of invalid state bits or an invalid state for others among p pieces of said first intermediate data to n detection signal lines corresponding to each first intermediate data;

iii) p secondary searching associative memories for the first to (k−1)th fields for storing m pieces of secondary storage data whose single word is n bits in length corresponding to said primary storage data, comparing only said search data in bit fields corresponding to partial fields with the h-th (h is an integer greater than or equal to 1 and less than or equal to k−1) order of priority with the h-th intermediate data for each single word, carrying out a logical operation among said secondary storage data, each of which is matched with said search data, and outputting only the data in the bit fields corresponding to the partial search fields with the (h+1)th order of priority among the operation results as the (h+1)th intermediate data;

iv) a first to (k-1)th secondary intermediate data determining unit for allocating a valid state to n detection signal lines corresponding to each of the (h+1)th intermediate data for the (h+1)th intermediate data with a least number of invalid state bits when a valid state is allocated to said detection signal lines in said process or for allocating an invalid state to n detection signal lines corresponding to each of the (h+1)th intermediate data for others among p pieces of said (h+1)th intermediate data;

v) p secondary searching associative memories for the k-th field for storing m pieces of secondary storage data whose single word is n bits in length corresponding to said primary storage data, comparing said search data only in a bit field corresponding to a partial field with the k-th order of priority with the (h+1)th intermediate data for each single word, and allocating a valid state for matched data or an invalid state for unmatched data to m match lines corresponding to each word;

vi) match signal output means for allocating said state allocated to the match lines to effective match lines corresponding to said match lines when the valid state is allocated to said detection signal signal lines of the h-th secondary intermediate data determining unit or for allocating an invalid state to effective match lines corresponding to said match lines when an invalid state is allocated to those; and vii) an address signal generating unit for generating an address output signal for searching for a state of m×p said effective match lines and identifying the network address of the transfer destination from said secondary storage data corresponding to said effective match lines allocated to a valid state.

30. An associative memory system as claimed in claim 29, further comprising selecting means for selecting one of k pieces of said intermediate data and control means for selecting one of said k partial search fields to share a part or all of the first to k-th field secondary searching associative memory and/or the first to (k−1)th secondary intermediate data determining unit.

31. An associative memory system as claimed in claim 29, wherein a common memory is used as said memory for storing the primary storage data and said memory for storing the secondary storage data.

32. An associative memory system as claimed in claim 29, wherein said address signal generating unit includes match detecting means for detecting whether or not a valid state is allocated to said corresponding match lines, logical-OR means for carrying out a logical sum operation of said match line signals, first encoding means for encoding an output signal of said logical-OR means into a field of an address signal, and second encoding means for encoding an output signal of said match detecting means into another field of the address signal.

33. An associative memory system as claimed in claim 29, wherein said address signal generating unit includes match detecting means for detecting whether or not a valid state is allocated to said corresponding match lines, first encoding means for encoding said match line signal into a field of an address signal, second encoding means for encoding an output signal of said match detecting means into another field of the address signal, and selection means for selecting an output signal of said first encoding means in response to an operation result of said second encoding means.

34. An associative memory system as claimed in claim 33, wherein the corresponding associative memory contains said match detecting means and said first encoding means.

35. An associative memory system, which inputs n-bit (n is an integer equal to or greater than 1) search data composed of q (q is an integer equal to or greater than 2) partial search fields with an order of priority and outputs an address output signal identifying a network address of a transfer destination, comprising:

i) p (p is an integer equal to or greater than 2) primary and secondary searching associative memories for carrying out:

a primary searching operation including storing m (m is an integer equal to or greater than 2) pieces of structured data including storage data whose single word is n bits in length composed of q search fields and mask information, comparing said search data with said storage data for each word with consideration given to said corresponding mask information, carrying out a logical operation among said storage data, each of which is matched with said search data, outputting data only in the bit field corresponding to a partial search field with the first order of priority among the operation results as intermediate data, and allocating a valid state to a match line corresponding to the matched word; and a secondary searching operation including comparing said search data in a bit field corresponding to a partial search field with the h-th (h is an integer greater than or equal to h and less than or equal to q) order of priority with intermediate data obtained in the previous clock operation, carrying out a logical operation among said storage data, each of which is matched with said search data, and outputting data only in the bit field corresponding to a partial search field with the (h+1)th order of priority among the operation results as intermediate data, and allocating a valid state to said match line corresponding to the matched word;

ii) an intermediate data determining unit for allocating a valid state for intermediate data with a least number of invalid state bits or an invalid state for others to n detection signal lines corresponding to each intermediate data, only for intermediate data whose corresponding effective hold signal is in a valid state among p pieces of said intermediate data;

iii) storage means for responding to a storage control signal, storing detection states of said n detection signal lines, and allocating storage states to corresponding hold signal lines;

iv) match signal output means for allocating the state having been allocated to said match line to an effective match line corresponding to said match line when a valid state is allocated to said hold signal lines or for allocating an invalid state to the effective match line when an invalid state is allocated; and v) an address signal generating unit for generating an address output signal for searching for a state of m×p said effective match lines and identifying the network address of the transfer destination from said storage data corresponding to said effective match lines allocated to the valid state.

36. An associative memory system as claimed in claim 35, wherein said intermediate data determining unit comprises:
an intermediate data operating unit for selecting intermediate data with a least number of invalid state bits out of said intermediate data supplied and outputting it as optimized intermediate data; and
intermediate data comparing means for outputting a valid state only for said detection signal lines of the intermediate data coincident with said optimized intermediate data.

37. An associative memory system as claimed in claim 36, wherein said intermediate data operating unit comprises logical sum operation means for carrying out a logical sum operation (an OR operation) of said plurality of intermediate data at the same bit position, with a valid state of storage data as true.

38. An associative memory system as claimed in claim 36, wherein said intermediate data operating unit selects a maximum value, regarding said intermediate data as a binary notation value with a valid state of storage data as true, among said plurality of intermediate data.

39. An associative memory system as claimed in claim 36, wherein said intermediate data operating unit includes a plurality of invalid state counting means for counting the number of bits in an invalid state among said intermediate data supplied, minimum value selecting means for selecting the minimum value among operation results output from said plurality of invalid state counting means, and selection means for selecting intermediate data corresponding to said minimum value to output it as said optimized intermediate data.

40. An associative memory system as claimed in claim 39, wherein said invalid state counting means counts the number of bits in an invalid state of storage data from one side of bit position of said intermediate data toward the other side up to the bit just before the first bit in a valid state of storage data.

41. An associative memory system as claimed in claim 39, wherein said invalid state counting means is contained in the corresponding associative memory.

42. An associative memory system as claimed in claim 36, wherein said intermediate data operating unit includes storage means for enabling a pipeline process.

43. An associative memory system as claimed in claim 35, wherein said intermediate data determining unit includes a plurality of invalid state counting means for counting the number of bits in an invalid state among said input intermediate data, minimum value selecting means for selecting the minimum value among operation results output from said plurality of invalid state of invalid state counting means, and minimum value comparing means for outputting a valid state only to said detection signal lines of the intermediate data corresponding to said minimum value.

44. An associative memory system as claimed in claim 43, wherein said invalid state counting means counts the number of bits in an invalid state of storage data from one side of bit position of said intermediate data toward the other side up to the bit just before the first bit in a valid state of storage data.

45. An associative memory system as claimed in claim 43, wherein said invalid state counting means is contained in the corresponding associative memory.

46. An associative memory system as claimed in claim 35, wherein said match signal output means includes logical-AND means for outputting an invalid state to said effective match lines independently of the state allocated to said match lines when an invalid state is allocated to said hold signal lines.

47. An associative memory system as claimed in claim 35, wherein said intermediate data determining unit includes a plurality of invalid state counting means for counting the number of bits in an invalid state among said intermediate data supplied, means for changing a counting result of said invalid state counting means corresponding to said detection signal lines to which the invalid state is output into a value equal to or greater than the number of bits of said intermediate data, minimum value selecting means for selecting the minimum value among counting results output from said plurality of invalid state counting means, and minimum value comparing comparing means for outputting a valid state only to said detection signal lines of intermediate data corresponding to said minimum value.

48. An associative memory system as claimed in claim 47, wherein said invalid state counting means counts the number of bits in an invalid state of storage data from one side of bit position of said intermediate data toward the other side up to the bit just before the first bit in a valid state of storage data.

49. An associative memory system as claimed in claim 47, wherein said invalid state counting means is contained in the corresponding associative memory.

50. An associative memory system as claimed in claim 35, wherein said intermediate data determining unit includes means for synchronizing timing of outputting a detection signal to said detection signal lines with a termination of secondary searching operation carried out in parallel.

51. An associative memory system as claimed in claim 35, wherein said address signal generating unit includes match detecting means for detecting whether or not a valid state is allocated to said corresponding match lines, logical-OR means for carrying out a logical sum operation of said match line signals, first encoding means for encoding an output signal of said logical-OR means into a field of an address signal, and second encoding means for encoding an output signal of said match detecting means into another field of the address signal.

52. An associative memory system as claimed in claim 35, wherein said address signal generating unit includes match detecting means for detecting whether or not a valid state is allocated to said corresponding match lines, first encoding means for encoding said match line signal into a field of an address signal, second encoding means for encoding an output signal of said match detecting means into another field of the address signal, and selection means for selecting an output signal of said first encoding means in response to an operation result of said second encoding means.

53. An associative memory system as claimed in claim 52, wherein the corresponding associative memory contains said match detecting means and said first encoding means.

* * * * *